(12) United States Patent
Hirano et al.

(10) Patent No.: US 8,980,524 B2
(45) Date of Patent: Mar. 17, 2015

(54) POSITIVE RESIST COMPOSITION AND METHOD OF FORMING RESIST PATTERN

(75) Inventors: Tomoyuki Hirano, Kawasaki (JP); Daiju Shiono, Kawasaki (JP); Masatoshi Arai, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 140 days.

(21) Appl. No.: 12/979,067

(22) Filed: Dec. 27, 2010

(65) Prior Publication Data

US 2011/0236824 A1 Sep. 29, 2011

(30) Foreign Application Priority Data

Jan. 5, 2010 (JP) ................. P2010-000662

(51) Int. Cl.
| | | |
|---|---|---|
| G03F 7/039 | (2006.01) | |
| G03F 7/20 | (2006.01) | |
| G03F 7/30 | (2006.01) | |
| C08F 220/38 | (2006.01) | |
| G03F 7/004 | (2006.01) | |
| C08F 220/18 | (2006.01) | |
| C08F 220/28 | (2006.01) | |

(52) U.S. Cl.
CPC ............. G03F 7/0397 (2013.01); *C08F 220/18* (2013.01); C08F 220/38 (2013.01); *C08F 2220/281* (2013.01); G03F 7/0045 (2013.01); G03F 7/0046 (2013.01); G03F 7/2041 (2013.01); *Y10S 430/108* (2013.01); *Y10S 430/111* (2013.01); *Y10S 430/122* (2013.01); *Y10S 430/126* (2013.01)
USPC ........ 430/270.1; 430/311; 430/326; 430/907; 430/910; 430/921; 430/925

(58) Field of Classification Search
None
See application file for complete search history.

(56) References Cited

U.S. PATENT DOCUMENTS

| | | | |
|---|---|---|---|
| 4,458,001 A | 7/1984 | Taylor | |
| 4,495,275 A | 1/1985 | Yokoyama et al. | |
| 4,638,024 A | 1/1987 | Sato et al. | |
| 4,828,952 A | 5/1989 | Kato et al. | |
| 5,945,517 A | 8/1999 | Nitta et al. | |
| 6,153,733 A | 11/2000 | Yukawa et al. | |
| 6,255,392 B1 | 7/2001 | Inoue et al. | |
| 6,623,907 B2 | 9/2003 | Numata et al. | |
| 6,855,840 B2 | 2/2005 | McCormick et al. | |
| 7,074,543 B2 | 7/2006 | Iwai et al. | |
| 7,078,562 B2 | 7/2006 | Furukawa et al. | |
| 7,273,690 B2 | 9/2007 | Kodama et al. | |
| 7,291,690 B2 | 11/2007 | Yamago et al. | |
| 7,459,261 B2 | 12/2008 | Hatakeyama et al. | |
| 7,482,108 B2 | 1/2009 | Matsumaru et al. | |

(Continued)

FOREIGN PATENT DOCUMENTS

| | | |
|---|---|---|
| EP | 1 580 598 A | 9/2005 |
| EP | 1 589 377 A | 10/2005 |

(Continued)

OTHER PUBLICATIONS

Derwent English abstract for JP 2009-98509 (2009).*
Machine-assisted English translation for JP 2009-98509, provided by JPO (2009).*
Office Action issued in U.S. Appl. No. 12/717,870 on Sep. 14, 2011.
Office Action issued in U.S. Appl. No. 12/717,870 on Jan. 26, 2012.
Irie et al., "Surface Property Control for 193nm Immersion Resist," *Journal of Photopolymer Science and Technology*, vol. 19, No. 4, pp. 565-568 (2006).
Office Action issued in U.S. Appl. No. 12/824,089 on Apr. 6, 2012.

(Continued)

*Primary Examiner* — Sin J. Lee
(74) *Attorney, Agent, or Firm* — Knobbe Martens Olson & Bear LLP

(57) ABSTRACT

A positive resist composition including a base component (A) which exhibits increased solubility in an alkali developing solution under action of acid, an acid-generator component (B) which generates acid upon exposure and a fluorine-containing polymeric compound (C') which generates acid upon exposure, the base component (A) having a structural unit (a0-1) represented by general formula (a0-1) and a structural unit (a1) derived from an acrylate ester containing an acid dissociable, dissolution inhibiting group, and the fluorine-containing polymeric compound (C') having a structural unit (c0) which generates acid upon exposure and a structural unit (c1) represented by formula (c1) (wherein $R^2$ represents a divalent linking group, $R^3$ represents a cyclic group containing —$SO_2$— within the ring skeleton, $Q^0$ represents a single bond or a divalent linking group, and $R^0$ represents an organic group which may have a fluorine atom).

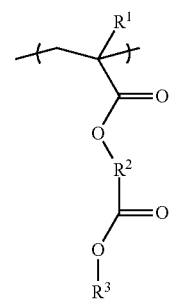

(a0-1)

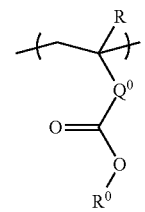

(c1)

10 Claims, No Drawings

(56) References Cited

U.S. PATENT DOCUMENTS

| | | |
|---|---|---|
| 7,749,679 B2 | 7/2010 | Wada et al. |
| 7,867,697 B2 | 1/2011 | Kodama |
| 8,105,749 B2 | 1/2012 | Dazai et al. |
| 8,110,711 B2 | 2/2012 | Jodry et al. |
| 8,182,976 B2 | 5/2012 | Dazai et al. |
| 8,192,915 B2 | 6/2012 | Dazai et al. |
| 8,206,891 B2 | 6/2012 | Seshimo et al. |
| 8,221,956 B2 | 7/2012 | Shiono |
| 8,227,170 B2 | 7/2012 | Dazai et al. |
| 8,232,041 B2 | 7/2012 | Dazai et al. |
| 8,236,477 B2 | 8/2012 | Matsumiya et al. |
| 8,257,904 B2 | 9/2012 | Motoike et al. |
| 8,283,105 B2 | 10/2012 | Kakinoya et al. |
| 8,323,869 B2 | 12/2012 | Shimizu et al. |
| 8,329,378 B2 | 12/2012 | Hirano et al. |
| 8,349,534 B2 | 1/2013 | Kurosawa et al. |
| 8,394,578 B2 | 3/2013 | Hirano et al. |
| 2002/0012874 A1 | 1/2002 | Namba |
| 2004/0009429 A1 | 1/2004 | Sato |
| 2005/0019690 A1 | 1/2005 | Kodama |
| 2005/0192414 A1 | 9/2005 | Donck et al. |
| 2005/0266351 A1 | 12/2005 | Takemoto et al. |
| 2005/0271978 A1 | 12/2005 | Takeda et al. |
| 2006/0008736 A1 | 1/2006 | Kanda et al. |
| 2006/0029884 A1 | 2/2006 | Hatakeyama et al. |
| 2006/0110677 A1 | 5/2006 | Houlihan et al. |
| 2007/0032614 A1 | 2/2007 | Goossens et al. |
| 2007/0148592 A1 | 6/2007 | Wada et al. |
| 2007/0160929 A1 | 7/2007 | Hasegawa et al. |
| 2007/0172769 A1 | 7/2007 | Kanna et al. |
| 2007/0219338 A1 | 9/2007 | Takeda et al. |
| 2007/0231708 A1* | 10/2007 | Matsumaru et al. ............. 430/4 |
| 2007/0231738 A1 | 10/2007 | Kaneko et al. |
| 2007/0298352 A1 | 12/2007 | Kobayashi et al. |
| 2007/0298355 A1 | 12/2007 | Harada et al. |
| 2008/0102407 A1* | 5/2008 | Ohsawa et al. ............ 430/286.1 |
| 2008/0118860 A1 | 5/2008 | Harada et al. |
| 2008/0311507 A1 | 12/2008 | Isono et al. |
| 2008/0319134 A1 | 12/2008 | Ma et al. |
| 2009/0035699 A1 | 2/2009 | Hasegawa et al. |
| 2009/0035700 A1 | 2/2009 | Nakayama et al. |
| 2009/0042129 A1 | 2/2009 | Takeshita |
| 2009/0068590 A1 | 3/2009 | Dazai et al. |
| 2009/0105400 A1 | 4/2009 | Komatsu et al. |
| 2009/0197204 A1 | 8/2009 | Shiono et al. |
| 2009/0226842 A1* | 9/2009 | Shimizu et al. ............ 430/281.1 |
| 2009/0233223 A1* | 9/2009 | Tachibana et al. ......... 430/270.1 |
| 2009/0317743 A1 | 12/2009 | Shiono et al. |
| 2010/0062364 A1 | 3/2010 | Dazai et al. |
| 2010/0062369 A1 | 3/2010 | Dazai et al. |
| 2010/0081088 A1 | 4/2010 | Kawaue et al. |
| 2010/0086873 A1 | 4/2010 | Seshimo et al. |
| 2010/0136480 A1* | 6/2010 | Motoike et al. ............ 430/270.1 |
| 2010/0178609 A1 | 7/2010 | Dazai et al. |
| 2010/0183981 A1 | 7/2010 | Matsumiya et al. |
| 2010/0196821 A1 | 8/2010 | Dazai et al. |
| 2010/0209848 A1 | 8/2010 | Dazai et al. |
| 2010/0233623 A1 | 9/2010 | Kurosawa et al. |
| 2010/0233624 A1 | 9/2010 | Kakinoya et al. |
| 2010/0233625 A1 | 9/2010 | Hirano et al. |
| 2010/0233626 A1 | 9/2010 | Shimizu et al. |
| 2010/0266957 A1 | 10/2010 | Harada et al. |
| 2010/0266966 A1 | 10/2010 | Park et al. |
| 2011/0015431 A1 | 1/2011 | Jodry et al. |
| 2011/0034721 A1 | 2/2011 | Hagiwara et al. |
| 2011/0117497 A1 | 5/2011 | Sato et al. |
| 2011/0236824 A1 | 9/2011 | Hirano et al. |
| 2011/0244392 A1 | 10/2011 | Hirano et al. |
| 2011/0311913 A1 | 12/2011 | Suzuki et al. |
| 2012/0077125 A1 | 3/2012 | Shiono et al. |
| 2012/0094236 A1 | 4/2012 | Shiono et al. |
| 2012/0329969 A1 | 12/2012 | Matsumiya et al. |

FOREIGN PATENT DOCUMENTS

| | | |
|---|---|---|
| EP | 2 048 128 A | 4/2009 |
| JP | A-53-139693 | 12/1978 |
| JP | A-63-256492 | 10/1988 |
| JP | A-63-272590 | 11/1988 |
| JP | 06-001750 A | 1/1994 |
| JP | A-06-083079 | 3/1994 |
| JP | H09-208554 | 8/1997 |
| JP | H10-221852 | 8/1998 |
| JP | H11-035551 | 2/1999 |
| JP | H11-035552 | 2/1999 |
| JP | H11-035573 | 2/1999 |
| JP | H11-133593 A | 5/1999 |
| JP | H11-322707 | 11/1999 |
| JP | 2003-241385 | 8/2003 |
| JP | A-2003-241385 | 8/2003 |
| JP | 2004-323693 | 11/2004 |
| JP | 2005-037888 | 2/2005 |
| JP | A-2005-055890 | 3/2005 |
| JP | 2005-126459 | 5/2005 |
| JP | 2005-344009 | 12/2005 |
| JP | A-2006-016379 | 1/2006 |
| JP | 2006-045311 | 2/2006 |
| JP | 2006-048029 | 2/2006 |
| JP | 2006-215526 | 8/2006 |
| JP | 2006-299278 | 11/2006 |
| JP | A-2007-031355 | 2/2007 |
| JP | A-2007-093910 | 4/2007 |
| JP | A-2007-119696 | 5/2007 |
| JP | A-2007-178848 | 7/2007 |
| JP | A-2007-241053 | 9/2007 |
| JP | A-2007-246600 | 9/2007 |
| JP | A-2008-007409 | 1/2008 |
| JP | A-2008-083158 | 4/2008 |
| JP | A-2008-083159 | 4/2008 |
| JP | A-2008-111103 | 5/2008 |
| JP | A-2008-521039 | 6/2008 |
| JP | 2008-247919 | 10/2008 |
| JP | A-2008-249867 | 10/2008 |
| JP | A-2009-025707 | 2/2009 |
| JP | A-2009-029974 | 2/2009 |
| JP | A-2009-062491 | 3/2009 |
| JP | 2009-091350 | 4/2009 |
| JP | 2009-091351 | 4/2009 |
| JP | 2009-98509 * | 5/2009 |
| JP | A-2009-244856 | 10/2009 |
| JP | A-2010-002839 | 1/2010 |
| JP | A-2010-002870 | 1/2010 |
| JP | A-2010-230891 | 10/2010 |
| JP | A-2010-250105 | 11/2010 |
| KR | 10-2007-0074476 A | 7/2007 |
| TW | 2006-06580 | 2/2006 |
| TW | 200628979 | 8/2006 |
| TW | 200632558 | 9/2006 |
| TW | 200707108 | 2/2007 |
| TW | 2007-41347 A | 11/2007 |
| TW | 2008-01049 A | 1/2008 |
| WO | WO 92/00366 A1 | 1/1992 |
| WO | WO 02/23273 A2 | 3/2002 |
| WO | WO 2004/074242 | 9/2004 |
| WO | WO 2006/054173 A1 | 5/2006 |
| WO | WO 2007/091517 A1 | 8/2007 |
| WO | WO 2007/094473 | 8/2007 |
| WO | WO 2008/021291 | 2/2008 |
| WO | WO 2008/123560 A | 10/2008 |
| WO | WO 2010/001913 A1 | 1/2010 |

OTHER PUBLICATIONS

Gil et al., "First Microprocessors with Immersion Lithography," Optical Microlithography XVIII, Proceedings of SPIE vol. 5754, pp. 119-128 (2005).

Kodama et al., "Synthesis of Novel Fluoropolymer for 157nm Photoresists by Cyclo-Polymerization," Advances in Resist Technology and Processing XIX, Proceedings of SPIE vol. 4690, pp. 76-83 (2002).

The European Search Report issued in corresponding European Patent Application No. EP 09152046, dated May 20, 2009.

(56) References Cited

OTHER PUBLICATIONS

Decision for Grant of Patent received in corresponding Korean Patent Application No. 10-2009-0007960 dated Jun. 28, 2011.
Office Action issued in U.S. Appl. No. 12/360,415 on Sep. 12, 2011.
Office Action issued in U.S. Appl. No. 12/360,415 on Feb. 8, 2012.
Office Action issued in U.S. Appl. No. 12/360,415 on May 17, 2012.
Office Action issued in U.S. Appl. No. 13/310,625 on Jul. 24, 2012.
Office Action issued in U.S. Appl. No. 12/824,089 on Jul. 25, 2012.
Office Action issued in Taiwanese Patent Application No. 098103527 on Jul. 23, 2012.
Office Action issued in U.S. Appl. No. 12/360,415 on Dec. 17, 2012.
Office Action issued on Aug. 26, 2013 in U.S. Appl. No. 12/360,415.
Office Action issued on Mar. 12, 2013 for Japanese Patent Application No. 2008-317487.
Notice of Allowance issued on Apr. 2, 2013 for Japanese Patent Application No. 2009-058738.
Office Action issued on Sep. 12, 2011 for U.S. Appl. No. 12/461,687.
Notice of Allowance issued on Jan. 25, 2012 for U.S. Appl. No. 12/461,687.
Office Action issued on Jan. 28, 2013 for U.S. Appl. No. 13/454,399.
Office Action mailed Feb. 7, 2014 in U.S. Appl. No. 13/683,263.
Office Action issued Apr. 16, 2014 in Taiwanese Application No. 099106622.
Office Action issued on Nov. 15, 2013 in Taiwanese Patent Application No. 098128053.
Notice of Allowance issued on Jan. 7, 2014 in Japanese Patent Application No. 2010-000662.
Office Action mailed on Jun. 4, 2014 in U.S. Appl. No. 13/683,263.
Office Action issued on Aug. 1, 2013 in U.S. Appl. No. 13/661,518.
Office Action issued on Aug. 6, 2013 in Japanese Patent Application No. 2009-159073.
Office Action issued on Sep. 3, 2013 in Japanese Patent Application No. 2009-185958.
Office Action in Japanese Patent Application No. 2013-098612, mailed Aug. 26, 2014.
Office Action in U.S. Appl. No. 13/683,263, mailed Sep. 16, 2014.

* cited by examiner

POSITIVE RESIST COMPOSITION AND METHOD OF FORMING RESIST PATTERN

TECHNICAL FIELD

The present invention is related to a positive resist composition which exhibits excellent lithography properties and enables formation of a resist pattern having an excellent shape, and a method of forming a resist pattern using the resist composition.

Priority is claimed on Japanese Patent Application No. 2010-000662, filed Jan. 5, 2010, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter than these excimer lasers, such as $F_2$ excimer lasers, electron beam, extreme ultraviolet radiation (EUV), and X-ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in an alkali developing solution under the action of acid and an acid generator that generates acid upon exposure.

For example, a chemically amplified positive resist contains, as a base component (base resin), a resin which exhibits increased solubility in an alkali developing solution under action of acid, and an acid generator is typically used. If the resist film formed using the resist composition is selectively exposed during formation of a resist pattern, then within the exposed portions, acid is generated from the acid generator, and the action of this acid causes an increase in the solubility of the resin component in an alkali developing solution, making the exposed portions soluble in the alkali developing solution.

Currently, resins that contain structural units derived from (meth)acrylate esters within the main chain (acrylic resins) are now widely used as base resins for resists that use ArF excimer laser lithography, as they exhibit excellent transparency in the vicinity of 193 nm (for example, see Patent Document 1). Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

In recent years, base resins that include a structural unit which functions as an acid generator have also been used (see for example, Patent Documents 1 to 4).

In recent years, fluorine-containing compounds have been attracting attention for their properties such as water repellency and transparency, and active research and development of fluorine-containing compounds have been conducted in various fields. For example, in the fields of resist materials, currently, an acid-labile group such as a methoxymethyl group, tert-butyl group or tert-butoxycarbonyl group is being introduced into a fluorine-containing polymeric compound, and the fluorine-containing polymeric compound is used as a base resin for a chemically amplified positive resist. However, when such a fluorine-containing polymeric compound is used as a base resin for a positive resist, disadvantages are caused in that a large amount of an out gas is generated, and resistance to a dry-etching gas (etching resistance) is unsatisfactory.

In addition, a fluorine-containing polymeric compound has been reported in order to provide a resist film with water repellency in a resist composition for immersion exposure (see, for example, Non-Patent Document 1).

DOCUMENTS OF RELATED ART

Patent Document

[Patent Document 1] Japanese Unexamined Patent Application, First Publication No. Hei 10-221852
[Patent Document 2] Japanese Unexamined Patent Application, First Publication No. 2006-045311
[Patent Document 3] Japanese Unexamined Patent Application, First Publication No. 2006-215526
[Patent Document 4] Japanese Unexamined Patent Application, First Publication No. 2009-091351

Non-Patent Documents

[Non-Patent Document 1] Journal of Photopolymer. Sci. Technol., vol. 19, No. 4, pp. 565-568 (2006)

SUMMARY OF THE INVENTION

As further progress is expected to be made in lithography techniques and the application field for lithography techniques is expected to expand, development of a novel material for use in lithography will be desired. For example, as miniaturization of resist patterns progresses, improvement will be demanded for resist materials with respect to not only resolution, but also various lithography properties such as line width roughness (LWR) and the like, and shape of the resist pattern.

The present invention takes the above circumstances into consideration, with an object of providing a positive resist composition which exhibits excellent lithography properties and enables formation of a resist pattern having an excellent shape, and a method of forming a resist pattern using the resist composition.

For solving the above-mentioned problems, the present invention employs the following aspects.

Specifically, a first aspect of the present invention is a positive resist composition including a base component (A) which exhibits increased solubility in an alkali developing solution under action of acid, an acid-generator component (B) which generates acid upon exposure and a fluorine-containing polymeric compound (C') which generates acid upon exposure, the base component (A) having a structural unit (a0-1) represented by general formula (a0-1) shown below and a structural unit (a1) derived from an acrylate ester containing an acid dissociable, dissolution inhibiting group, and the fluorine-containing polymeric compound (C') having a structural unit (c0) which generates acid upon exposure and a structural unit (c1) represented by general formula (c1) shown below.

[Chemical Formula 1.]

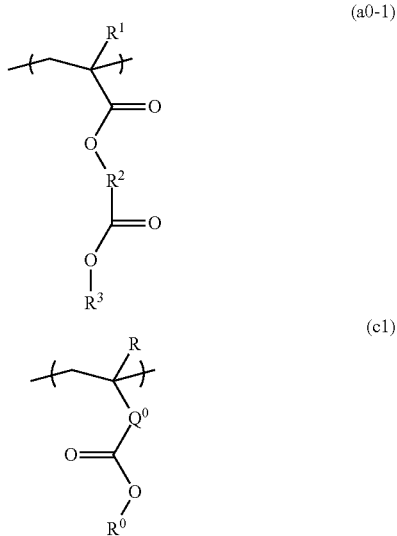

In the formulas, each of $R^1$ and R independently represents a hydrogen atom, an alkyl group of 1 to 5 carbon atoms or a halogenated alkyl group of 1 to 5 carbon atoms; $R^2$ represents a divalent linking group; $R^3$ represents a cyclic group containing —$SO_2$— within the ring skeleton thereof; $Q^0$ represents a single bond or a divalent linking group; and $R^0$ represents an organic group which may have a fluorine atom, provided that, when $R^0$ has no fluorine atom, $Q^0$ has a fluorine atom.

A second aspect of the present invention is a method of forming a resist pattern, including: using a resist composition of the first aspect to form a resist film on a substrate; conducting exposure of the resist film; and alkali-developing the resist film to form a resist pattern.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. Examples of the substituent bonded to the carbon atom on the α-position include an alkyl group of 1 to 5 carbon atoms, a halogenated alkyl group of 1 to 5 carbon atoms and a hydroxyalkyl group.

A carbon atom on the α-position of an acrylate ester refers to the carbon atom bonded to the carbonyl group, unless specified otherwise.

With respect to the acrylate ester, specific examples of the alkyl group of 1 to 5 carbon atoms for the substituent at the α-position include linear or branched alkyl groups such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group of 1 to 5 carbon atoms include groups in which part or all of the hydrogen atoms of the aforementioned "alkyl group of 1 to 5 carbon atoms for the substituent at the α-position" are substituted with halogen atoms. Examples of the halogen atom include a fluorine atom, a chlorine atom, a bromine atom and an iodine atom, and a fluorine atom is particularly desirable.

In the present invention, it is preferable that a hydrogen atom, an alkyl group of 1 to 5 carbon atoms or a halogenated alkyl group of 1 to 5 carbon atoms is bonded to the α-position of the acrylate ester, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

The term "exposure" is used as a general concept that includes irradiation with any form of radiation.

The expression "decomposable in an alkali developing solution" means that the group is decomposable by the action of an alkali developing solution (preferably decomposable by action of a 2.38% by weight aqueous solution of tetramethylammonium hydroxide (TMAH) at 23° C.), and exhibits increased alkali solubility in the alkali developing solution.

According to the present invention, there are provided a positive resist composition and a method of forming a resist pattern which can achieve excellent lithography properties and pattern shape.

MODE FOR CARRYING OUT THE INVENTION

<<Positive Resist Composition>>

The positive resist composition of the present invention includes a base component (A) which exhibits increased solubility in an alkali developing solution under action of acid (hereafter, referred to as "component (A)"), an acid-generator component (B) which generates acid upon exposure (hereafter, referred to as "component (B)") and a fluorine-containing polymeric compound (C') which generates acid upon exposure (hereafter, referred to as "component (C')").

In the positive resist composition, when radial rays are irradiated (when exposure is conducted), acid is generated from the component (B) and the component (C'), and the solubility of the component (A) in an alkali developing solution is increased by the action of the generated acid. Therefore, in the formation of a resist pattern, by conducting selective exposure of a resist film formed by using the positive resist composition of the present invention, the solubility of the exposed portions in an alkali developing solution is increased, whereas the solubility of the unexposed portions in an alkali developing solution is unchanged, and hence, a resist pattern can be formed by alkali developing.

Here, the term "base component" refers to an organic compound capable of forming a film.

As the base component, an organic compound having a molecular weight of 500 or more is used. When the organic compound has a molecular weight of 500 or more, the organic compound exhibits a satisfactory film-forming ability, and a resist pattern of nano level can be easily formed.

The "organic compound having a molecular weight of 500 or more" is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. In the present description and claims, the term "polymeric compound" refers to a polymer having a molecular weight of 1,000 or more.

With respect to a polymeric compound, the "molecular weight" is the weight average molecular weight in terms of the polystyrene equivalent value determined by gel permeation chromatography (GPC).

<Component (A)>

[Resin Component (A1)]

The resin component (A1) (hereafter, referred to as "component (A1)" or "polymeric compound (A1)") includes a structural unit (a0-1) represented by general formula (a0-1) and a structural unit (a1) derived from an acrylate ester containing an acid dissociable, dissolution inhibiting group.

The component (A1) may include a structural unit (a2) derived from an acrylate ester containing a lactone-containing cyclic group, as well as the structural units (a0-1) and (a1).

The component (A1) preferably includes a structural unit (a3) derived from an acrylate ester containing a polar group-containing aliphatic hydrocarbon group, as well as the structural units (a0-1) and (a1), or the structural units (a0-1), (a1) and (a2).

(Structural Unit (a0-1))

The structural unit (a0-1) is a structural unit represented by the aforementioned general formula (a0-1).

In formula (a0-1), $R^1$ represents a hydrogen atom, an alkyl group of 1 to 5 carbon atoms or a halogenated alkyl group of 1 to 5 carbon atoms.

The alkyl group for $R^1$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group.

The halogenated alkyl group of 1 to 5 carbon atoms represented by $R^1$ is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As $R^1$, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In general formula (a0-1), $R^2$ represents a divalent linking group.

Preferable examples of $R^2$ include a divalent hydrocarbon group which may have a substituent, and a divalent linking group containing a hetero atom.

A hydrocarbon "has a substituent" means that part or all of the hydrogen atoms within the hydrocarbon group is substituted with groups or atoms other than hydrogen.

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (=O).

As examples of the hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Examples of aromatic hydrocarbon groups include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group;

an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

With respect to a "divalent linking group containing a hetero atom", a hetero atom is an atom other than carbon and hydrogen, and examples thereof include an oxygen atom, a nitrogen atom, a sulfur atom and a halogen atom.

Specific examples of the divalent linking group containing a hetero atom include —O—, —C(=O)—, —C(=O)—O—, a carbonate bond (—O—C(=O)—O—), —NH—, —NR$^{04}$— (R$^{04}$ represents an alkyl group), —NH—C(=O)—, and =N—. Further, a combination of any one of these "divalent linking groups containing a hetero atom" with a divalent hydrocarbon group can also be used. As examples of the divalent hydrocarbon group, the same groups as those described above for the hydrocarbon group which may have a substituent can be given, and a linear or branched aliphatic hydrocarbon group is preferable.

R$^2$ may or may not have an acid dissociable portion in the structure thereof. An "acid dissociable portion" refers to a portion within the organic group which is dissociated from the organic group by the action of acid generated upon exposure. When the R$^2$ group has an acid dissociable portion, it preferably has an acid dissociable portion having a tertiary carbon atom.

In the present invention, as the divalent linking group for R$^2$, an alkylene group, a divalent aliphatic cyclic group or a divalent linking group containing a hetero atom is preferable. Among these, an alkylene group is particularly desirable.

When R$^2$ represents an alkylene group, it preferably has 1 to 10 carbon atoms, more preferably 1 to 6, still more preferably 1 to 4, and most preferably 1 to 3. Specific examples of alkylene groups include the aforementioned linear alkylene groups and branched alkylene groups.

When R$^2$ represents a divalent aliphatic cyclic group, as the aliphatic cyclic group, the same aliphatic cyclic groups as those described above for the "aliphatic hydrocarbon group containing a ring in the structure thereof" can be used.

As the aliphatic cyclic group, a group in which two or more hydrogen atoms have been removed from cyclopentane, cyclohexane, norbornane, isobornane, adamantane, tricyclodecane or tetracyclododecane is particularly desirable.

When R$^2$ represents a divalent linking group containing a hetero atom, preferable examples of the divalent linking group containing a hetero atom include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O—, a group represented by the formula: -A-O—B— and a group represented by the formula -[A-C(=O)—O]$_m$—B—. Herein, each of A and B independently represents a divalent hydrocarbon group which may have a substituent, and m represents an integer of 0 to 3.

When R$^2$ represents —NH—, H may be replaced with a substituent such as an alkyl group, an acyl group or the like. The substituent (an alkyl group, an acyl group or the like) preferably has 1 to 10 carbon atoms, more preferably 1 to 8, and most preferably 1 to 5.

In the group represented by the formula -A-O—B— or -[A-C(=O)—O]$_m$—B—, each of A and B independently represents a divalent hydrocarbon group which may have a substituent.

Examples of divalent hydrocarbon groups for A and B which may have a substituent include the same groups as those described above for the "divalent hydrocarbon group which may have a substituent" usable as R$^2$.

As A, a linear aliphatic hydrocarbon group is preferable, more preferably a linear alkylene group, still more preferably a linear alkylene group of 1 to 5 carbon atoms, and a methylene group or an ethylene group is particularly desirable.

As B, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula -[A-C(=O)—O]$_m$—B—, m represents an integer of 0 to 3, preferably an integer of 0 to 2, more preferably 0 or 1, and most preferably 1.

In general formula (a0-1), R$^3$ represents a cyclic group containing —SO$_2$— in the ring structure thereof. More specifically, R$^3$ is a cyclic group in which the sulfur atom (S) within the —SO$_2$— group forms part of the ring skeleton thereof.

The cyclic group for R$^3$ refers to a cyclic group including a ring that contains —SO$_2$— within the ring skeleton thereof, and this ring is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The cyclic group for R$^3$ may be either a monocyclic group or a polycyclic group.

As R$^3$, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable.

The cyclic group for $R^3$ preferably has 3 to 30 carbon atoms, more preferably 4 to 20, still more preferably 4 to 15, and most preferably 4 to 12.

Herein, the number of carbon atoms refers to the number of carbon atoms constituting the ring skeleton, excluding the number of carbon atoms within a substituent.

The cyclic group for $R^3$ may be either an aliphatic cyclic group or an aromatic cyclic group.

An aliphatic cyclic group is preferable.

Examples of aliphatic cyclic groups for $R^3$ include the aforementioned cyclic aliphatic hydrocarbon groups in which part of the carbon atoms constituting the ring skeleton thereof has been substituted with —$SO_2$— or —O—$SO_2$—.

More specifically, examples of monocyclic groups include a monocycloalkane in which one hydrogen atom have been removed therefrom and a —$CH_2$— group constituting the ring skeleton thereof has been substituted with —$SO_2$—; and a monocycloalkane in which one hydrogen atom have been removed therefrom and a —$CH_2$—$CH_2$— group constituting the ring skeleton thereof has been substituted with —O—$SO_2$—. Examples of polycyclic groups include a polycycloalkane (a bicycloalkane, a tricycloalkane, a tetracycloalkane or the like) in which one hydrogen atom have been removed therefrom and a —$CH_2$— group constituting the ring skeleton thereof has been substituted with —$SO_2$—; and a polycycloalkane in which one hydrogen atom have been removed therefrom and a —$CH_2$—$CH_2$— group constituting the ring skeleton thereof has been substituted with —O—$SO_2$—.

The cyclic group for $R^3$ may have a substituent. Examples of the substituent include an alkyl group, an alkoxy group, a halogen atom, a halogenated alkyl group, a hydroxy group, an oxygen atom (═O), —COOR", —OC(═O)R", a hydroxyalkyl group and a cyano group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkyl group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated lower alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(═O)R" group, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of $R^3$ include groups represented by general formulas (3-1) to (3-4) shown below.

[Chemical Formula 2.]

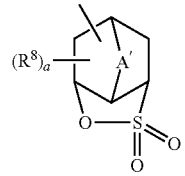

(3-1)

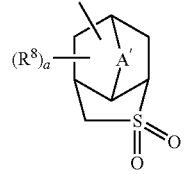

(3-2)

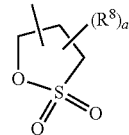

(3-3)

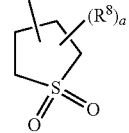

(3-4)

In the formulas, A' represents an oxygen atom, a sulfur atom or an alkylene group of 1 to 5 carbon atoms which may contain an oxygen atom or a sulfur atom; a represents an integer of 0 to 2; and $R^8$ represents an alkyl group, an alkoxy group, a halogenated alkyl group, a hydroxyl group, —COOR", —OC(═O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$—, —CH$_2$—S—CH$_2$—.

As A', an alkylene group of 1 to 5 carbon atoms or —O— is preferable, more preferably an alkylene group of 1 to 5 carbon atoms, and most preferably a methylene group.

a represents an integer of 0 to 2, and is most preferably 0.

When a is 2, the plurality of $R^8$ may be the same or different from each other.

As the alkyl group, alkoxy group, halogenated alkyl group, halogenated alkyl group, hydroxyl group, —COOR'', —OC(=O)R'', hydroxyalkyl group and cyano group for $R^8$, the same alkyl groups, alkoxy groups, halogenated alkyl groups, halogenated alkyl groups, hydroxyl groups, —COOR'', —OC(=O)R'', hydroxyalkyl groups and cyano groups as those described above as the substituent which the cyclic group for $R^3$ may have can be used.

Specific examples of the cyclic groups represented by general formulas (3-1) to (3-4) are shown below. In the formulas shown below, "Ac" represents an acetyl group.

[Chemical Formula 3.]

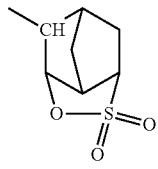

(3-1-1)

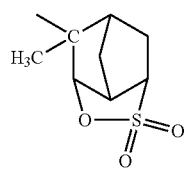

(3-1-2)

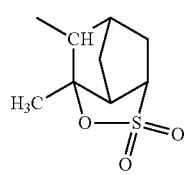

(3-1-3)

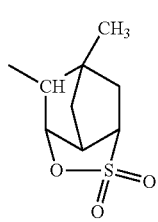

(3-1-4)

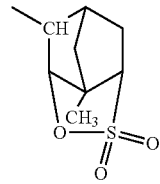

(3-1-5)

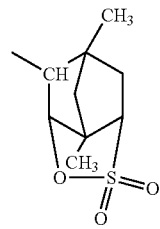

(3-1-6)

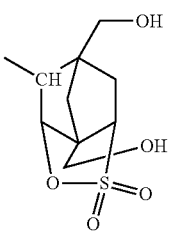

(3-1-7)

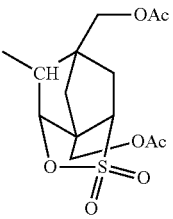

(3-1-8)

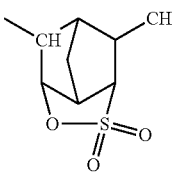

(3-1-9)

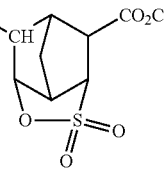

(3-1-10)

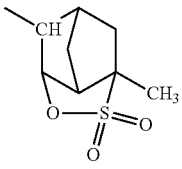

(3-1-11)

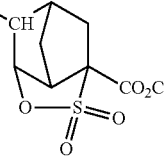

(3-1-12)

-continued
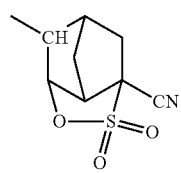 (3-1-13)
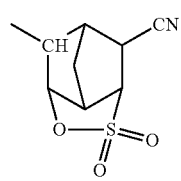 (3-1-14)
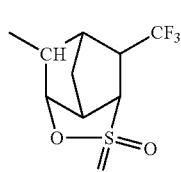 (3-1-15)
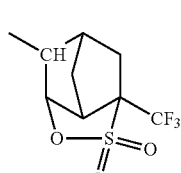 (3-1-16)
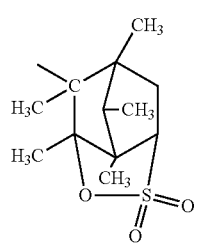 (3-1-17)
[Chemical Formula 4.]
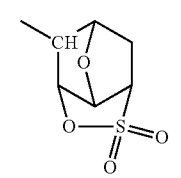 (3-1-18)
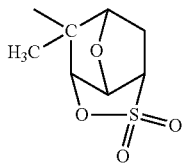 (3-1-19)
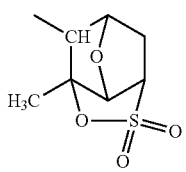 (3-1-20)
-continued
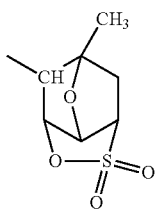 (3-1-21)
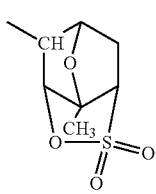 (3-1-22)
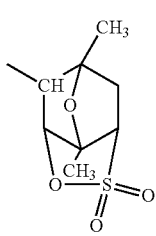 (3-1-23)
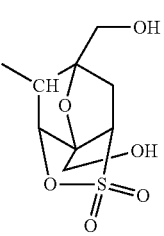 (3-1-24)
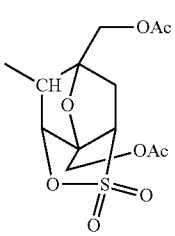 (3-1-25)
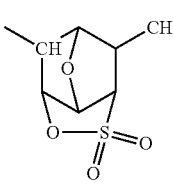 (3-1-26)
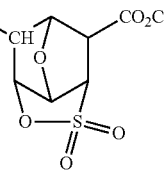 (3-1-27)
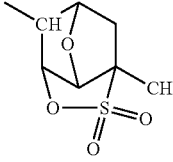 (3-1-28)

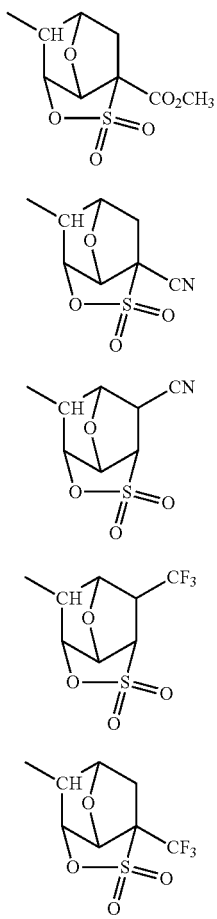

(3-1-29)
(3-1-30)
(3-1-31)
(3-1-32)
(3-1-33)

[Chemical Formula 5.]

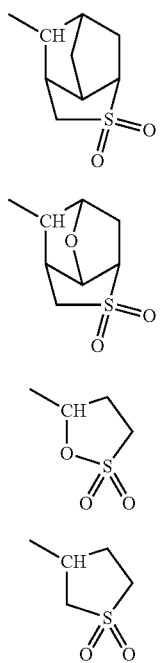

(3-2-1)
(3-2-2)
(3-3-1)
(3-4-1)

Among the examples shown above, as $R^3$, a group represented by general formula (3-1), (3-3) or (3-4) shown below is preferable, and a cyclic group represented by general formula (3-1) shown below is particularly desirable.

More specifically, as $R^3$, it is preferable to use at least one cyclic group selected from the group consisting of groups represented by chemical formulas (3-1-1), (3-1-18), (3-3-1) and (3-4-1) above, and a group represented by the aforementioned chemical formula (3-1-1) is particularly desirable.

In the present invention, as the structural unit (a0-1), a structural unit represented by general formula (a0-1-11) shown below is particularly desirable.

[Chemical Formula 6.]

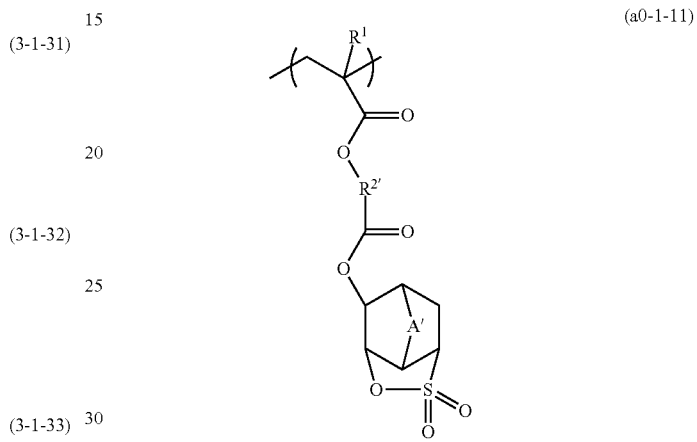

(a0-1-11)

In the formula, $R^1$ is the same as defined above; $R^{2\prime}$ represents a linear or branched alkylene group; and A' is the same as defined above.

The linear or branched alkylene group for $R^{2\prime}$ preferably has 1 to 10 carbon atoms, more preferably 1 to 8, still more preferably 1 to 5, still more preferably 1 to 3, and most preferably 1 or 2.

A' is preferably a methylene group, an oxygen atom (—O—) or a sulfur atom (—S—).

As the structural unit (a0-1), one type of structural unit may be used alone, or two or more types of structural units may be used in combination.

In terms of achieving excellent properties with respect to MEF, the shape of a formed resist pattern (e.g., the rectangularity of a line pattern, the circularity of a hole pattern, and the like), critical dimension uniformity (CDU), line width roughness (LWR) and the like in the formation of a resist pattern using a positive resist composition containing the component (A1), the amount of the structural unit (a0-1) within the component (A1), based on the combined total of all structural units constituting the component (A1) is preferably 1 to 70 mol %, more preferably 5 to 65 mol %, and still more preferably 10 to 60 mol %.

(Structural Unit (a1))

The structural unit (a1) is a structural unit derived from an acrylate ester containing an acid dissociable, dissolution inhibiting group.

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A1) insoluble in an alkali developing solution prior to dissociation, and then following dissociation by action of acid, increases the solubility of the entire component (A1) in the alkali developing solution. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

In the present description and claims, the term "aliphatic branched" refers to a branched structure having no aromaticity.

The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be used. Specific examples include 2-methyl-2-adamantyl group and a 2-ethyl-2-adamantyl group. Further, groups having an aliphatic cyclic group such as an adamantyl group, cyclohexyl group, cyclopentyl group, norbornyl group, tricyclodecyl group or tetracyclododecyl group, and a branched alkylene group having a tertiary carbon atom bonded thereto, as the groups bonded to the oxygen atom of the carbonyl group (—C(O)—O—) within the structural units represented by general formulas (a1"-1) to (a1"-6) shown below, can be used.

[Chemical Formula 7.]

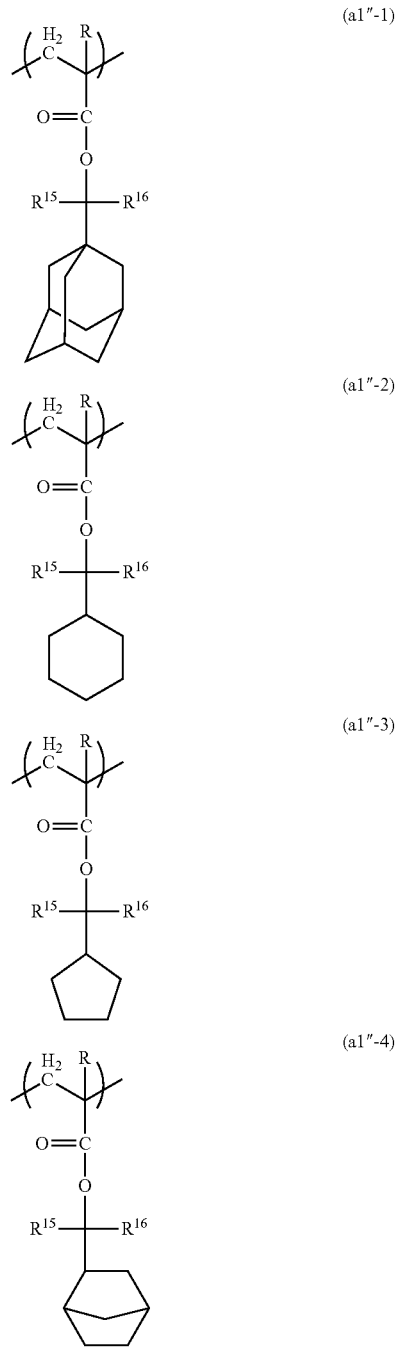

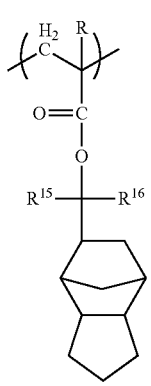

(a1″-5)

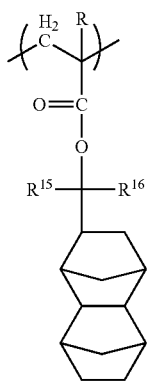

(a1″-6)

In the formulas, R represents a hydrogen atom, an alkyl group of 1 to 5 carbon atoms or a halogenated alkyl group of 1 to 5 carbon atoms; and $R^{15}$ and $R^{16}$ each independently represent an alkyl group (which may be linear or branched, and preferably has 1 to 5 carbon atoms).

In general formulas (a1″-1) to (a1″-6), R is the same as defined for $R^1$ in formula (a0-1).

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 8.]

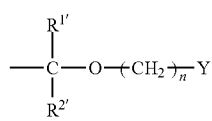

(p1)

In the formula, $R^{1'}$ and $R^{2'}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1) above, n is preferably an integer of 0 to 2, more preferably 0 or 1, and most preferably 0.

As the alkyl group of 1 to 5 carbon atoms for $R^{1'}$ and $R^{2'}$, the same alkyl groups of 1 to 5 carbon atoms as those described above for R can be used, although a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) is a group represented by general formula (p1-1) shown below.

[Chemical Formula 9.]

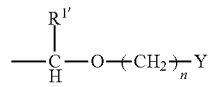

(p1-1)

In the formula, $R^{1'}$, n and Y are the same as defined above.

As the alkyl group of 1 to 5 carbon atoms for Y, the same alkyl groups of 1 to 5 carbon atoms as those described above can be used.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable, dissolution inhibiting group, groups represented by general formula (p2) shown below can also be used.

[Chemical Formula 10.]

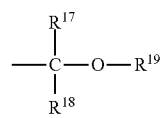

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

As the structural unit (a1), it is preferable to use at least one member selected from the group consisting of structural units represented by formula (a1-0-1) shown below and structural units represented by formula (a1-0-2) shown below.

[Chemical Formula 11.]

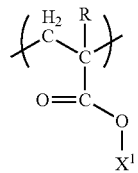

(a1-0-1)

In the formula, R represents a hydrogen atom, an alkyl group of 1 to 5 carbon atoms or a halogenated alkyl group of 1 to 5 carbon atoms; and $X^1$ represents an acid dissociable, dissolution inhibiting group.

[Chemical Formula 12.]

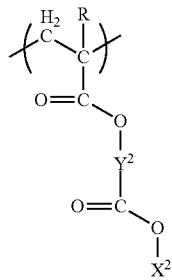

(a1-0-2)

In the formula, R represents a hydrogen atom, an alkyl group of 1 to 5 carbon atoms or a halogenated alkyl group of 1 to 5 carbon atoms; $X^2$ represents an acid dissociable, dissolution inhibiting group; and $Y^2$ represents a divalent linking group.

In general formula (a1-0-1) above, the alkyl group of 1 to 5 carbon atoms or halogenated alkyl group of 1 to 5 carbon atoms for R are the same as the alkyl group of 1 to 5 carbon atoms or halogenated alkyl group of 1 to 5 carbon atoms which can be bonded to the α-position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as defined above. $X^2$ is the same as defined for $X^1$ in general formula (a1-0-1).

As examples of the divalent linking group for $Y^2$, the same groups as those described above for $R^2$ in formula (a0-1) can be given.

Specific examples of the structural unit (a1) include structural units represented by general formulas (a1-1) to (a1-4) shown below.

[Chemical Formula 13.]

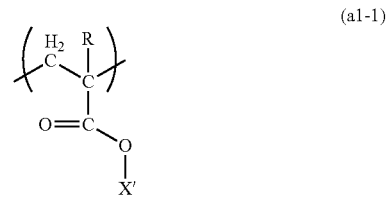

(a1-1)

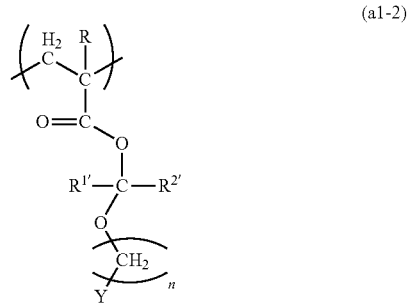

(a1-2)

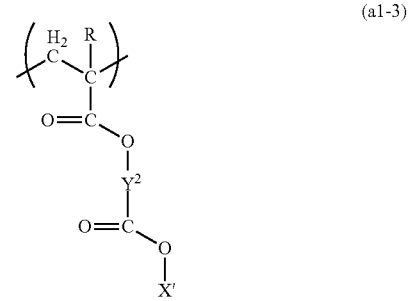

(a1-3)

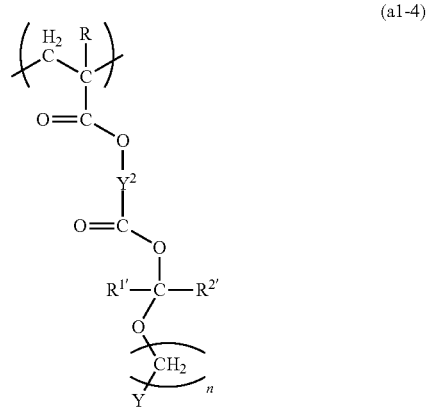

(a1-4)

In the formulas, X' represents a tertiary alkyl ester-type acid dissociable, dissolution inhibiting group; Y represents an alkyl group of 1 to 5 carbon atoms or an aliphatic cyclic group; n represents an integer of 0 to 3; $Y^2$ represents a divalent linking group; R is the same as defined above; and each of $R^{1'}$ and $R^{2'}$ independently represents a hydrogen atom or an alkyl group of 1 to 5 carbon atoms.

Examples of the tertiary alkyl ester-type acid dissociable, dissolution inhibiting group for X' include the same tertiary alkyl ester-type acid dissociable, dissolution inhibiting groups as those described above for $X^1$.

As $R^{1'}$, $R^{2'}$, n and Y are respectively the same as defined for R", $R^{2'}$, n and Y in general formula (p1) described above in connection with the "acetal-type acid dissociable, dissolution inhibiting group".

As examples of $Y^2$, the same groups as those described above for $Y^2$ in general formula (a1-0-2) can be given.

Specific examples of structural units represented by general formula (a1-1) to (a1-4) are shown below.

In the formulas shown below, $R^\alpha$ represents a hydrogen atom, a methyl group or a trifluoromethyl group.

Chemical Formula 14.]

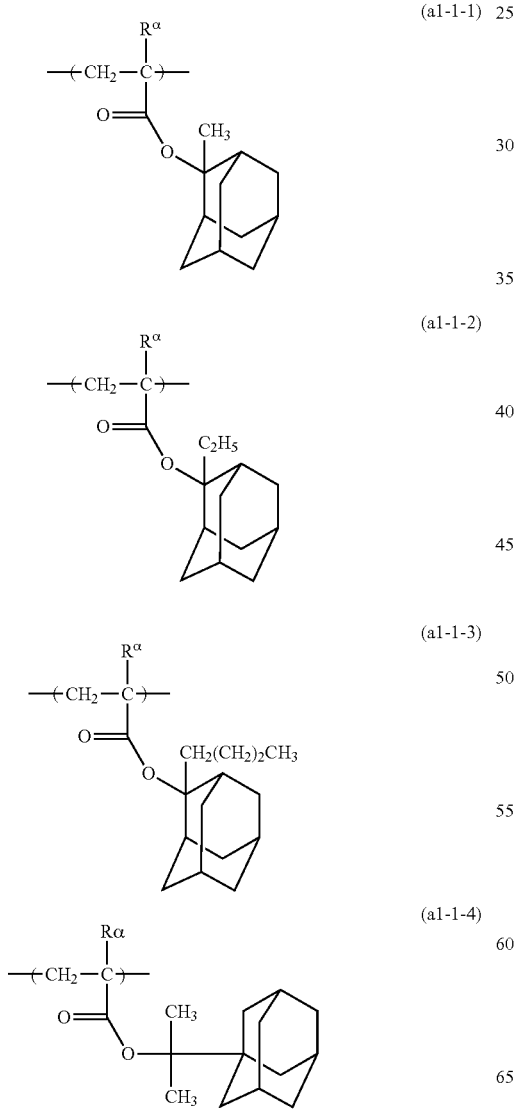

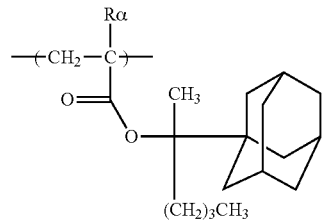

(a1-1-5)

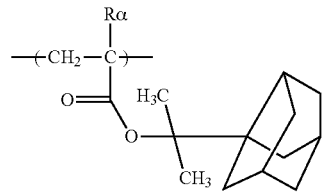

(a1-1-6)

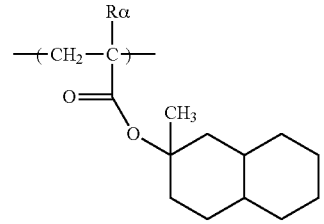

(a1-1-7)

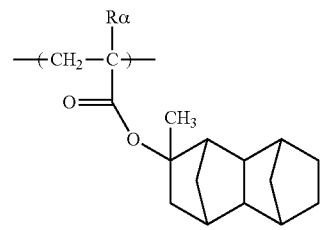

(a1-1-8)

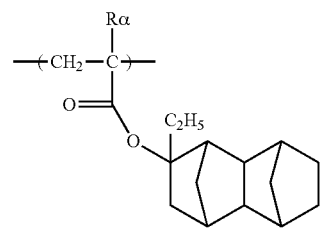

(a1-1-9)

[Chemical Formula 15.]

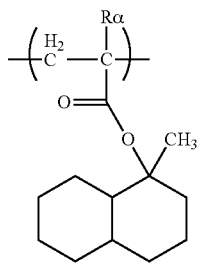

(a1-1-10)

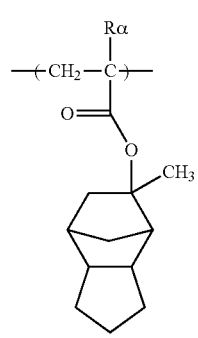 (a1-1-11)
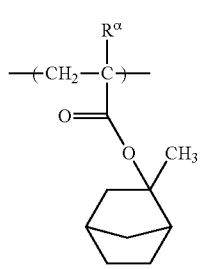 (a1-1-12)
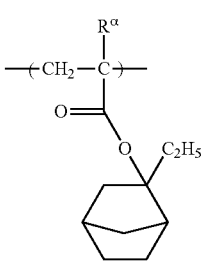 (a1-1-13)
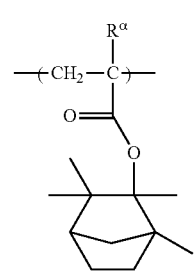 (a1-1-14)
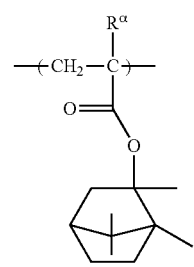 (a1-1-15)
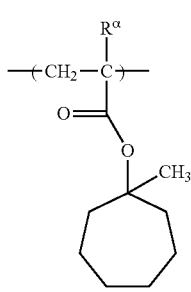 (a1-1-16)
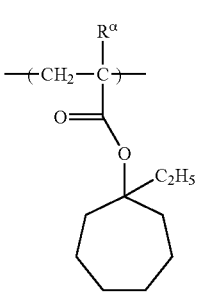 (a1-1-17)
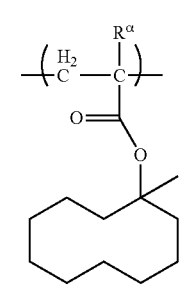 (a1-1-18)
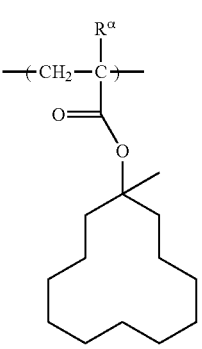 (a1-1-19)
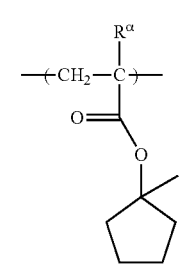 (a1-1-20)

(a1-1-21) 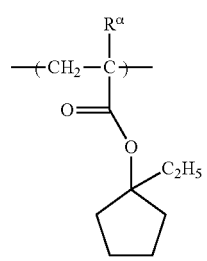
[Chemical Formula 16.]
(a1-1-22) 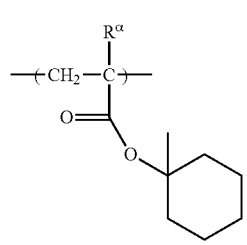
(a1-1-23) 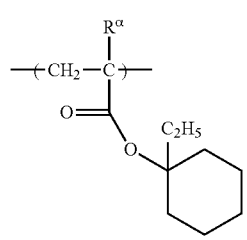
(a1-1-24) 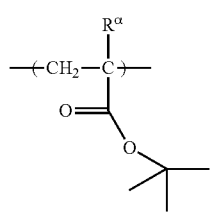
(a1-1-25) 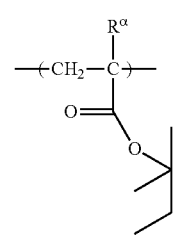
(a1-1-26) 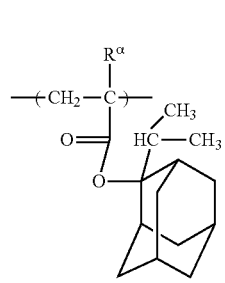
(a1-1-27) 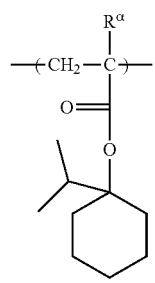
(a1-1-28) 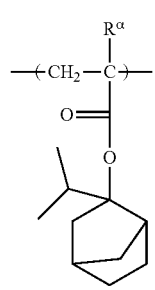
(a1-1-29) 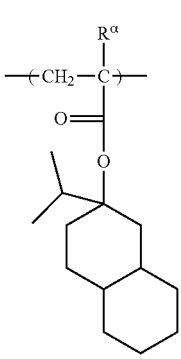
(a1-1-30) 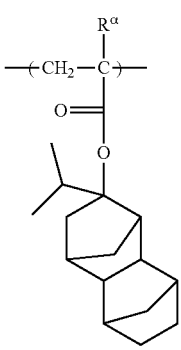
(a1-1-31) 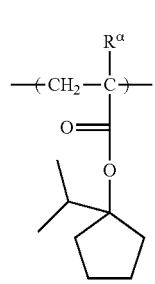

[Chemical Formula 17.]
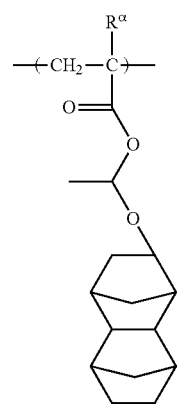 (a1-2-1)
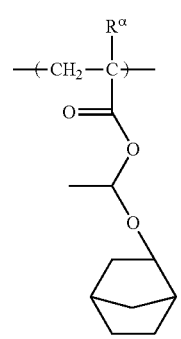 (a1-2-2)
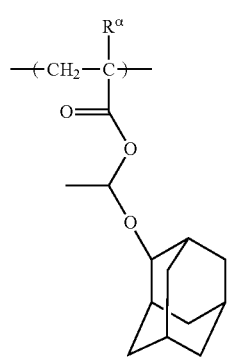 (a1-2-3)
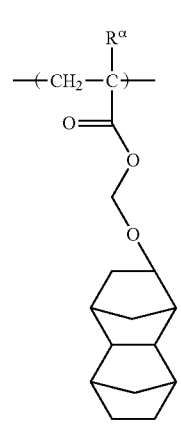 (a1-2-4)
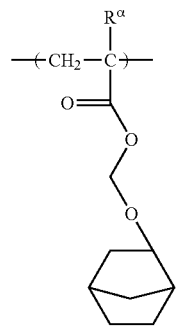 (a1-2-5)
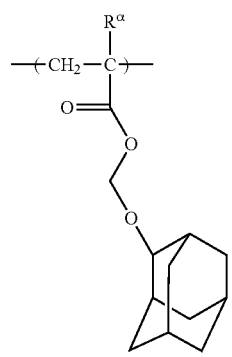 (a1-2-6)
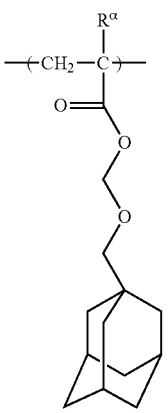 (a1-2-7)
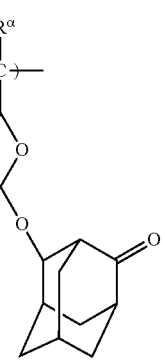 (a1-2-8)

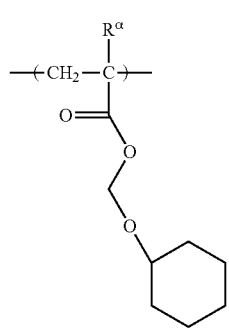
(a1-2-9)
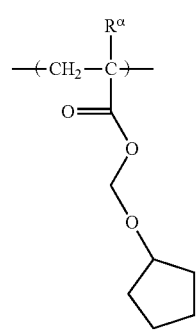
(a1-2-10)
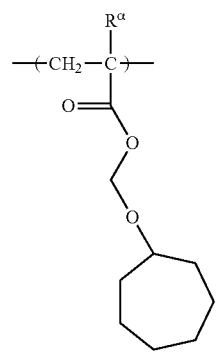
(a1-2-11)
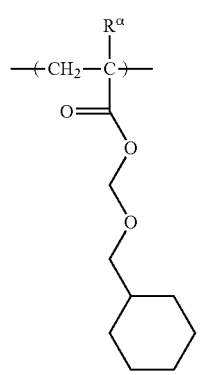
(a1-2-12)
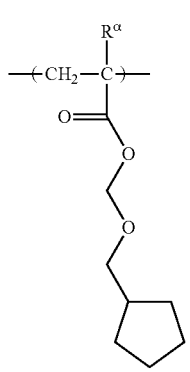
(a1-2-13)
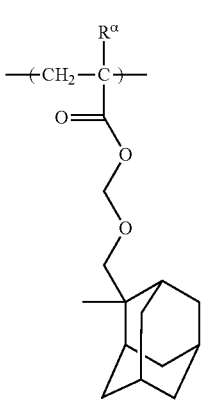
(a1-2-14)
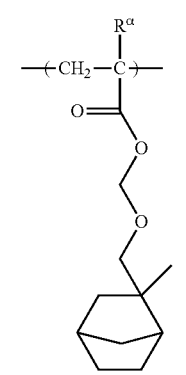
(a1-2-15)
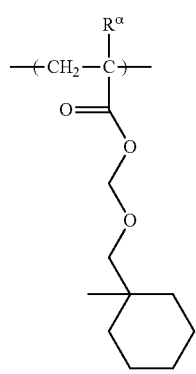
(a1-2-16)

(a1-2-17)
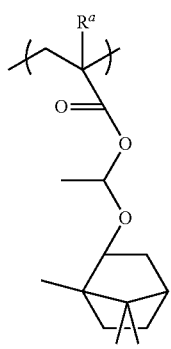
(a1-2-18)
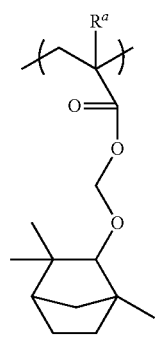
(a1-2-19)
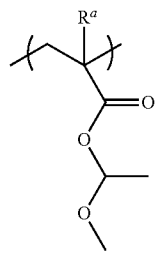
(a1-2-20)
(a1-1-21)
(a1-2-22)
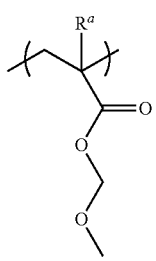
(a1-2-23)
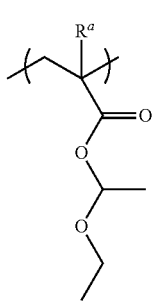
(a1-2-24)
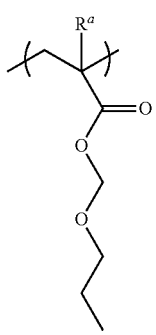
[Chemical Formula 18.]
(a1-3-1)
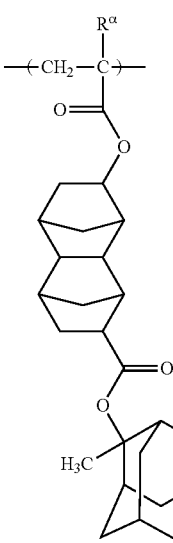

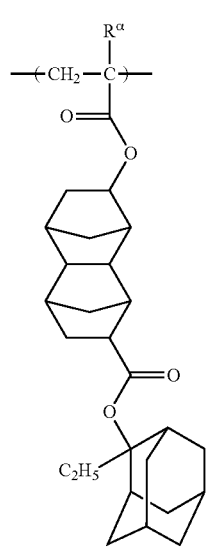 (a1-3-2)
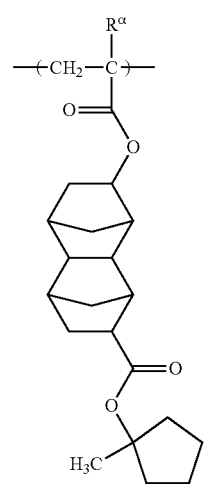 (a1-3-3)
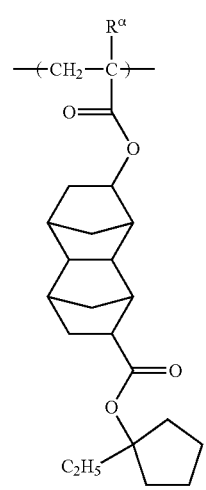 (a1-3-4)
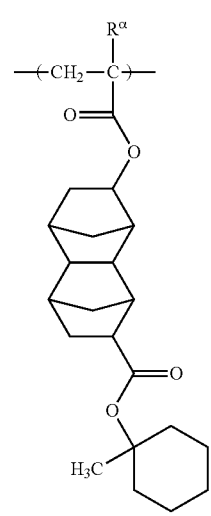 (a1-3-5)
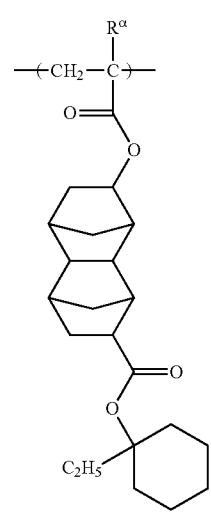 (a1-3-6)
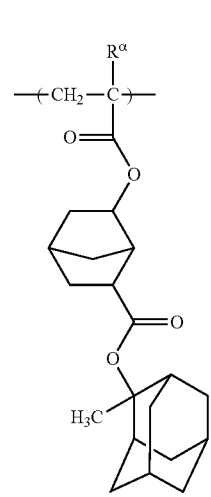 (a1-3-7)

(a1-3-8)
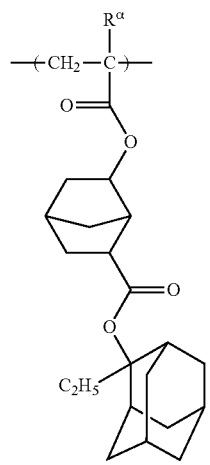
(a1-3-9)
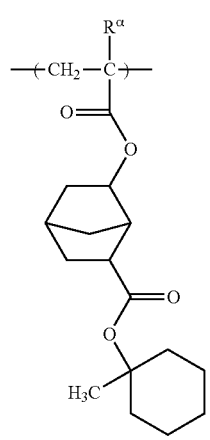
(a1-3-10)
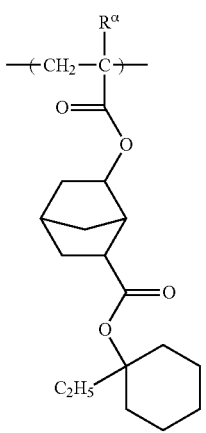
(a1-3-11)
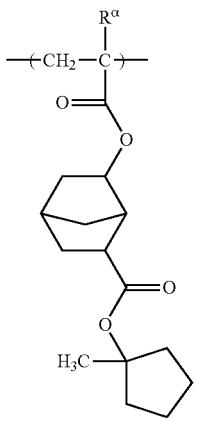
(a1-3-12)
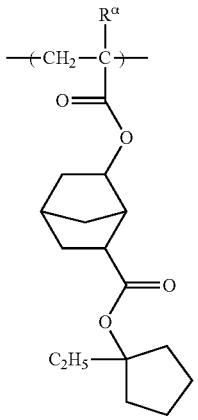
(a1-3-13)
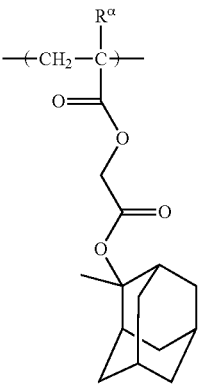
(a1-3-14)
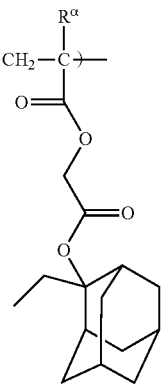

(a1-3-15) 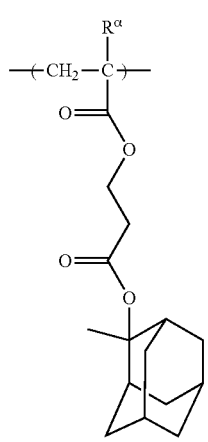
(a1-3-16) 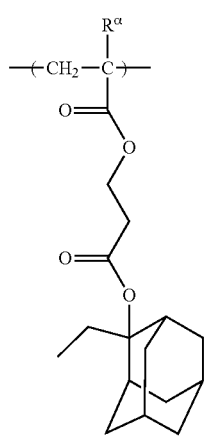
(a1-3-17) 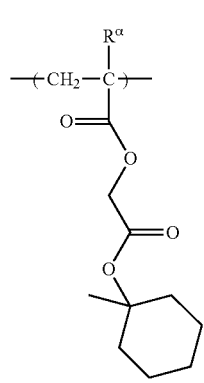
(a1-3-18) 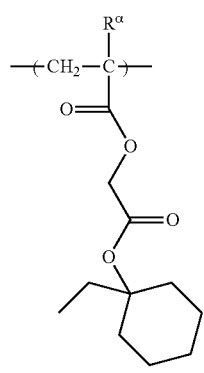
[Chemical Formula 19.]
(a1-3-19) 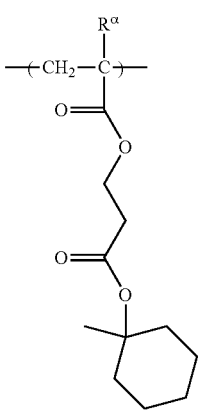
(a1-3-20) 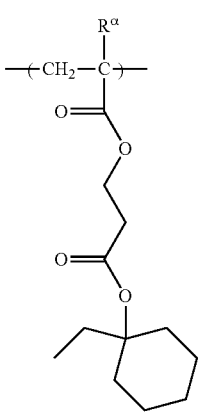
(a1-3-21) 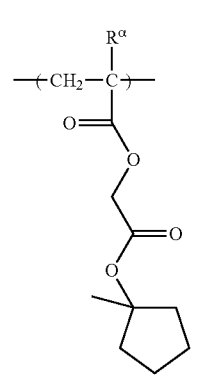
(a1-3-22) 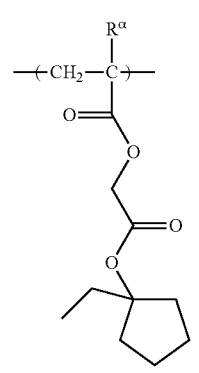

(a1-3-23)
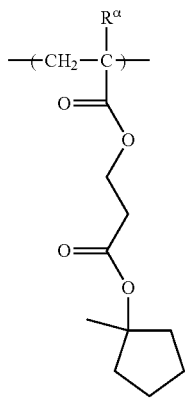
(a1-3-24)
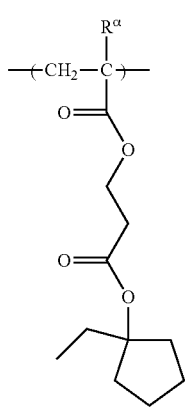
[Chemical Formula 20.]
(a1-3-25)
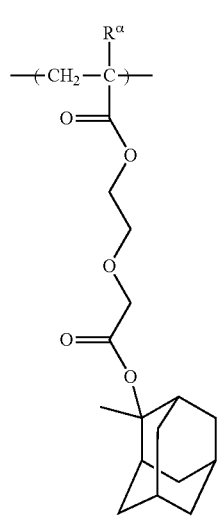
(a1-3-26)
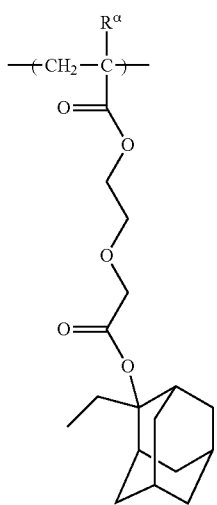
(a1-3-27)
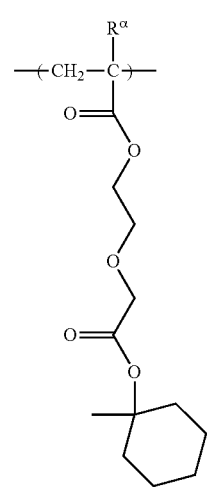
(a1-3-28)
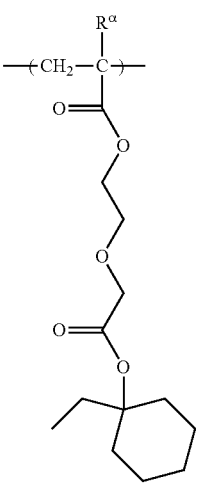

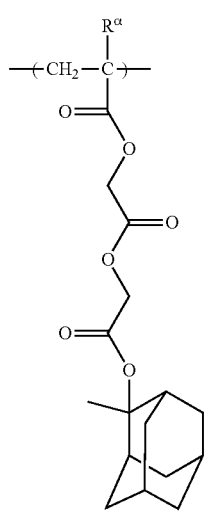
(a1-3-29)
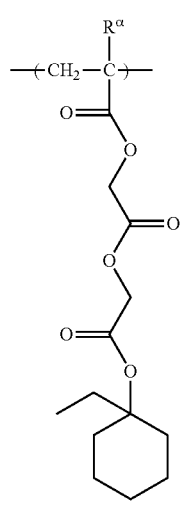
(a1-3-30)
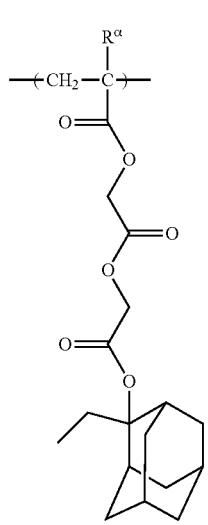
(a1-3-31)
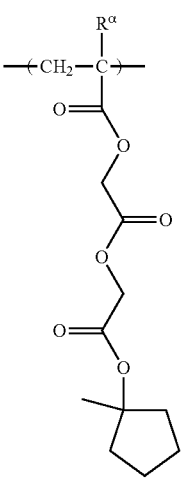
(a1-3-32)
[Chemical Formula 21.]
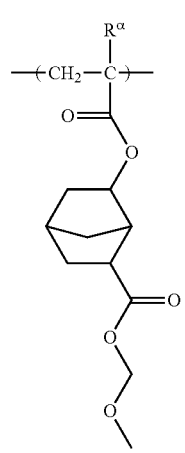
(a1-4-1)
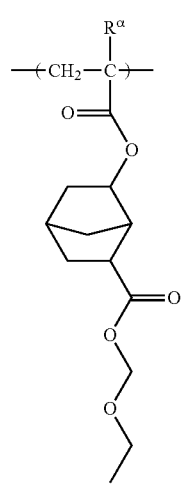
(a1-4-2)

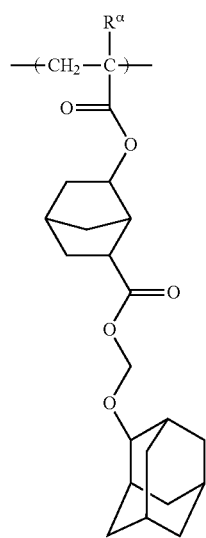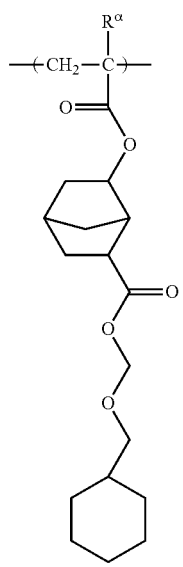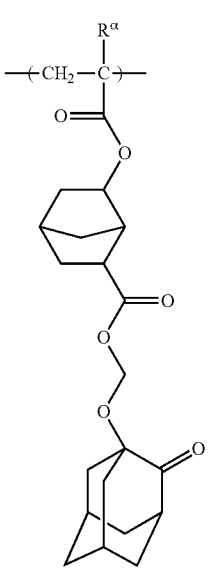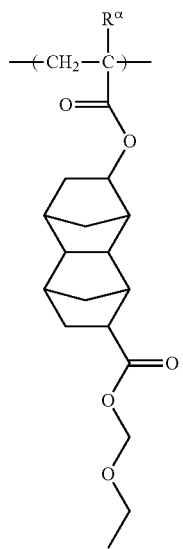
(a1-4-3)
(a1-4-4)
(a1-4-5)
(a1-4-6)
(a1-4-7)
(a1-4-8)

(a1-4-9)
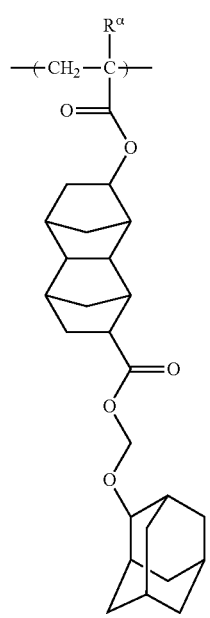
(a1-4-11)
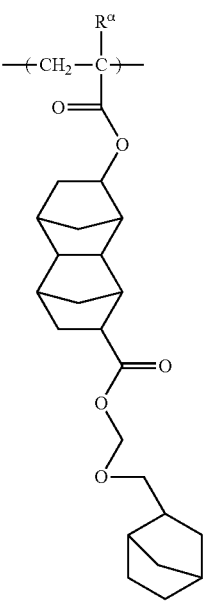
(a1-4-10)
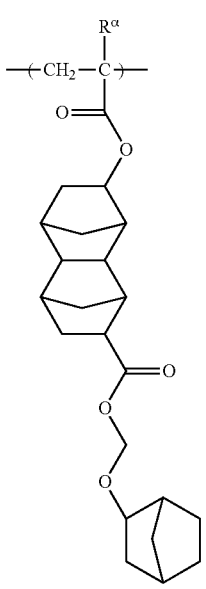
(a1-4-12)
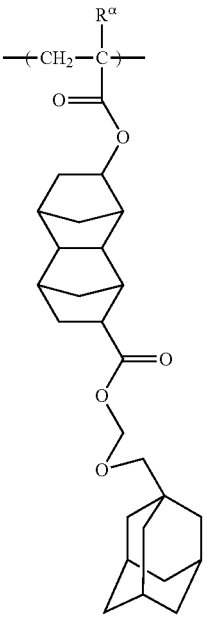

(a1-4-13)

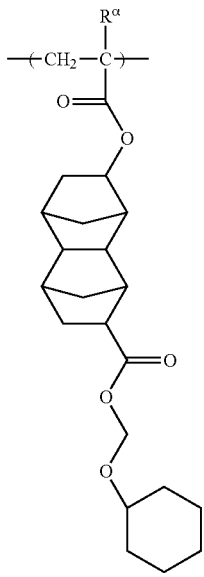

(a1-4-14)

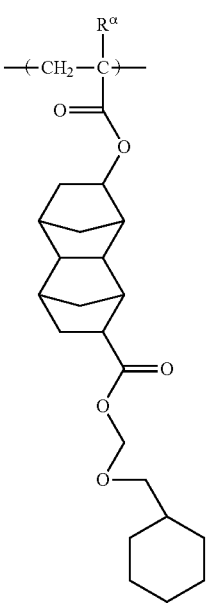

(a1-4-15)

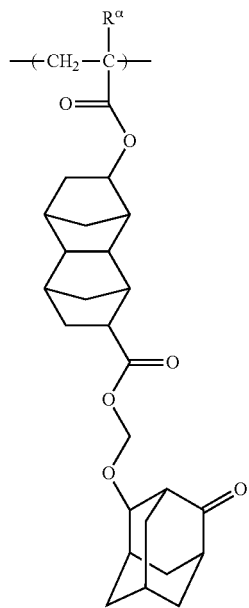

As the structural unit (a1), one type of structural unit may be used alone, or two or more types of structural units may be used in combination.

Among these, structural units represented by general formula (a1-1), (a1-2) or (a1-3) are preferable. More specifically, at least one structural unit selected from the group consisting of structural units represented by formulas (a1-1-1) to (a-1-1-4), (a1-1-20) to (a1-1-23), (a1-2-1) to (a1-2-24) and (a1-3-25) to (a1-3-28) is more preferable.

Further, as the structural unit (a1), structural units represented by general formula (a1-1-01) shown below which includes the structural units represented by formulas (a1-1-1) to (a1-1-3) and (a1-1-26), structural units represented by general formula (a1-1-02) shown below which includes the structural units represented by formulas (a1-1-16), (a1-1-17) and (a1-1-20) to (a1-1-23), structural units represented by general formula (a1-3-01) shown below which include the structural units represented by formulas (a1-3-25) and (a1-3-26), and structural units represented by general formula (a1-3-02) shown below which include the structural units represented by formulas (a1-3-27) and (a1-3-28) are also preferable.

[Chemical Formula 22.]

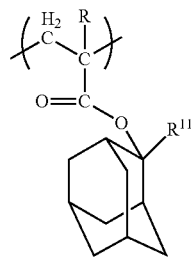

(a1-1-01)

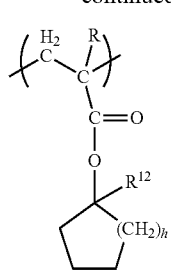

(a1-1-02)

In the formulas, each R independently represents a hydrogen atom, an alkyl group of 1 to 5 carbon atoms or a halogenated alkyl group of 1 to 5 carbon atoms; $R^{11}$ represents an alkyl group of 1 to 5 carbon atoms; $R^{12}$ represents an alkyl group of 1 to 7 carbon atoms; and h represents an integer of 1 to 6.

In general formula (a1-1-01), R is the same as defined above. The alkyl group of 1 to 5 carbon atoms for is the same as defined for the alkyl group of 1 to 5 carbon atoms for R, and a methyl group, an ethyl group or an isopropyl group is preferable.

In general formula (a1-1-02), R is the same as defined above. The alkyl group of 1 to 5 carbon atoms for $R^{12}$ is the same as defined for the alkyl group of 1 to 5 carbon atoms for R, and a methyl group, an ethyl group or an isopropyl group is preferable. h is preferably 1 or 2, and most preferably 2.

[Chemical Formula 23.]

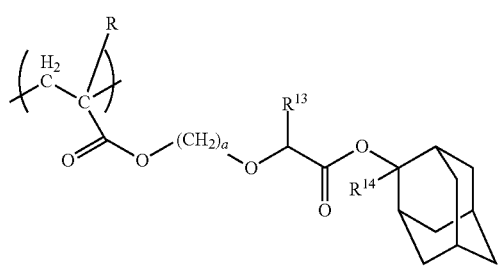

(a1-3-01)

In the formula, R represents a hydrogen atom, an alkyl group of 1 to 5 carbon atoms or a halogenated alkyl group of 1 to 5 carbon atoms; $R^{14}$ represents an alkyl group of 1 to 5 carbon atoms; $R^{13}$ represents a hydrogen atom or a methyl group; and a represents an integer of 1 to 10.

[Chemical Formula 24.]

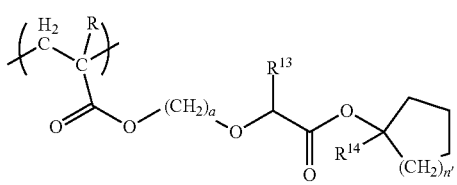

(a1-3-02)

In the formula, R represents a hydrogen atom, an alkyl group of 1 to 5 carbon atoms or a halogenated alkyl group of 1 to 5 carbon atoms; $R^{14}$ represents an alkyl group of 1 to 5 carbon atoms; $R^{13}$ represents a hydrogen atom or a methyl group; a represents an integer of 1 to 10; and n' represents an integer of 1 to 6.

In general formulas (a1-3-01) and (a1-3-02), R is the same as defined above.

$R^{13}$ is preferably a hydrogen atom.

The alkyl group of 1 to 5 carbon atoms for $R^{14}$ is the same as defined for the alkyl group of 1 to 5 carbon atoms for R, and a methyl group or an ethyl group is preferable.

n' is preferably 1 or 2, and most preferably 2.

a is preferably an integer of 1 to 8, more preferably an integer of 2 to 5, and most preferably 2.

In the component (A1), the amount of the structural unit (a1) based on the combined total of all structural units constituting the component (A1) is preferably 5 to 80 mol %, more preferably 10 to 80 mol %, and still more preferably 15 to 75 mol %. When the amount of the structural unit (a1) is at least as large as the lower limit of the above-mentioned range, a pattern can be easily formed using a resist composition prepared from the component (A1). On the other hand, when the amount of the structural unit (a1) is no more than the upper limit of the above-mentioned range, a good balance can be achieved with the other structural units.

(Structural Unit (a2))

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propiolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 25.]

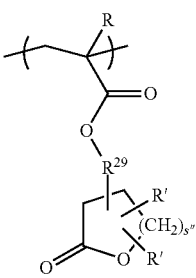

(a2-1)

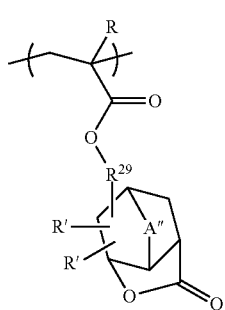
(a2-2)

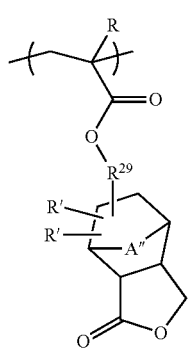
(a2-3)

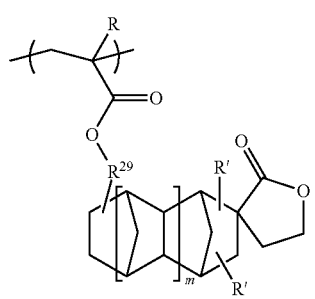
(a2-4)

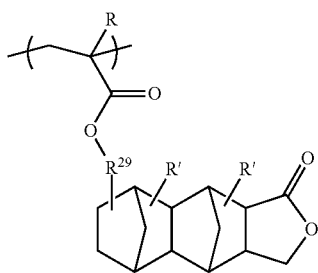
(a2-5)

In the formulas, R represents a hydrogen atom, an alkyl group of 1 to 5 carbon atoms or a halogenated alkyl group of 1 to 5 carbon atoms; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined for R in the structural unit (a1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R' include a methoxy group, an ethoxy group, an n-propoxy group, an iso-propoxy group, an n-butoxy group and a tert-butoxy group In terms of industrial availability, R' is preferably a hydrogen atom.

The alkyl group for R" may be any of linear, branched or cyclic.

When R" is a linear or branched alkyl group, it preferably has 1 to 10 carbon atoms, more preferably 1 to 5 carbon atoms.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As examples of A", the same groups as those described above for A' in general formula (3-1) can be given. A" is preferably an alkylene group of 1 to 5 carbon atoms, an oxygen atom (—O—) or a sulfur atom (—S—), and more preferably an alkylene group of 1 to 5 carbon atoms or —O—. As the alkylene group of 1 to 5 carbon atoms, a methylene group or a dimethylethylene group is preferable, and a methylene group is particularly desirable.

$R^{29}$ represents a single bond or a divalent linking group. As examples of the divalent linking group, the same divalent linking groups as those described above for $R^2$ in the aforementioned formula (a0-1) can be given. Among these, an alkylene group, an ester bond (—C(=O)—O—) or a combination of these is preferable. The alkylene group as a divalent linking group for $R^{29}$ is preferably a linear or branched alkylene group. Specific examples include the same linear alkylene groups and branched alkylene groups as those described above for the aliphatic hydrocarbon group represented by $R^2$.

As $R^{29}$, a single bond or —$R^{29'}$—C(=O)—O— (in the formula, $R^{29'}$ represents a linear or branched alkylene group) is particularly desirable.

The linear or branched alkylene group for $R^{29'}$ preferably has 1 to 10 carbon atoms, more preferably 1 to 8, still more preferably 1 to 5, still more preferably 1 to 3, and most preferably 1 or 2.

As the linear alkylene group for $R^{29'}$, a methylene group or an ethylene group is preferable, and a methylene group is particularly desirable. As the branched alkylene group for $R^{29'}$, an alkylmethylene group or an alkylethylene group is preferable, and —CH(CH$_3$)—, —C(CH$_3$)$_2$— or —C(CH$_3$)$_2$CH$_2$— is particularly desirable.

In formula (a2-1), s" is preferably 1 or 2.

Specific examples of structural units represented by general formulas (a2-1) to (a2-5) are shown below. In the formulas shown below, $R^\alpha$ represents a hydrogen atom, a methyl group or a trifluoromethyl group.

[Chemical Formula 26.]
(a2-1-1) 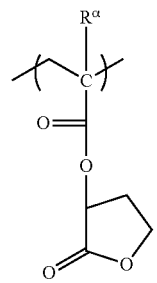
(a2-1-2) 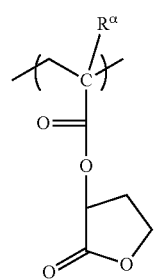
(a2-1-3) 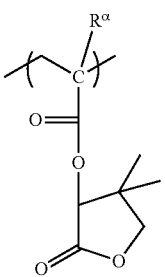
(a2-1-4) 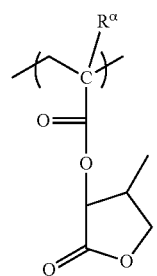
(a2-1-5) 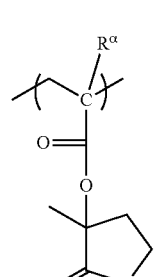
-continued
(a2-1-6) 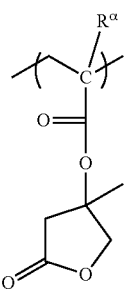
(a2-1-7) 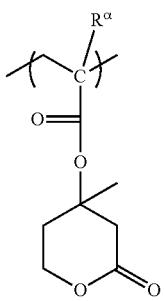
(a2-1-8) 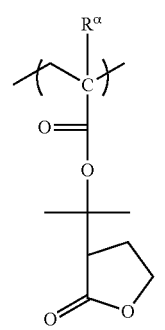
(a2-1-9) 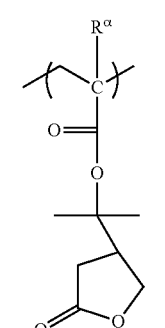
(a2-1-10) 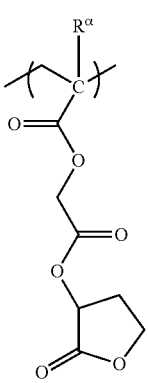

(a2-1-11)
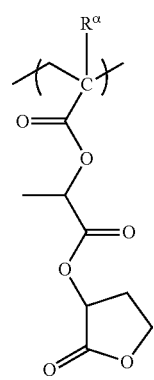
(a2-1-12)
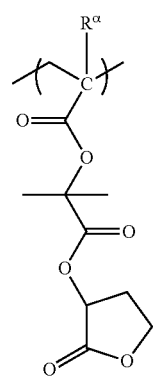
(a2-1-13)
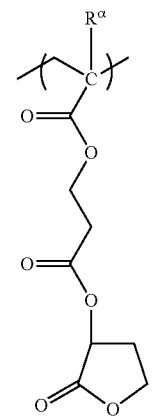
[Chemical Formula 27.]
(a2-2-1)
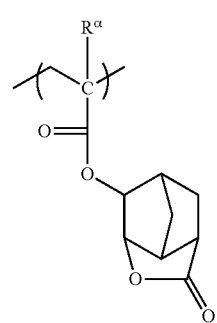
(a2-2-2)
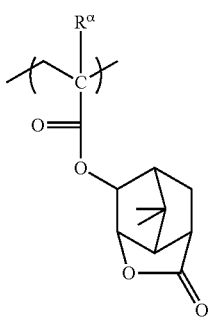
(a2-2-3)
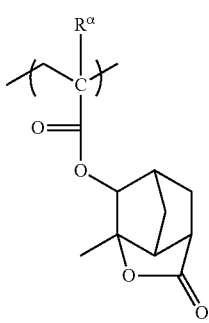
(a2-2-4)
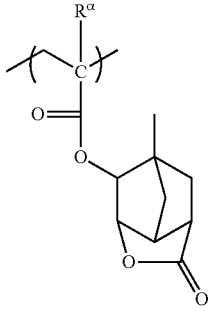
(a2-2-5)
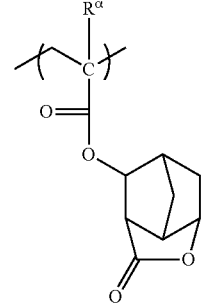
(a2-2-6)
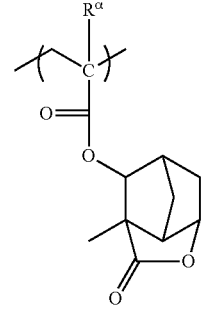

(a2-2-7)
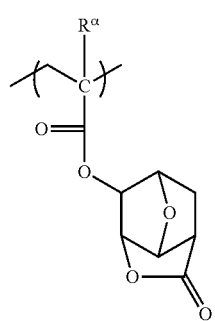
(a2-2-8)
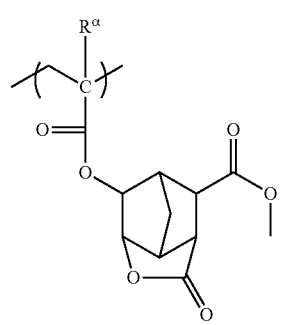
(a2-2-9)
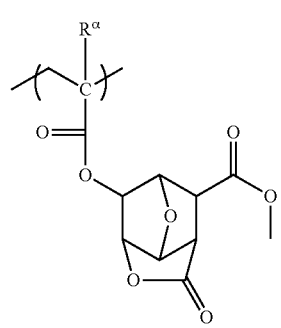
(a2-2-10)
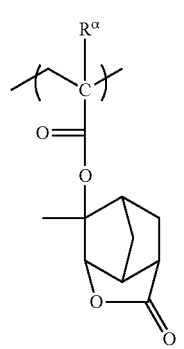
(a2-2-11)
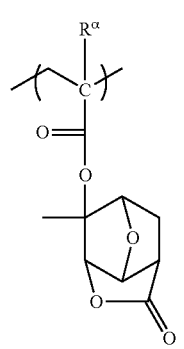
(a2-2-12)
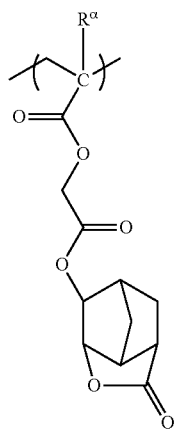
(a2-2-13)
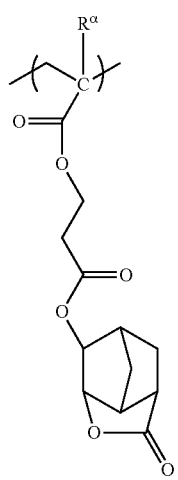
(a2-2-14)
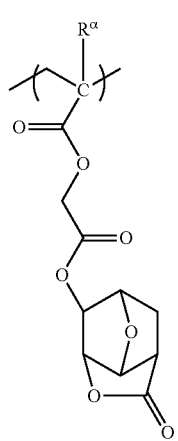

[Chemical Formula 28.]
(a2-2-15)
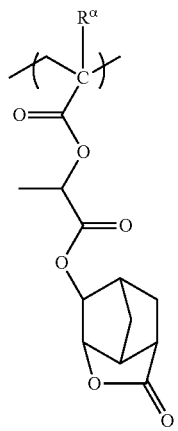
(a2-2-16)
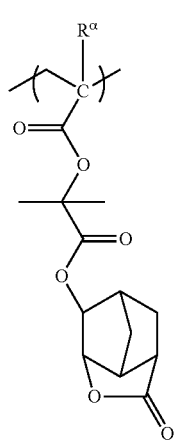
(a2-2-17)
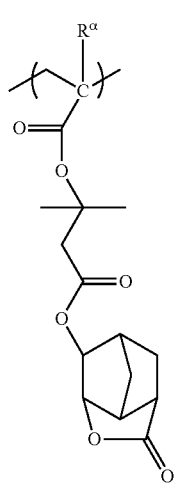
(a2-3-1)
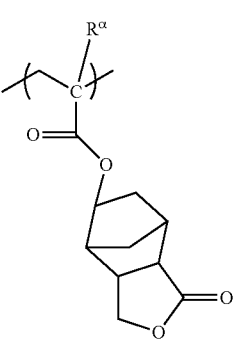
(a2-3-2)
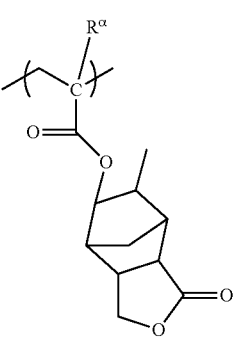
(a2-3-3)
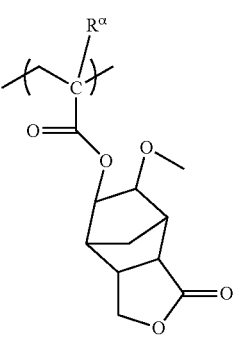
(a2-3-4)
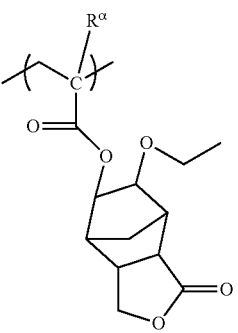

(a2-3-5)
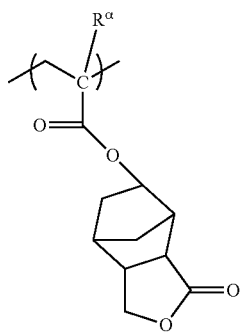
(a2-3-6)
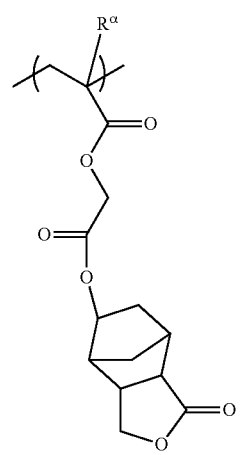
(a2-3-7)
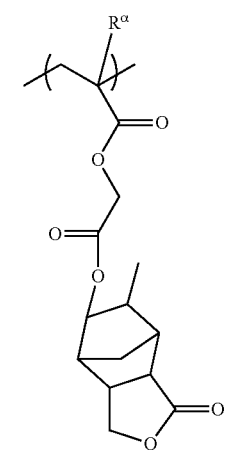
(a2-3-8)
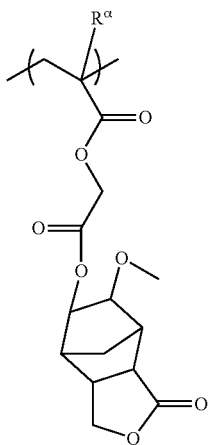
(a2-3-9)
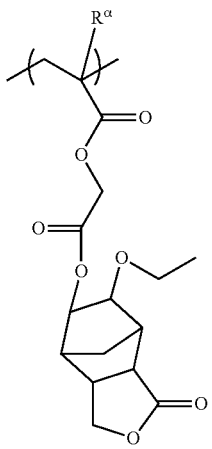
(a2-3-10)
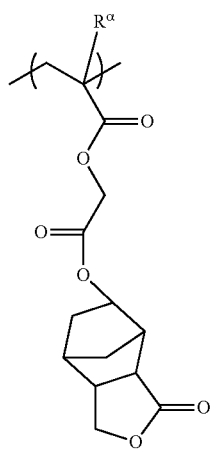
[Chemical Formula 29.]
(a2-4-1)
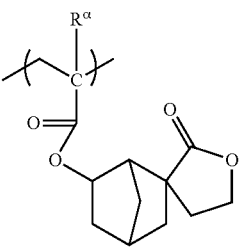

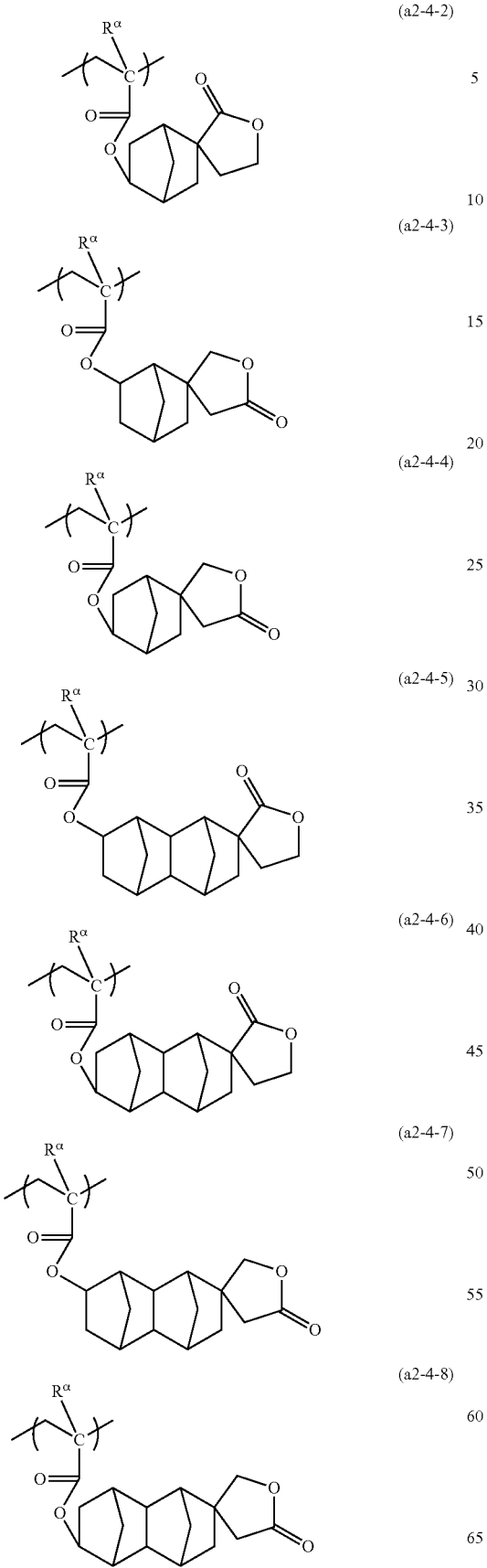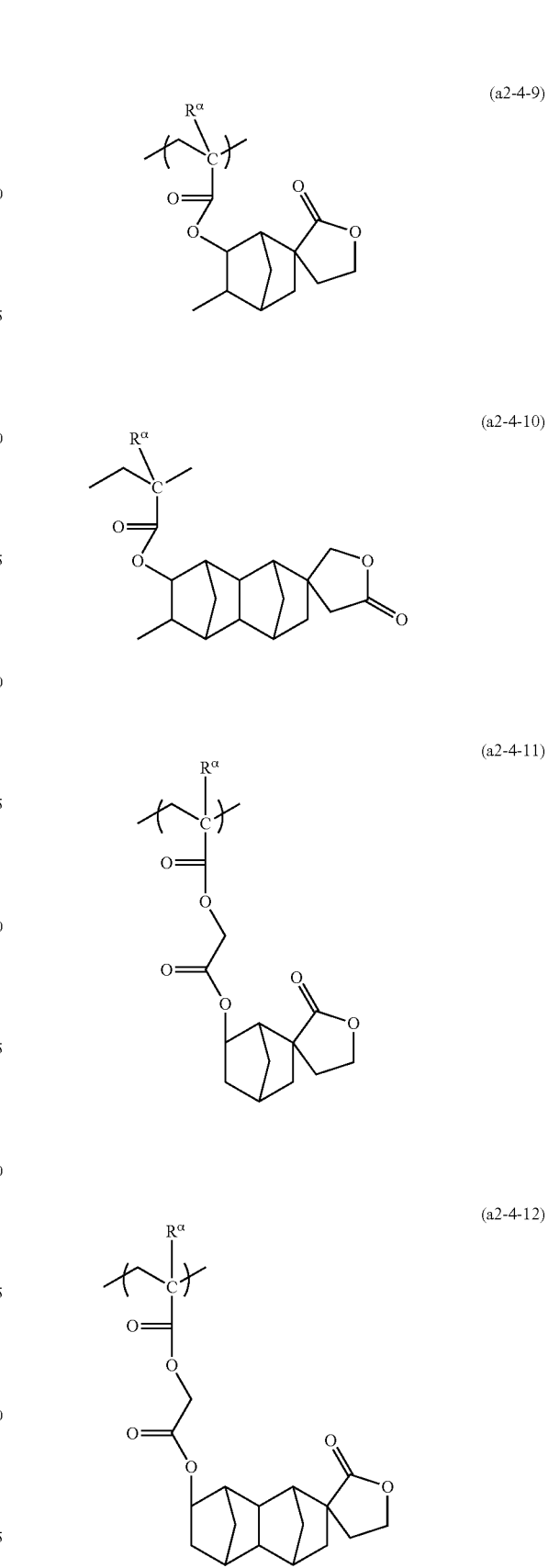

[Chemical Formula 30.]
(a2-5-1)
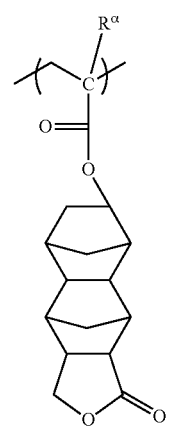
(a2-5-2)
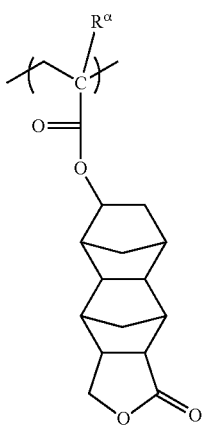
(a2-5-3)
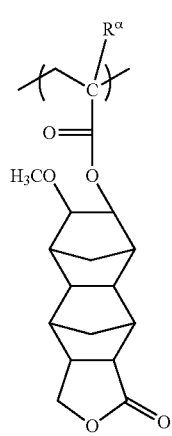
(a2-5-4)
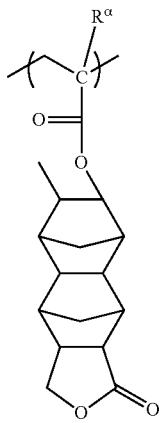
(a2-5-5)
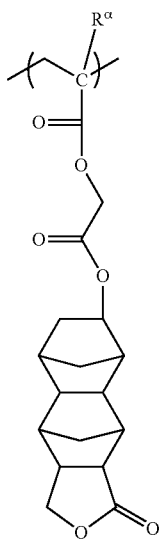
(a2-5-6)
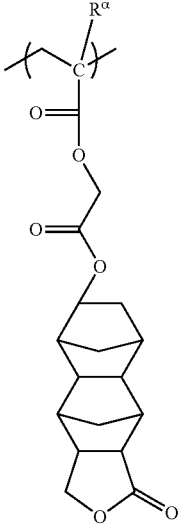
In the component (A1), as the structural unit (a2), one type of structural unit may be used, or two or more types may be used in combination.
In the present invention, when the component (A1) includes the structural unit (a2), it is preferable to include at least one structural unit selected from the group consisting of structural units represented by the aforementioned general formulas (a2-1) to (a2-5), more preferably at least one structural unit selected from the group consisting of structural units represented by the aforementioned general formulas (a2-1) to (a2-3), and most preferably at least one structural unit selected from the group consisting of structural units represented by the aforementioned general formulas (a2-1) and (a2-2).

When the component (A1) includes the structural unit (a2), in terms of improving the adhesion between a substrate and a resist film formed using a positive resist composition containing the component (A1) and increasing the compatibility with a developing solution, the amount of the structural unit (a2) within the component (A1), based on the combined total of all structural units constituting the component (A1) is preferably 5 to 70 mol %, more preferably 10 to 65 mol %, still more preferably 15 to 65 mol %, and most preferably 20 to 60 mol %. By ensuring the above-mentioned range, MEF and the pattern shape can be further improved, and CDU can also be improved.

(Structural Unit (a3))

The structural unit (a3) is a structural unit derived from an acrylate ester containing a polar group-containing aliphatic hydrocarbon group.

When the component (A1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and polycyclic aliphatic hydrocarbon groups (polycyclic groups).

These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 31.]

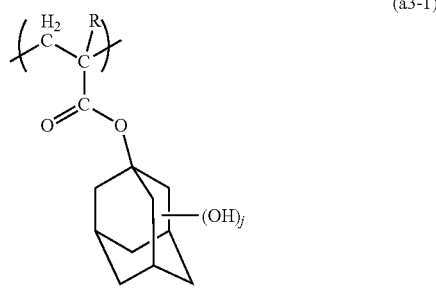

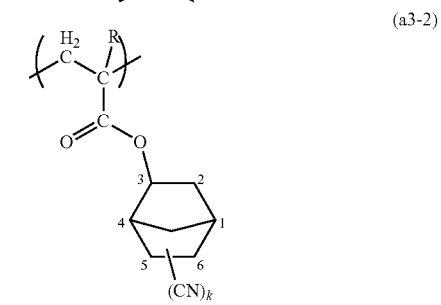

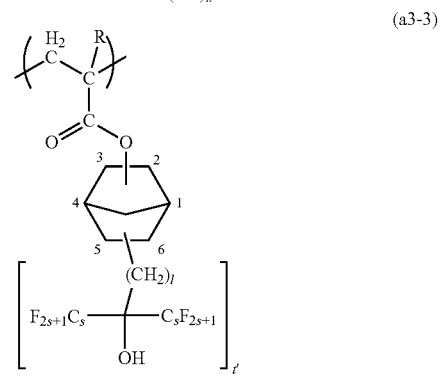

In the formulas, R is the same as defined above; j is an integer of 1 to 3; k is an integer of 1 to 3; t' is an integer of 1 to 3; l is an integer of 1 to 5; and s is an integer of 1 to 3.

In general formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkylalcohol is preferably bonded to the 5th or 6th position of the norbornyl group.

As the structural unit (a3), one type of structural unit may be used, or two or more types may be used in combination.

In the component (A1), the amount of the structural unit (a3) based on the combined total of all structural units constituting the component (A1) is preferably 1 to 50 mol %, more preferably 3 to 45 mol %, and still more preferably 5 to 40 mol %. When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Other Structural Units)

The component (A1) may also have a structural unit other than the above-mentioned structural units (a1) to (a3) (hereafter, referred to as "structural unit (a4)"), as long as the effects of the present invention are not impaired.

As the structural unit (a4), any other structural unit which cannot be classified as one of the above structural units (a1) to (a3) can be used without any particular limitation, and any of the multitude of conventional structural units used within resist resins for ArF excimer lasers or KrF excimer lasers (and particularly for ArF excimer lasers) can be used.

Preferable examples of the structural unit (a4) include a structural unit derived from an acrylate ester which contains a non-acid-dissociable aliphatic polycyclic group, and is also derived from an acrylate ester, a structural unit derived from a styrene monomer and a structural unit derived from a vinyl-naphthalene monomer. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a-4-1) to (a-4-5) shown below.

[Chemical Formula 32.]

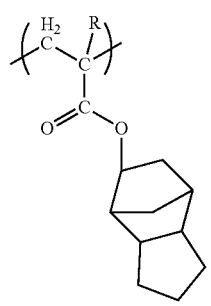

(a4-1)

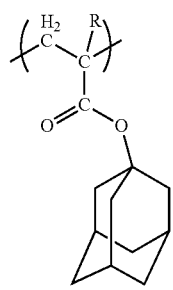

(a4-2)

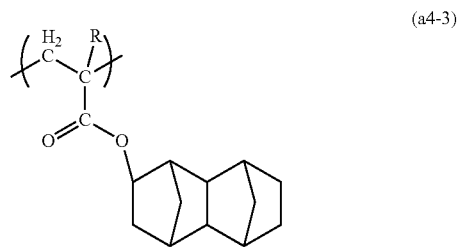

(a4-3)

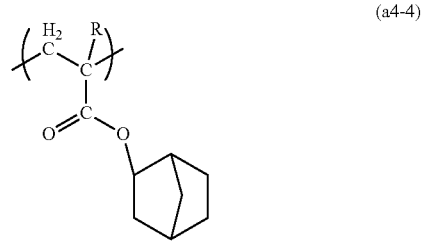

(a4-4)

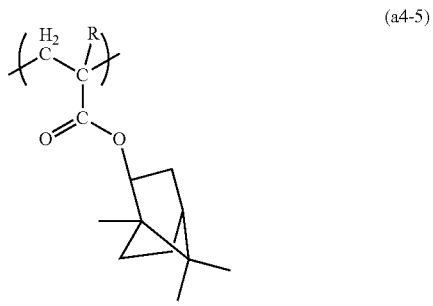

(a4-5)

In the formulas, R is the same as defined above.

As the structural unit (a4), one type of structural unit may be used, or two or more types may be used in combination.

When the structural unit (a4) is included in the component (A1), the amount of the structural unit (a4) based on the combined total of all structural units constituting the component (A1) is preferably 1 to 20 mol %, more preferably 1 to 15 mol %, and still more preferably 1 to 10 mol %.

The component (A1) is a copolymer including the structural unit (a0-1) and the structural unit (a1).

Examples of such copolymers include a copolymer consisting of the structural units (a0-1) and (a1), a copolymer consisting of the structural units (a0-1), (a1) and (a3), a copolymer consisting of the structural units (a0-1), (a1) and (a2), and a copolymer consisting of the structural units (a0-1), (a1), (a2) and (a3).

In the present invention, as the component (A1), a copolymer that includes a combination of structural units represented by general formula (A1-11) shown below is particularly desirable.

[Chemical Formula 33.]

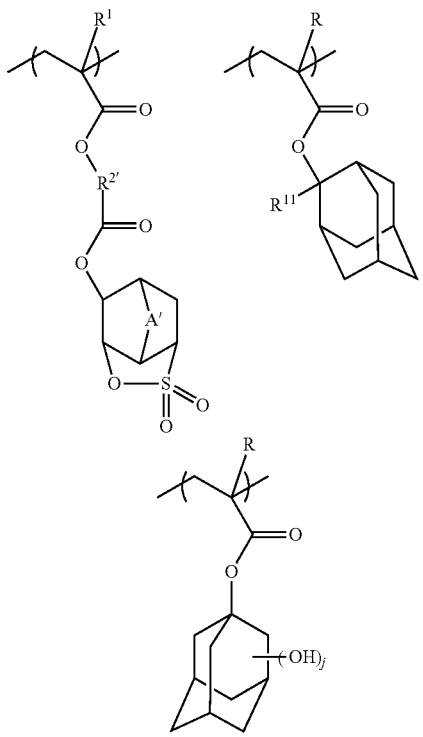

(A1-11)

In the formula, $R^1$, $R^{2'}$, A', R, $R^{11}$ and j are the same as defined above, and the plurality of R may be the same or different from each other.

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,500 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (A1) is not particularly limited, but is preferably 1.0 to 5.0, more preferably 1.0 to 3.0, and most preferably 1.2 to 2.5.

Here, Mn is the number average molecular weight.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

For example, as a monomer for deriving the structural unit (a0-1), a compound (I) represented by general formula (I) shown below can be used.

[Chemical Formula 34.]

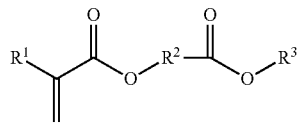

(I)

In formula (I), $R^1$ to $R^3$ are the same as defined above.

The method for producing the compound (I) is not particularly limited, and the compound (I) can be produced by a conventional method.

For example, in the presence of a base, a compound (X-2) represented by general formula (X-2) shown below is added to a solution obtained by dissolving a compound (X-1) represented by general formula (X-1) shown below in a reaction solvent, and a reaction is effected to thereby obtain a compound (I).

Examples of the base include inorganic bases such as sodium hydride, $K_2CO_3$ and $Cs_2CO_3$; and organic bases such as triethylamine, 4-dimethylaminopyridine (DMAP) and pyridine. Examples of condensing agents include carbodiimide reagents such as ethyldiisopropylaminocarbodiimide hydrochloride (EDCI), dicyclohexylcarboxylmide (DCC), diisopropylcarbodiimide and carbodiimidazole; tetraethyl pyrophosphate; and benzotriazole-N-hydroxytrisdimethylaminophosphonium hexafluorophosphide (Bop reagent).

If desired, an acid may be used. As the acid, any acid generally used for dehydration/condensation may be used. Specific examples include inorganic acids such as hydrochloric acid, sulfuric acid and phosphoric acid; and organic acids such as methanesulfonic acid, trifluoromethanesulfonic acid, benzenesulfonic acid and p-toluenesulfonic acid. These acids can be used individually, or in a combination of two or more.

[Chemical Formula 35.]

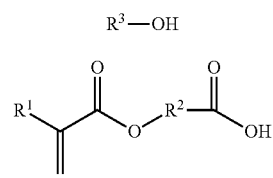

(X-1)

(X-2)

The structure of the compound obtained in the manner described above can be confirmed by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis and X-ray diffraction analysis.

In the component (A), as the component (A1), one type may be used, or two or more types of compounds may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved.

[Component (A2)]

As the component (A2), it is preferable to use a compound that has a molecular weight of at least 500 and less than 2,500, contains a hydrophilic group, and also contains an acid dissociable, dissolution inhibiting group described above in connection with the component (A1). Specific examples include compounds containing a plurality of phenol skeletons in which a part of the hydrogen atoms within hydroxyl groups have been substituted with the aforementioned acid dissociable, dissolution inhibiting groups.

Examples of the component (A2) include low molecular weight phenolic compounds in which a portion of the hydroxyl group hydrogen atoms have been substituted with an aforementioned acid dissociable, dissolution inhibiting group, and these types of compounds are known, for example, as sensitizers or heat resistance improvers for use in non-chemically amplified g-line or i-line resists.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers, tetramers, pentamers and hexamers of formalin condensation products of phenols such as phenol, m-cresol, p-cresol and xylenol. Needless to say, the low molecular weight phenol compound is not limited to these examples. In particular, a phenol compound having 2 to 6 triphenylmethane skeletons is preferable in terms of resolution and LWR.

Also, there are no particular limitations on the acid dissociable, dissolution inhibiting group, and suitable examples include the groups described above.

As the component (A2), one type of resin may be used, or two or more types of resins may be used in combination.

In the resist composition of the present invention, as the component (A), one type may be used, or two or more types of compounds may be used in combination.

In the resist composition of the present invention, the amount of the component (A) can be appropriately adjusted depending on the thickness of the resist film to be formed, and the like.

<Component (B)>

As the component (B), there is no particular limitation, and any of the known acid generators used in conventional chemically amplified resist compositions can be used. Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 36.]

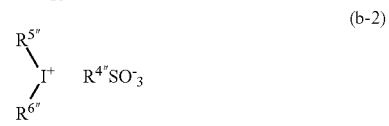

In the formulas above, $R^{1\prime\prime}$ to $R^{3\prime\prime}$, $R^{5\prime\prime}$ and $R^{6\prime\prime}$ each independently represent an aryl group or alkyl group, wherein two of $R^{1\prime\prime}$ to $R^{3\prime\prime}$ may be bonded to each other to form a ring with the sulfur atom; and $R^{4\prime\prime}$ represents an alkyl group, a halogenated alkyl group, an aryl group or an alkenyl group which may have a substituent, provided that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. In formula (b-1), two of $R^{1\prime\prime}$ to $R^{3\prime\prime}$ may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. For example, an aryl group having 6 to 20 carbon atoms may be used in which part or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

When two of $R^{1\prime\prime}$ to $R^{3\prime\prime}$ in formula (b-1) are bonded to each other to form a ring with the sulfur atom, it is preferable that the two of $R^{1\prime\prime}$ to $R^{3\prime\prime}$ form a 3 to 10-membered ring including the sulfur atom, and it is particularly desirable that the two of $R^{1\prime\prime}$ to $R^{3\prime\prime}$ form a 5 to 7-membered ring including the sulfur atom.

When two of $R^{1\prime\prime}$ to $R^{3\prime\prime}$ in formula (b-1) are bonded to each other to form a ring with the sulfur atom, the remaining one of $R^{1\prime\prime}$ to $R^{3\prime\prime}$ is preferably an aryl group. As examples of the aryl group, the same as the above-mentioned aryl groups for $R^{1\prime\prime}$ to $R^{3\prime\prime}$ can be given.

As preferable examples of the cation moiety for the compound represented by general formula (b-1), those represented by formulas (I-1-1) to (I-1-10) shown below can be given. Among these, a cation moiety having a triphenylmethane skeleton, such as a cation moiety represented by any one of formulas (I-1-1) to (I-1-8) shown below is particularly desirable.

In formulas (I-1-9) and (I-1-10), each of $R^9$ and $R^{10}$ independently represents a phenyl group or naphthyl group which may have a substituent, an alkyl group of 1 to 5 carbon atoms, an alkoxy group or a hydroxy group.

u is an integer of 1 to 3, and most preferably 1 or 2.

[Chemical Formula 37.]

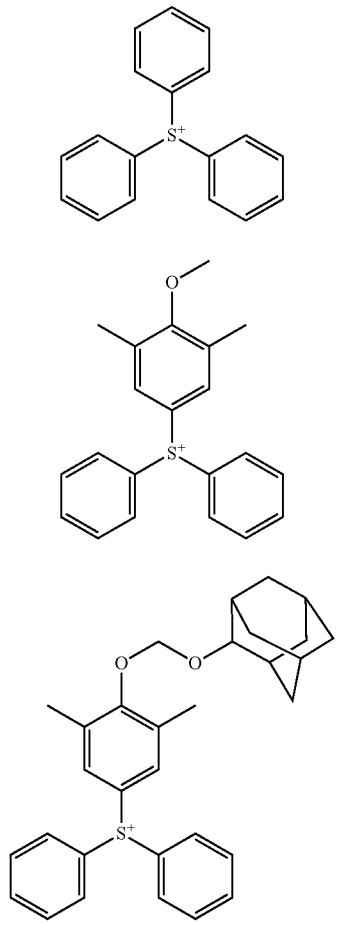

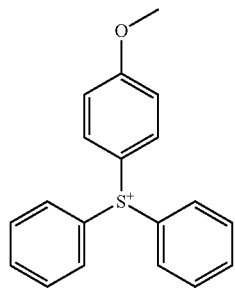

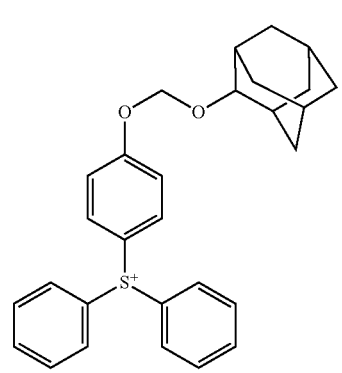

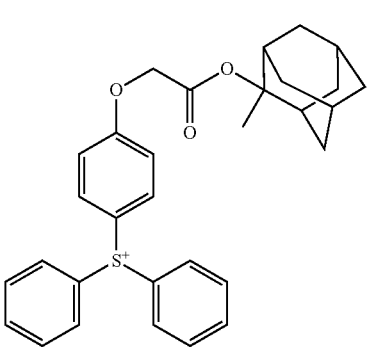

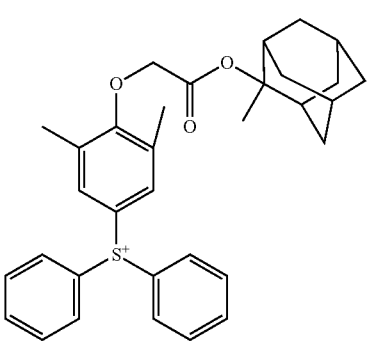

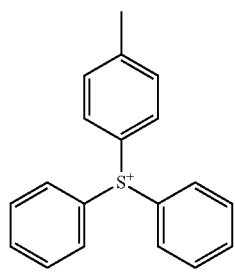

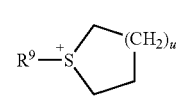

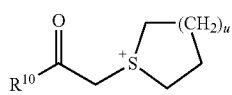

$R^{4'''}$ represents an alkyl group, a halogenated alkyl group, an aryl group or an alkenyl group which may have a substituent.

The alkyl group for $R^{4'''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4'''}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratio is preferable because the acid strength increases.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula X-$Q^1$- (in the formula, $Q^1$ represents a divalent linking group containing an oxygen atom; and X represents a hydrocarbon group of 3 to 30 carbon atoms which may have a substituent).

Examples of halogen atoms and alkyl groups as substituents for $R^{4'''}$ include the same halogen atoms and alkyl groups as those described above with respect to the halogenated alkyl group for $R^{4'''}$.

Examples of hetero atoms include an oxygen atom, a nitrogen atom, and a sulfur atom.

In the group represented by formula X-$Q^1$-, $Q^1$ represents a divalent linking group containing an oxygen atom.

$Q^1$ may contain an atom other than oxygen. Examples of atoms other than oxygen include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)—, —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5, and most preferably 1 to 3.

Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

$Q^1$ is preferably a divalent linking group containing an ester linkage or ether linkage, and more preferably a group of —$R^{91}$—O—, —$R^{92}$—O—C(=O)— or —C(=O)—O—$R^{93}$—O—C(=O)—.

In the group represented by the formula X-$Q^1$-, the hydrocarbon group for X may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for X, there is no particular limitation as long as it is an atom other than carbon and hydrogen. Examples of hetero atoms include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 38.]

(L1) 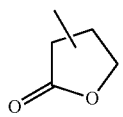

(L2) 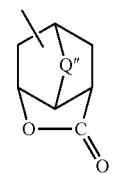

(L3) 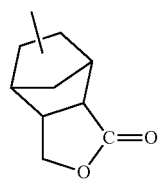

(L4) 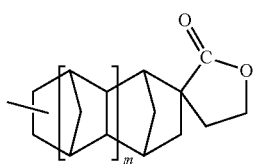

(L5) 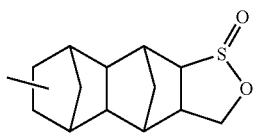

(S1) 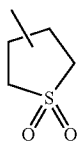

(S2) 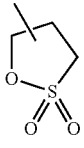

(S3) 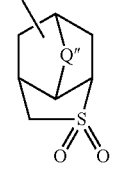

(S4) 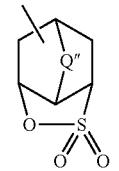

In the formula, Q" represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms); and m represents 0 or 1.

As the alkylene group for Q", $R^{94}$ and $R^{95}$, the same alkylene groups as those described above for $R^{91}$ to $R^{93}$ can be used.

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

In the present invention, as X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by the aforementioned formulas (L2) to (L5), (S3) and (S4) are preferable.

In the present invention, $R^{4'''}$ preferably has X-$Q^1$- as a substituent. In such a case, $R^{4'''}$ is preferably a group represented by the formula X-$Q^1$-$Y^1$— (in the formula, $Q^1$ and X are the same as defined above; and $Y^1$ represents an alkylene group of 1 to 4 carbon atoms which may have a substituent, or a fluorinated alkylene group of 1 to 4 carbon atoms which may have a substituent).

In the group represented by the formula X-$Q^1$-$Y^1$—, as the alkylene group for $Y^1$, the same alkylene group as those described above for $Q^1$ in which the number of carbon atoms is 1 to 4 can be used.

As the fluorinated alkylene group, the aforementioned alkylene group in which part or all of the hydrogen atoms has been substituted with fluorine atoms can be used.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CH$_2$CF$_2$—, —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), R$^{5'''}$ and R$^{6'''}$ each independently represent an aryl group or alkyl group. At least one of R$^{5'''}$ and R$^{6'''}$ represents an aryl group. It is preferable that both of R$^{5'''}$ and R$^{6'''}$ represent an aryl group.

As the aryl group for R$^{5'''}$ and R$^{6'''}$, the same as the aryl groups for R$^{1'''}$ to R$^{3'''}$ can be used.

As the alkyl group for R$^{5'''}$ and R$^{6'''}$, the same as the alkyl groups for R$^{1'''}$ to R$^{3'''}$ can be used.

It is particularly desirable that both of R$^{5'''}$ and R$^{6'''}$ represents a phenyl group.

As R$^{4'''}$ in formula (b-2), the same groups as those mentioned above for R$^{4'''}$ in formula (b-1) can be used.

Specific examples of suitable onium salt acid generators represented by formula (b-1) or (b-2) include diphenyl)iodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by an alkyl sulfonate, such as methanesulfonate, n-propanesulfonate, n-butanesulfonate, n-octanesulfonate, 1-adamantanesulfonate, 2-norbornanesulfonate or d-camphor-10-sulfonate; or replaced by an aromatic sulfonate, such as benzenesulfonate, perfluorobenzenesulfonate or p-toluenesulfonate.

Furthermore, onium salts in which the anion moiety of these onium salts are replaced by an anion moiety represented by any one of formulas (b1) to (b8) shown below can be used.

[Chemical Formula 39.]

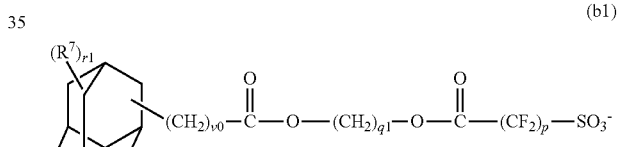

(b1)

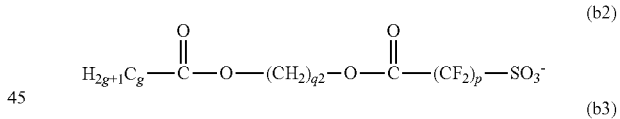

(b2)

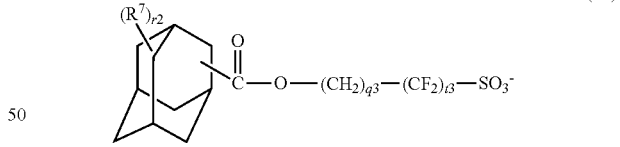

(b3)

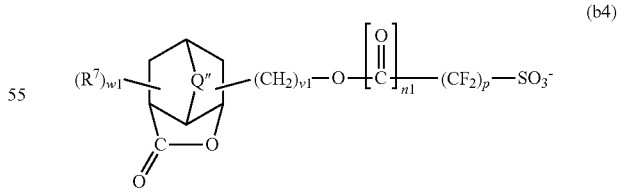

(b4)

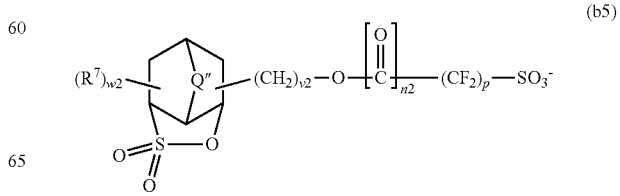

(b5)

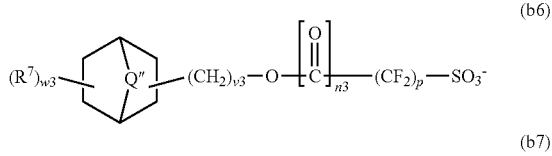
(b6)

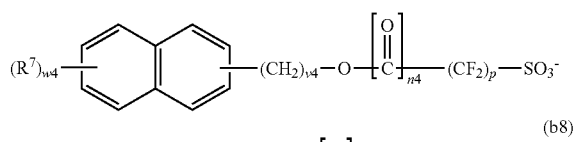
(b7)

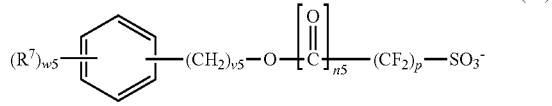
(b8)

In the formulas, p represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; g represents an integer of 1 to 20; $R^7$ represents a substituent; each of n1 to n5 independently represents 0 or 1; each of v0 to v5 independently represents an integer of 0 to 3; each of w1 to w5 independently represents an integer of 0 to 3; and Q" is the same as defined above.

As the substituent for $R^7$, the same groups as those which the aforementioned aliphatic hydrocarbon group or aromatic hydrocarbon group for X may have as a substituent can be used.

If there are two or more of the $R^7$ group, as indicated by the values r1, r2, and w1 to w5, then the two or more of the $R^7$ groups may be the same or different from each other.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 40.]

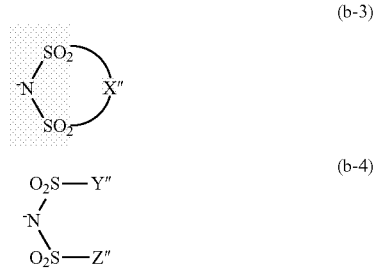

(b-3)

(b-4)

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used.

[Chemical Formula 41.]

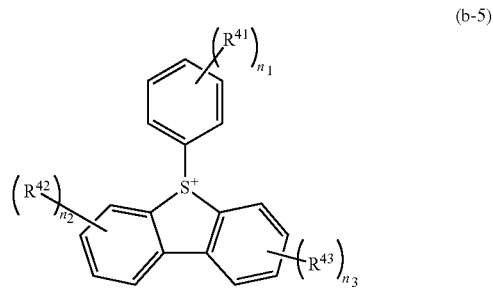
(b-5)

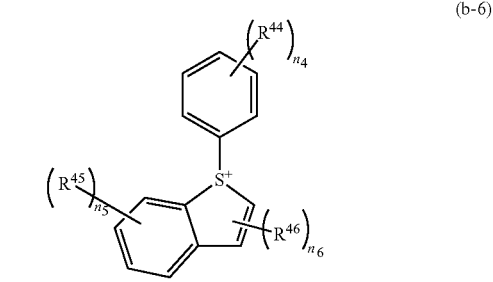
(b-6)

In formulas (b-5) and (b-6) above, each of $R^{41}$ to $R^{46}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert-butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4''}SO_3^-$) for onium salt-based acid generators represented by general formula (b-1) or (b-2) shown above; and anion moieties represented by general formula (b-3) or (b-4) shown above.

In the present description, an oximesulfonate-based acid generator is a compound having at least one group represented by general formula (B-1) shown below, and has a feature of generating acid by irradiation. Such oximesulfonate acid generators are widely used for a chemically amplified resist composition, and can be appropriately selected.

[Chemical Formula 42.]

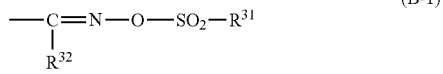
(B-1)

In formula (B-1), each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably afluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 43.]

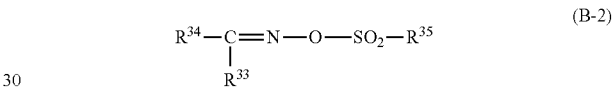
(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 44.]

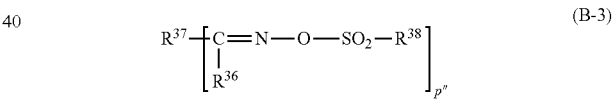
(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described at pages 65 to 86) may be preferably used.

Furthermore, as preferable examples, the following can be used.

[Chemical Formula 45.]

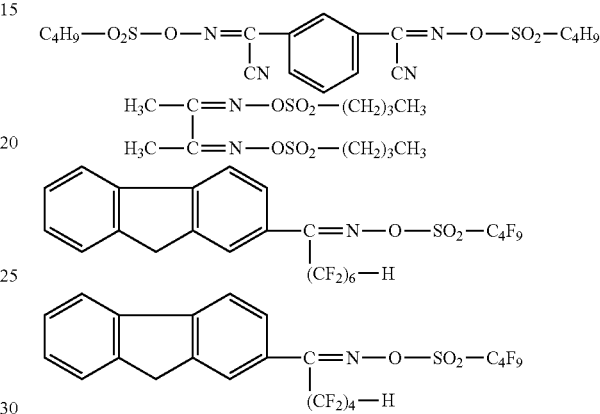

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of acid generator may be used, or two or more types of acid generators may be used in combination.

In the present invention, as the component (B), an onium salt having a fluorinated alkylsulfonic acid ion as the anion moiety is preferable.

In the positive resist composition of the present invention, the amount of the component (B) relative to 100 parts by weight of the component (A) is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Component (C')>

In the present invention, the component (C') is a fluorine-containing polymeric compound having a structural unit (c0) which generates acid upon exposure and a structural unit (c1) represented by general formula (c1) shown below.

[Chemical Formula 46.]

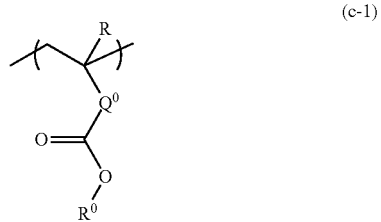

(c-1)

In the formula, R represents a hydrogen atom, an alkyl group of 1 to 5 carbon atoms or a halogenated alkyl group of 1 to 5 carbon atoms; $Q^0$ represents a single bond or a divalent linking group; and $R^0$ represents an organic group which may have a fluorine atom, provided that, when $R^0$ has no fluorine atom, $Q^0$ has a fluorine atom.

(Structural Unit (c0))

The structural unit (c0) is a structural unit which generates acid upon exposure.

The structural unit (c0) is not particularly limited as long as it generates acid upon exposure. For example, a structural unit copolymerizable with the structural unit (c1) described later and in which an acid generator for a conventional chemically amplified resist have been introduced can be used.

Preferable examples of the structural unit copolymerizable with the structural units (c1) described later include a structural unit derived from a (meth)acrylate ester and a structural unit derived from hydroxystyrene.

Preferable examples of the acid generator for a conventional chemically amplified resist include the aforementioned component (B).

The structural unit (c0) preferably has a group represented by general formula (c0-1-0) or (c0-2-0) shown below.

[Chemical Formula 47.]

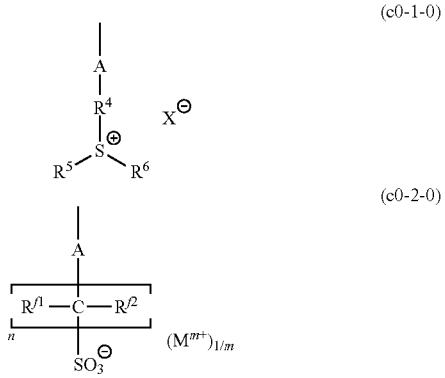

In the formulas, A represents a single bond or a divalent linking group; $R^4$ represents an arylene group which may have a substituent; each of $R^5$ and $R^6$ independently represents an organic group, wherein $R^5$ and $R^6$ may be mutually bonded to form a ring with the sulfur atom; $X^-$ represents a counteranion; each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group; n represents an integer of 1 to 8; $M^{m+}$ represents a countercation; and m represents an integer of 1 to 3.

In formulas (c0-1-0) and (c0-2-0), A represents a single bond or a divalent linking group. Examples of the divalent linking group for A include the same divalent linking groups as those described above for $R^2$ in the aforementioned formula (a0-1). In the present invention, A preferably represents an ester bond [—C(=O)—O—], an ether bond (—O—), an alkylene group, a combination of these, or a single bond.

In formula (c0-1-0), $R^4$ represents an arylene group which may have a substituent. The $R^4$ group may have one substituent, or a plurality of substituents.

The arylene group for $R^4$ is not particularly limited. For example, an arylene group having 6 to 20 carbon atoms in which part or all of the hydrogen atoms of the aryl group may or may not be substituted can be used. For example, the arylene group may or may not be substituted with an alkyl group, an alkoxy group, a halogen atom, a hydroxy group or the like.

The arylene group is preferably an arylene group of 6 to 10 carbon atoms because it can be synthesized at a low cost. Specific examples thereof include a phenylene group and a naphthylene group. Of these, a phenylene group is particularly desirable.

The alkyl group, with which hydrogen atoms of the arylene group may be substituted, is preferably an alkyl group having 1 to 5 carbon atoms, more preferably a methyl group, an ethyl group, a propyl group, an n-butyl group, or a tert-butyl group, and most preferably a methyl group.

The alkoxy group, with which hydrogen atoms of the arylene group may be substituted, is preferably an alkoxy group having 1 to 5 carbon atoms, more preferably a methoxy group, an ethoxy group, an n-propoxy group, an iso-propoxy group, an n-butoxy group or a tert-butoxy group.

The halogen atom, with which hydrogen atoms of the arylene group may be substituted, is preferably a fluorine atom.

In formula (c0-1-0), each of $R^5$ and $R^6$ independently represents an organic group.

The organic group for $R^5$ and $R^6$ refers to a group containing a carbon atom, and may include atoms other than carbon (e.g., a hydrogen atom, an oxygen atom, a nitrogen atom, a sulfur atom, a halogen atom (such as a fluorine atom or a chlorine atom) and the like).

The organic group for $R^5$ and $R^6$ is preferably an aryl group or an alkyl group.

The aryl group for $R^5$ and $R^6$ is not particularly limited. For example, an aryl group having 6 to 20 carbon atoms in which part or all of the hydrogen atoms of the aryl group may or may not be substituted can be used. For example, the arylene group may or may not be substituted with an alkyl group, an alkoxy group, a halogen atom, a hydroxy group or the like.

The aryl group is preferably an aryl group having 6 to 10 carbon atoms because it can be synthesized at a low cost. Specific examples thereof include a phenyl group and a naphthyl group. Of these, a phenyl group is particularly desirable.

As examples of the alkyl group, alkoxy group and halogen atom with which the hydrogen atoms of the aryl group may be substituted, the same alkyl group, alkoxy group and halogen atom as those with which the arylene group for $R^4$ may be substituted can be given.

The alkyl group for $R^5$ and $R^6$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group and a decyl group. Among these, a methyl group is preferable because it is excellent in resolution and can be synthesized at a low cost.

In formula (c0-1-0), $R^5$ and $R^6$ may be mutually bonded to form a ring with the sulfur atom.

In such a case, the ring including the sulfur atom is preferably a 3- to 10-membered ring, and more preferably a 5- to 7-membered ring.

The ring structure formed with the sulfur atom may include a hetero atom such as a sulfur atom or an oxygen atom (—O—, =O).

Specific examples of the ring formed include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring and a phenazine ring.

In formula (c0-1-0), $X^-$ represents a counteranion.

The counteranion for $X^-$ is not particularly limited, and examples thereof include an anion moiety ($R^{4"}SO_3^-$) of the onium salt-based acid generator represented by the aforementioned general formula (b-1) or (b-2), and an anion moiety represented by the aforementioned general formula (b-3) or (b-4). In particular, the counteranion is preferably $R^{4"}SO_3^-$, and more preferably a fluorinated alkylsulfonate ion of 1 to 8 carbon atoms (preferably 1 to 4 carbon atoms) or at least one member selected from those represented by the aforementioned general formulas (b1) to (b8).

In formula (c0-2-0), each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group.

The alkyl group for $R^{f1}$ and $R^{f2}$ is preferably an alkyl group of 1 to 5 carbon atoms, and specific examples thereof include a methyl group, an ethyl group, a propyl group, an isopropyl group, an n-butyl group, an isobutyl group, a tert-butyl group, a pentyl group, an isopentyl group and a neopentyl group.

The fluorinated alkyl group for $R^{f1}$ and $R^{f2}$ is preferably a group in which part or all of the hydrogen atoms within the aforementioned alkyl group for $R^{f1}$ and $R^{f2}$ have been substituted with a fluorine atom.

In the present invention, $R^{f1}$ and $R^{f2}$ is preferably a fluorine atom.

In formula (c0-2-0), n represents an integer of 1 to 8, preferably an integer of 1 to 4, and more preferably 1 or 2.

In formula (c0-2-0), $M^{m+}$ represents a countercation, and m represents an integer of 1 to 3.

Examples of the countercation for $M^{m+}$ include a metal cation and an onium cation.

Examples of the metal ion for $M^{m+}$ include alkali metal ions such as sodium, potassium and lithium; alkaline earth metal ions such as magnesium and calcium; an iron ion; and an aluminum ion. Among these examples, in terms of ease in ion exchange to a sulfonate, a sodium ion, a potassium ion or a lithium ion is preferable.

Examples of the onium cation for $M^{m+}$ include a sulfonium cation, an iodonium cation, a phosphonium cation, a diazonium cation, an ammonium cation and a pyridinium cation. Among these, a cation moiety which is the same as those of an onium salt represented by the aforementioned general formula (b-1) or (b-2) is preferable.

Specific examples of the group represented by formula (c0-1-0) or (c0-2-0) are shown below.

[Chemical Formula 48.]

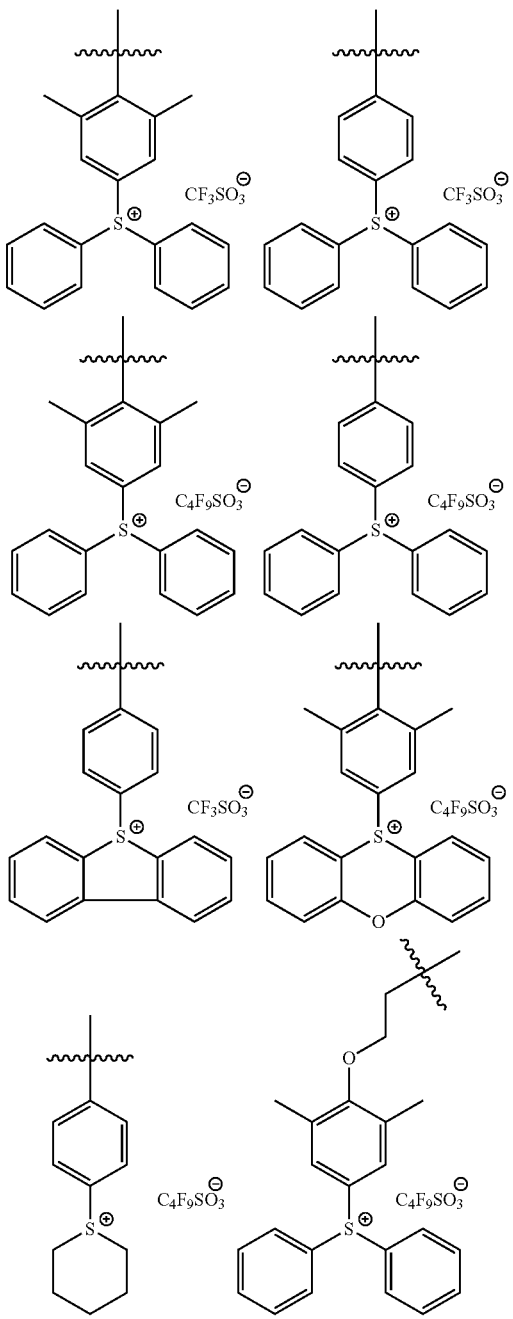

-continued

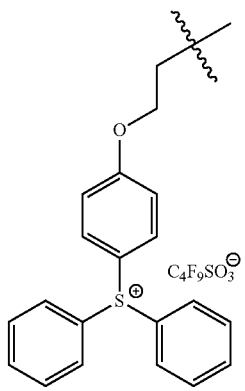

[Chemcial Formula 49.]

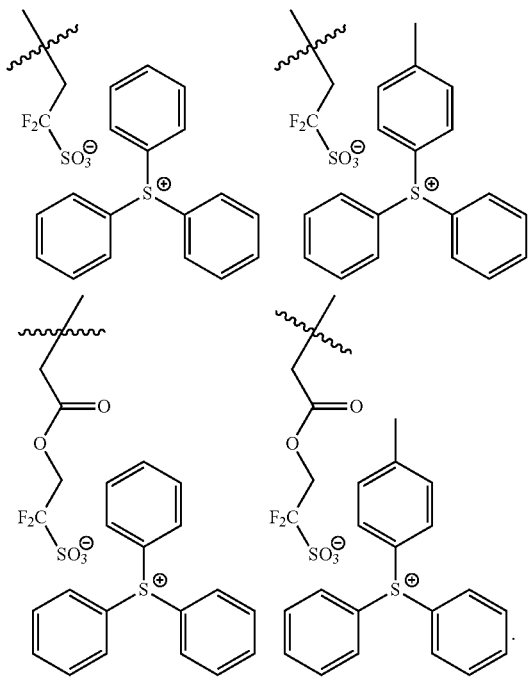

In the present invention, the structural unit (c0) is preferably a structural unit (c0-1) represented by general formula (c0-1) shown below or a structural unit (c0-2) represented by general formula (c0-2) shown below.

[Chemical Formula 50.]

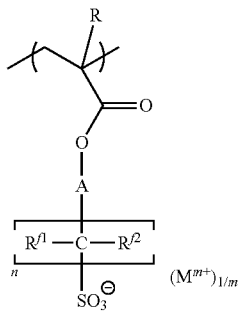

(c0-1)

-continued (c0-2)

In the formulas, R represents a hydrogen atom, an alkyl group of 1 to 5 carbon atoms or a halogenated alkyl group of 1 to 5 carbon atoms; A represents a single bond or a divalent linking group; $R^4$ represents an arylene group which may have a substituent; each of $R^5$ and $R^6$ independently represents an organic group, wherein $R^5$ and $R^6$ may be mutually bonded to form a ring with the sulfur atom; $X^-$ represents a counteranion; each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group; n represents an integer of 1 to 8; $M^{m+}$ represents a countercation; and m represents an integer of 1 to 3.

In formulas (c0-1) and (c0-2), R is the same as defined above, and is preferably a hydrogen atom or a methyl group.

In formulas (c0-1) and (c0-2), A, $R^4$, $R^5$, $R^6$, $X^-$, $R^{f1}$, $R^{f2}$, n, $M^{m+}$ and m are respectively the same as defined for A, $R^4$, $R^5$, $R^6$, $X^-$, $R^{f1}$, $R^{f2}$, n, $M^{m+}$ and m in the aforementioned formulas (c0-1-0) and (c0-2-0).

In the component (C'), as the structural unit (c0), one type of structural unit may be used alone, or two or more types of structural units may be used in combination.

In the component (C'), the amount of the structural unit (c0) based on the combined total of all structural units constituting the component (C') is preferably 1 to 50 mol %, more preferably 1 to 40 mol %, and still more preferably 3 to 30 mol %. When the amount of the structural unit (c0) is within the above-mentioned range, the effects of the present invention are improved.

(Structural Unit (c1))

In the fluorine-containing polymeric compound (C'), the structural unit (c1) is a structural unit which does not fall under the category of the aforementioned structural unit (c0) and is expressed by the aforementioned formula (c1).

In formula (c1), R is the same as defined above, and is preferably a hydrogen atom or a methyl group.

In formula (c1), $Q^0$ represents a single bond or a divalent linking group.

Preferable examples of the divalent linking group for $Q^0$ include a hydrocarbon group which may have a substituent, and a group containing a hetero atom. The divalent linking group for $Q^0$ is preferably a divalent organic group which does not have an acid dissociable portion. Examples of the hydrocarbon group which may have a substituent and the group containing a hetero atom include the same groups as those described above for $R^2$ in the aforementioned formula (a0-1). Among these, as $Q^0$, a single bond or a group containing a hetero atom is preferable, and a single bond or a combination of the "at least one" of the aforementioned group with the aforementioned aliphatic hydrocarbon group is particularly desirable.

In general formula (c1), $R^O$ represents an organic group which may have a fluorine atom, provided that, when $R^O$ has no fluorine atom, $Q^O$ has a fluorine atom.

An "organic group having a fluorine atom" refers to an organic group in which part or all of the hydrogen atoms have been substituted with a fluorine atom.

As an example of an organic group represented by $R^O$ which may have a fluorine atom, a hydrocarbon group which may have a fluorine atom can be given.

The hydrocarbon group which may have a fluorine atom may be linear, branched or cyclic.

$R^O$ preferably has 1 to 20 carbon atoms, more preferably 1 to 15 carbon atoms, and most preferably 1 to 10 carbon atoms.

It is preferable that the organic group having a fluorine atom represented by $R^O$ has 25% or more of the hydrogen atoms within the organic group fluorinated, more preferably 50% or more, and most preferably 60% or more, as the hydrophobicity of the resist film during immersion exposure is enhanced.

Preferable examples of $R^O$ include an acid dissociable group, a base dissociable group, and a group other than acid dissociable groups and base dissociable groups.

An acid dissociable group is a group that is dissociated by an acid to increase solubility in an alkali developing solution. When the acid dissociable group contains no fluorine atom, $Q^O$ has a fluorine atom.

A base dissociable group refers to a group that is decomposable (—O—$R^O$ is dissociated) by the action of an alkali developing solution. The expression "decomposable in an alkali developing solution" means that the group is decomposable by the action of an alkali developing solution (preferably decomposable by action of a 2.38% by weight aqueous solution of tetramethylammonium hydroxide (TMAH) at 23° C.), and exhibits increased alkali solubility in the alkali developing solution. The reason for this is that the ester bond [—C(=O)—O—$R^O$] is decomposed (hydrolyzed) by the action of a base (alkali developing solution), thereby forming a hydrophilic group [—C(=O)—OH](—O—$R^O$ is dissociated).

Preferable examples of the base dissociable group include fluorinated hydrocarbon groups which may or may not have a substituent. Among fluorinated hydrocarbon groups, a fluorinated, saturated hydrocarbon group or a fluorinated, unsaturated hydrocarbon group is preferable, and a fluorinated, saturated hydrocarbon group is particularly desirable.

$R^O$ may be linear, branched or cyclic, and is preferably linear or branched.

Further, $R^O$ preferably has 1 to 20 carbon atoms, more preferably 1 to 15, still more preferably 1 to 10, and most preferably 1 to 5.

It is preferable that the organic group having a fluorine atom represented by $R^O$ has 25% or more of the hydrogen atoms within the organic group fluorinated, more preferably 50% or more, and most preferably 60% or more, as the hydrophobicity of the resist film during immersion exposure is enhanced.

Examples of the group other than acid dissociable groups and base dissociable groups include linear, branched or cyclic alkyl groups of 3 to 15 carbon atoms (excluding groups containing a tertiary carbon atom). In such a case, $Q^O$ has a fluorine atom.

(Acid Dissociable Group)

The acid dissociable group for $R^O$ is not particularly limited as long as it is an organic group that is dissociable by the action of an acid, and examples thereof include a cyclic or chain-like tertiary alkyl ester-type acid dissociable group; and an acetal-type acid dissociable group, such as an alkoxyalkyl group. Among these, $R^O$ is preferably a tertiary alkyl ester-type acid dissociable group, and more preferably a structural unit represented by general formula (IV-1) shown below.

[Chemical Formula 51.]

(IV-1)

In formula (IV-1), at least one of $R^{201}$ represents a linear or branched alkyl group of 1 to 4 carbon atoms, and the or each remaining $R^{201}$ independently represents a linear or branched alkyl group of 1 to 4 carbon atoms or a monovalent aliphatic cyclic group of 4 to 20 carbon atoms, or the or each remaining $R^{201}$ may be mutually bonded to form a divalent aliphatic cyclic group of 4 to 20 carbon atoms together with the carbon atoms bonding each other; and the plurality of $R^{201}$ may be the same or different from each other.

As the aliphatic cyclic group for $R^{201}$ in general formula (IV-1), for example, a group in which one or more hydrogen atoms have been removed from a monocycloalkane or a polycycloalkane such as a bicycloalkane, a tricycloalkane or a tetracycloalkane can be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Specific examples of such groups include a cyclopentyl group, a cyclohexyl group, a norbornyl group and an adamantyl group.

Examples of linear or branched alkyl groups of 1 to 4 carbon atoms include a methyl group, an ethyl group, a propyl group, an isopropyl group, an n-butyl group, an isobutyl group and a tert-butyl group.

Examples of the acid dissociable group represented by general formula (IV-1) in which a plurality of $R^{201}$ each independently represents a linear or branched alkyl group of 1 to 4 carbon atoms include a tert-butyl group, a tert-pentyl group and a tert-hexyl group.

Examples of the acid dissociable group represented by general formula (IV-1) in which at least one of $R^{201}$ represents a linear or branched alkyl group of 1 to 4 carbon atoms, and the or each remaining $R^{201}$ independently represents a linear or branched alkyl group of 1 to 4 carbon atoms or a monovalent aliphatic cyclic group of 4 to 20 carbon atoms include a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, and a 1-(1-cyclohexyl)-1-methylpentyl group.

Examples of the acid dissociable group represented by general formula (IV-1) in which one $R^{201}$ group among the plurality of $R^{201}$ groups represents a linear or branched alkyl group of 1 to 4 carbon atoms, and the remaining two $R^{201}$ groups are mutually bonded to form a divalent aliphatic cyclic group of 4 to 20 carbon atoms together with the carbon atoms bonding each other include a 2-alkyl-2-adamantyl group such as a 2-methyl-2-adamantyl group or a 2-ethyl-2-adamantyl group, and a 1-alkyl-1-cycloalkyl group such as a 1-methyl-1-cyclopentyl group, a 1-ethyl-1-cyclopentyl group, a 1-methyl-1-cyclohexyl group, or a 1-ethyl-1-cyclohexyl group.

Among these examples, as the acid dissociable group represented by general formula (IV-1), a group in which one $R^{201}$ group among the plurality of $R^{201}$ groups represents a linear or branched alkyl group of 1 to 4 carbon atoms, and two of the $R^{201}$ groups are mutually bonded to form a divalent aliphatic cyclic group of 4 to 20 carbon atoms together with the carbon atoms bonding each other is preferable, and a 2-methyl-2-adamantyl group is particularly desirable.

Each $R^{201}$ group may have a substituent as long as the group represented by general formula (IV-1) functions as an acid dissociable group. As an example of the substituent, a halogen atom such as a fluorine atom can be given.

Specific examples of preferable units for the structural unit (c1) are shown below.

Hereinbelow, a structural unit in which $R^0$ in general formula (c1) represents a "base dissociable group" is referred to as a structural unit (c11), and a structural unit in which $R^0$ represents an acid dissociable group is referred to as a structural unit (c12).

(Structural Unit (c11))

Specific examples of preferable structural units for the structural unit (c11) include structural units which do not fall under the category of the structural unit (c0) and are represented by general formula (c11-1) or (c11-2) shown below.

[Chemical Formula 52.]

(c11-1)

(c11-2)

In the formulas above, each R independently represents a hydrogen atom, an alkyl group of 1 to 5 carbon atoms or a halogenated alkyl group of 1 to 5 carbon atoms; X represents a divalent organic group; $A_{aryl}$ represents an aromatic cyclic group which may have a substituent; $X_{01}$ represents a single bond or a divalent linking group; and each $R^{21}$ independently represents a base dissociable group, provided that, when $R^{21}$ has no fluorine atom, X has a fluorine atom in formula (c11-1) and $A_{aryl}$ or $X_{01}$ has a fluorine atom in formula (c11-2).

In formula (c11-1) and (c11-2), R is the same as defined above.

In formula (c11-1), the divalent linking group for X is the same as defined for the divalent linking group represented by $Q^0$ in the aforementioned formula (c1).

In general formula (c11-2), $A_{aryl}$ represents an aromatic cyclic group which may have a substituent. A specific example of $A_{aryl}$ includes an aromatic hydrocarbon ring (which may have a substituent) having two hydrogen atoms removed therefrom.

The ring skeleton of the aromatic cyclic group for $A_{aryl}$ preferably has 6 to 15 carbon atoms. Examples of the ring skeleton include a benzene ring, a naphthalene ring, a phenanthrene ring and an anthracene ring. Among these, a benzene ring or a naphthalene ring is particularly desirable.

Examples of substituents for the aromatic cyclic group represented by $A_{aryl}$ include a halogen atom, an alkyl group, an alkoxy group, a halogenated alkyl group of 1 to 5 carbon atoms, and an oxygen atom (=O). Examples of the halogen atom include a fluorine atom, a chlorine atom, an iodine atom and a bromine atom. As the substituent for the aromatic cyclic group represented by $A_{aryl}$, a fluorine atom is preferable.

$A_{aryl}$ may be either an aromatic cyclic group having no substituent, or an aromatic cyclic group having a substituent, although an aromatic cyclic group having no substituent is preferable.

When $A_{aryl}$ represents an aromatic cyclic group having a substituent, the number of the substituent may be 1 or more, preferably 1 or 2, and more preferably 1.

In formula (c11-2), the divalent linking group for $X_{01}$ is the same as defined for the divalent linking group represented by $Q^0$ in the aforementioned formula (c1).

In formulae (c11-1) and (c11-2), the base dissociable group represented by $R^{21}$ is the same as defined for the base dissociable group represented by $R^0$ in formula (c1) described above, more preferably an alkyl group of 1 or 2 carbon atoms or a fluorinated alkyl group of 1 to 5 carbon atoms, and most preferably a methyl group, $-CH_2-CF_3$, $-CH_2-CF_2-CF_3$, $-CH(CF_3)_2$ or $-CH_2-CH_2-CF_2-CF_2-CF_2-CF_3$. When $R^{21}$ represents a methyl group, an ethyl group or a fluorinated hydrocarbon group, the $-O-R^{21}$ group in the formula is a base dissociable group which is dissociable by the action of an alkali developing solution.

Preferable examples of the structural unit (c11) include structural units represented by general formulas (c11-1-1) to (c11-1-5) or (c11-2-1) to (c11-2-4) shown below.

[Chemical Formula 53.]

(c11-1-1)

(c11-1-2)

[Chemical Formula 54.]
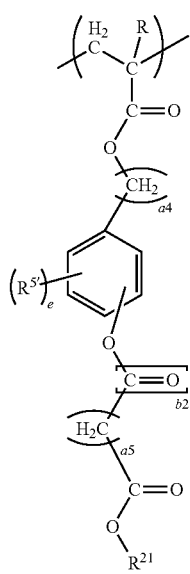 (c11-1-3)
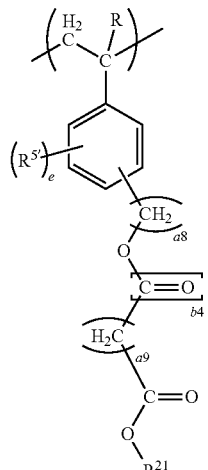 (c11-2-1)
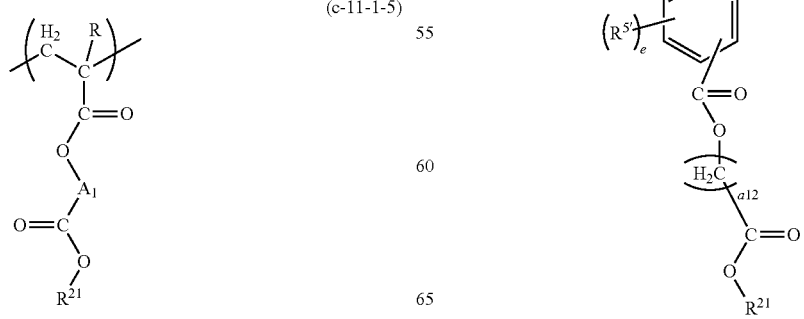

(c11-2-4)

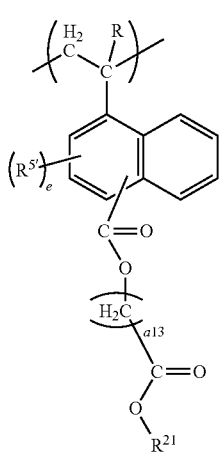

In general formulae (c1-11) to (c1-15) and (c1-21) to (c1-24), R and $R^{21}$ are the same as defined above; each of $R^{51}$ and $R^{52}$ independently represents a hydrogen atom, a halogen atom, an alkyl group of 1 to 5 carbon atoms or a halogenated alkyl group of 1 to 5 carbon atoms, wherein the plurality of $R^{51}$ or $R^{52}$ may be the same or different from each other; each of a1, a2, a5, a7, a9 and a11 to a13 independently represents an integer of 1 to 5; each of a4, a6, a8 and a10 independently represents 0 or an integer of 1 to 5; each of b1 to b5 independently represents 0 or 1; $R^{5\prime}$ represents a substituent; e represents an integer of 0 to 2; and $A_1$ represents a cyclic alkylene group of 4 to 20 carbon atoms.

In general formula (c11-1-1), examples of the halogen atom for $R^{51}$ and $R^{52}$ include a fluorine atom, a chlorine atom, a bromine atom and an iodine atom, and a fluorine atom is particularly desirable. Examples of the alkyl group of 1 to 5 carbon atoms for $R^{51}$ and $R^{52}$ include the same alkyl group of 1 to 5 carbon atoms for R defined above, and a methyl group or an ethyl group is preferable. Specific examples of the halogenated alkyl group of 1 to 5 carbon atoms represented by $R^{51}$ or $R^{52}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable.

In the present invention, $R^{51}$ and $R^{52}$ is preferably a hydrogen atom, a fluorine atom or an alkyl group of 1 to 5 carbon atoms, and more preferably a hydrogen atom, a fluorine atom, a methyl group or an ethyl group.

In general formula (c11-1-1), a1 is preferably 1 to 3, more preferably 1 or 2.

In general formula (c11-1-2), it is preferable that each of a2 and a3 independently represent 1 to 3, more preferably 1 or 2. b1 represents 0 or 1.

In general formula (c11-1-3), a4 is preferably 0 or 1 to 3, more preferably 0, 1 or 2, and most preferably 0 or 1. a5 is preferably 1 to 3, more preferably 1 or 2. Examples of the substituent represented by $R^{5\prime}$ include a halogen atom, an alkyl group of 1 to 5 carbon atoms, an alkoxy group of 1 to 5 carbon atoms, a halogenated alkyl group of 1 to 5 carbon atoms and an oxygen atom (=O). Examples of the halogen atom include a fluorine atom, a chlorine atom, an iodine atom and a bromine atom. e is preferably 0 or 1, and most preferably 0 from an industrial viewpoint. b2 is preferably 0.

In general formula (c11-1-4), a6 is preferably 0 or 1 to 3, more preferably 0, 1 or 2, and most preferably 0 or 1. a7 is preferably 1 to 3, more preferably 1 or 2. b3 is preferably 0. $R^{5\prime}$ and e are the same as defined above.

In general formula (c11-1-5), $A_1$ represents a cyclic alkylene group of 4 to 20 carbon atoms, preferably a cyclic alkylene group of 5 to 15 carbon atoms, and more preferably a cyclic alkylene group of 6 to 12 carbon atoms. Specific examples include the aforementioned "cyclic aliphatic hydrocarbon groups" described above in relation to the aforementioned hydrocarbon group which may have a substituent.

In general formula (c11-2-1), a8 is preferably 0 or 1 to 3, more preferably 0, 1 or 2, and most preferably 0 or 1. a9 is preferably 1 to 3, more preferably 1 or 2. b4 is preferably 0. $R^{5\prime}$ and e are the same as defined above.

In general formula (c11-2-2), a10 is preferably 0 or 1 to 3, more preferably 0, 1 or 2, and most preferably 0 or 1. a11 is preferably 1 to 3, more preferably 1 or 2. b5 is preferably 0. $R^{5\prime}$ and e are the same as defined above.

In general formula (c11-2-3), a12 is preferably 1 to 3, more preferably 1 or 2. $R^{5\prime}$ and e are the same as defined above.

In general formula (c11-2-4), a13 is preferably 1 to 3, more preferably 1 or 2. $R^{5\prime}$ and e are the same as defined above.

Specific examples of structural units represented by the above general formulas (c11-1-1) to (c11-1-5) and (c11-2-1) to (c11-2-4) are shown below.

[Chemical Formula 55.]

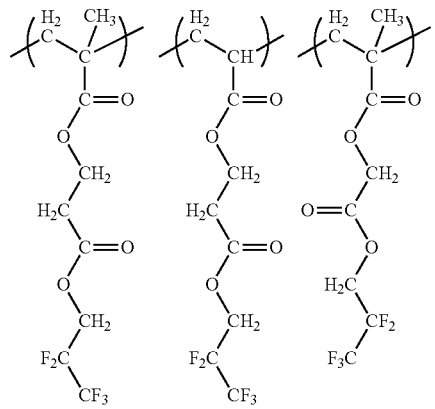

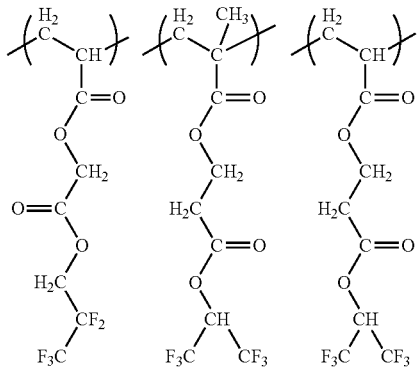

107
-continued
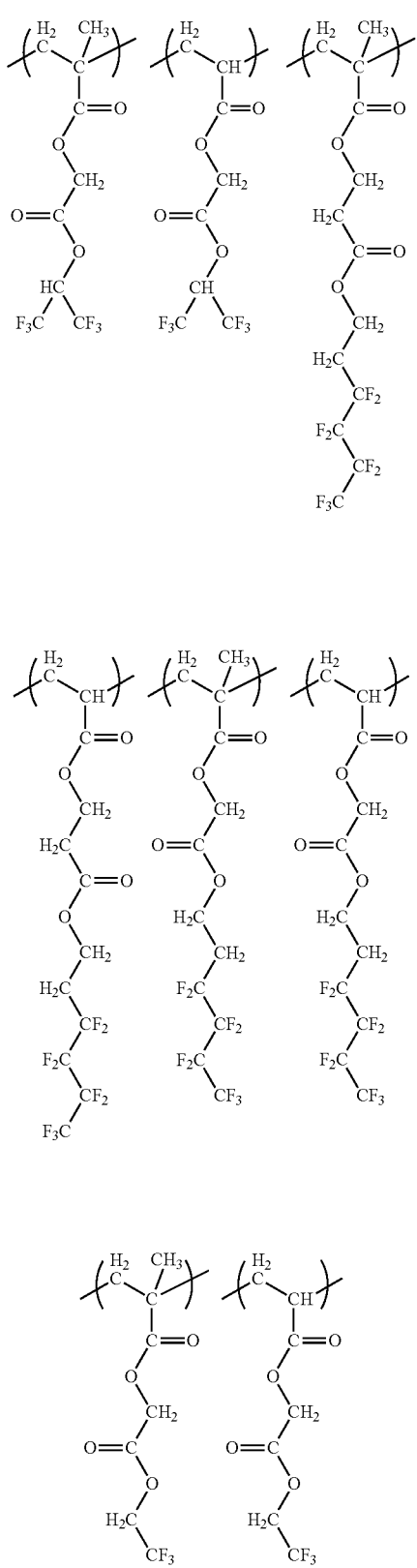
[Chemical Formula 56.]
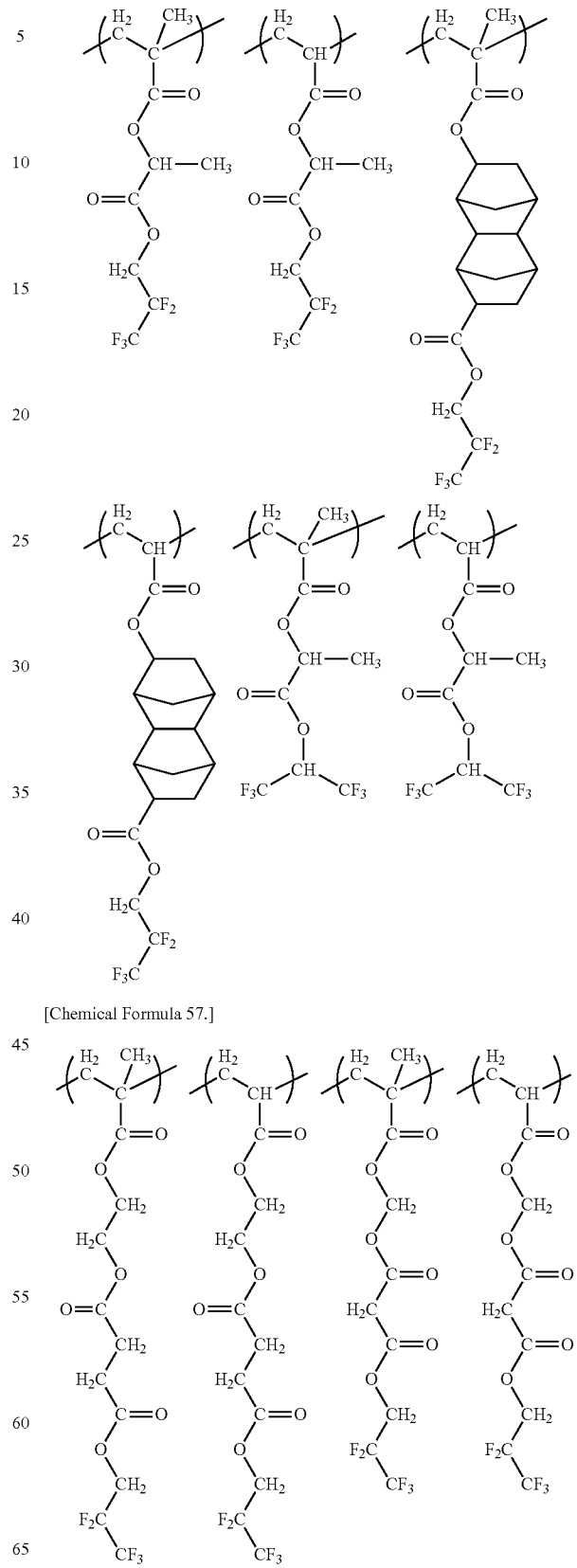
[Chemical Formula 57.]

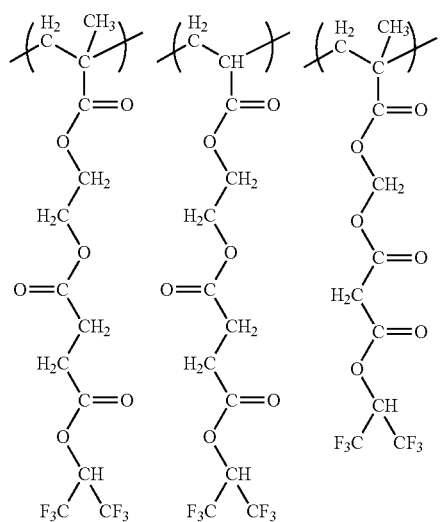
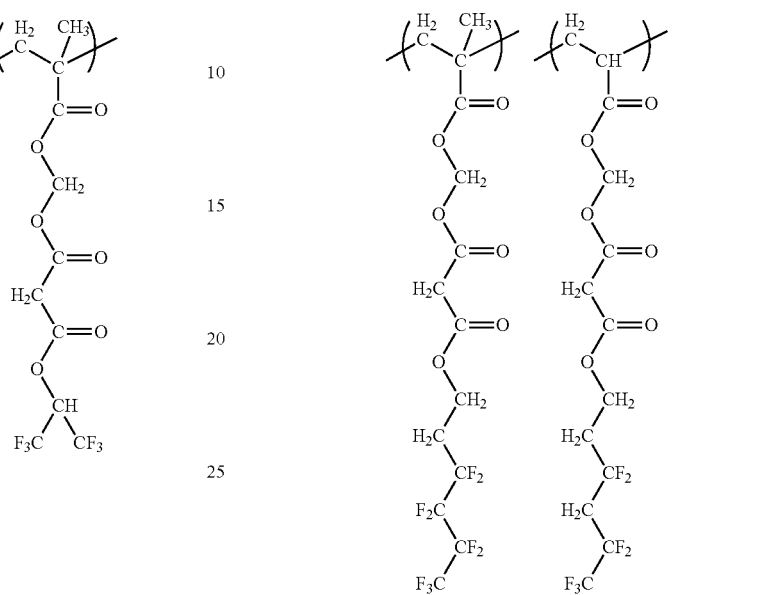
[Chemical Formula 58.]
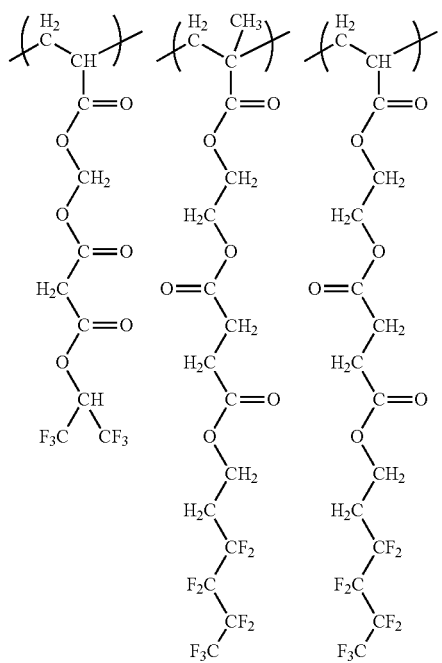
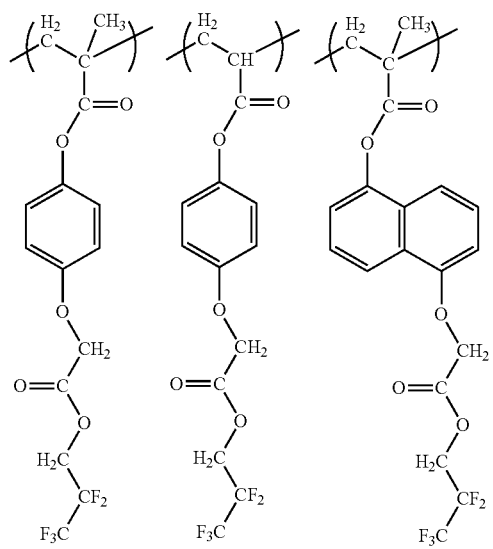

111
-continued
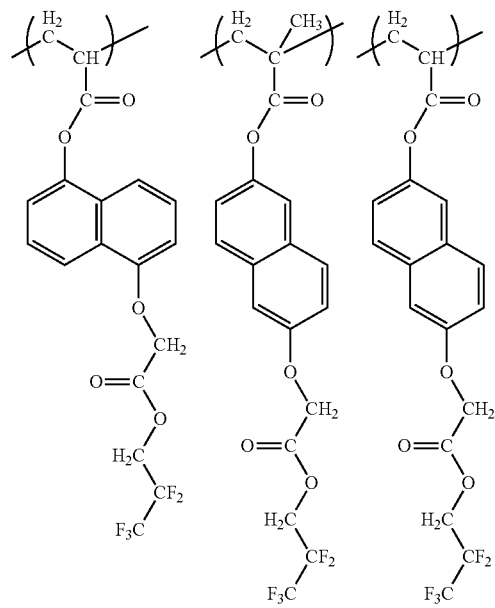
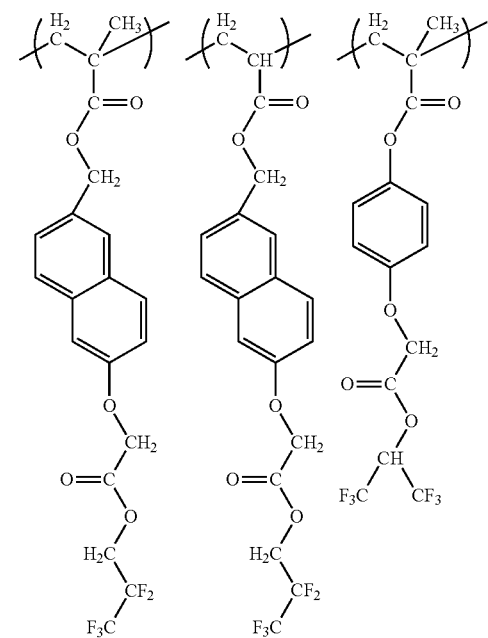
112
-continued
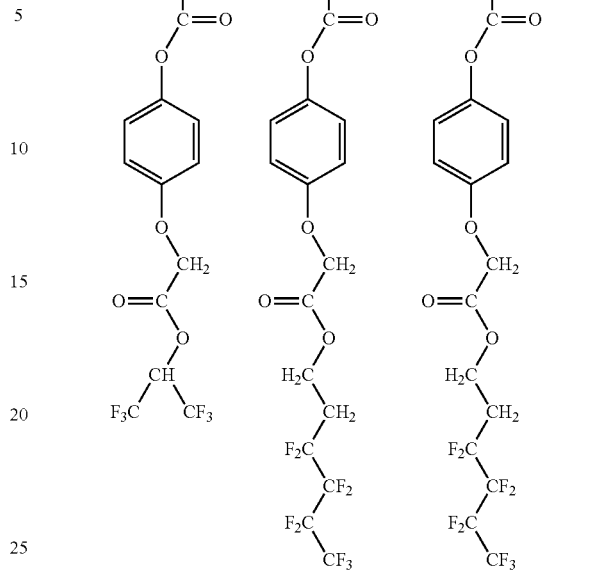
[Chemical Formula 59.]
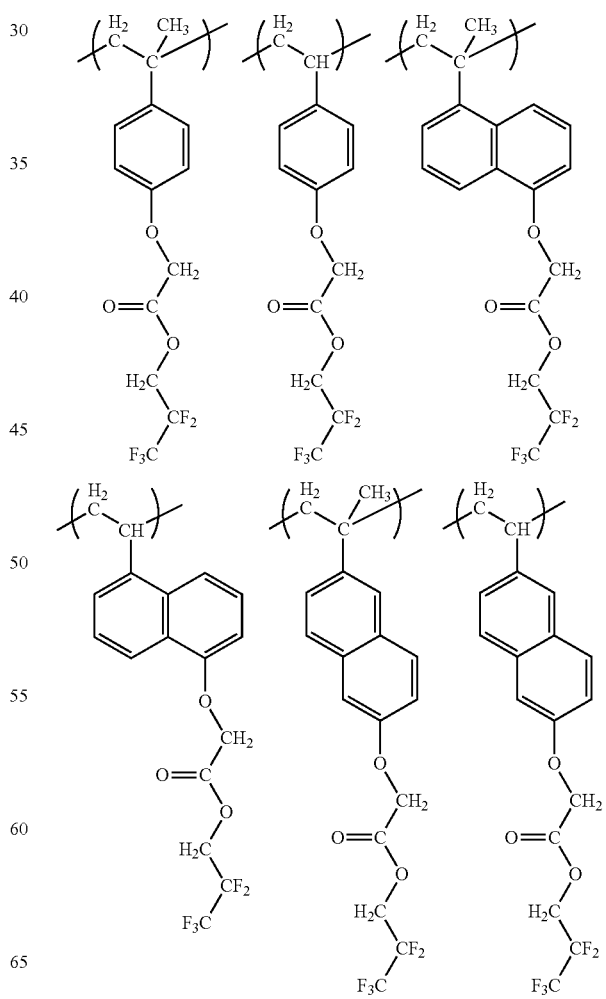

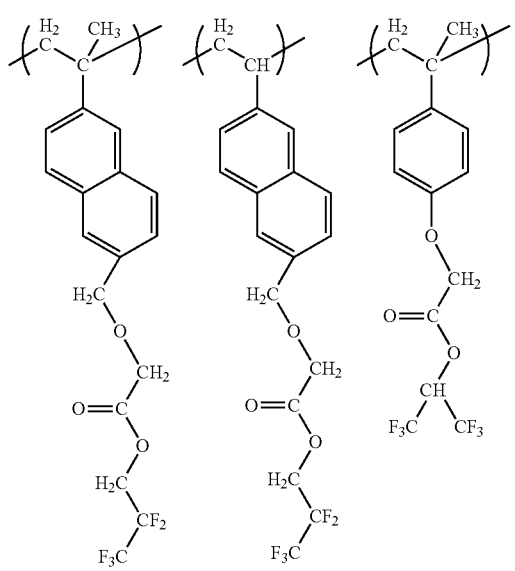

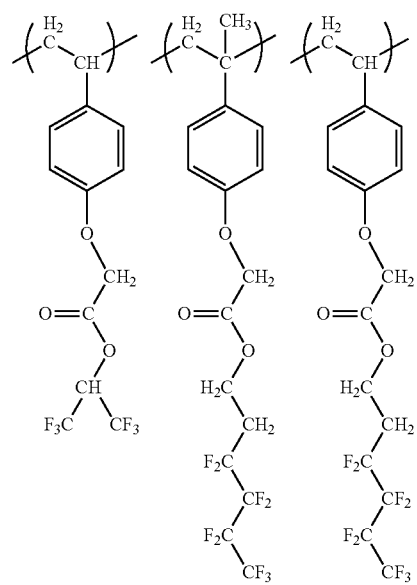

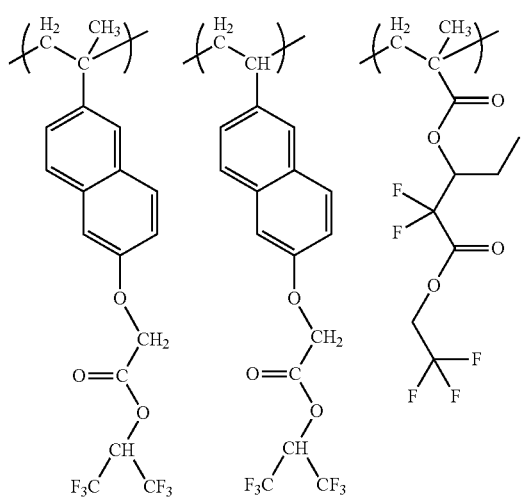

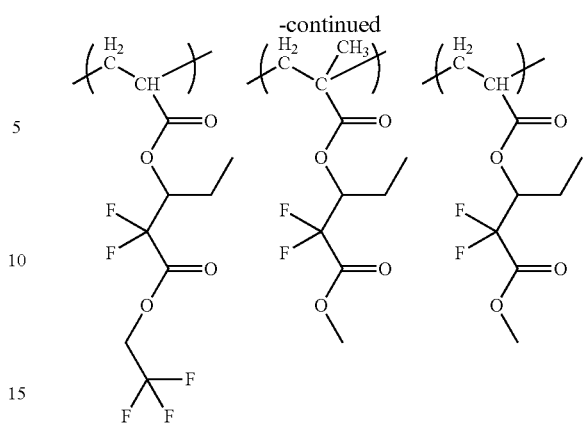

As the structural unit (c11), at least one structural unit selected from the group consisting of structural units represented by general formulas (c11-1-1) to (c11-1-5) and (c11-2-1) to (c11-2-4) is preferable, more preferably at least one structural unit selected from the group consisting of structural units represented by general formulas (c11-1-1) to (c11-1-5), (c11-2-1) and (c11-2-2), and most preferably at least one structural unit selected from the group consisting of structural units represented by general formulas (c11-1-1), (c11-1-5) and (c11-2-2).

As the structural unit (c11), one type of structural unit may be used alone, or two or more structural units may be used in combination.

When the component (C') includes the structural unit (c11), the amount of the structural unit (c11) based on the combined total of all structural units constituting the component (C') is preferably 10 to 95 mol %, more preferably 20 to 95 mol %, and most preferably 30 to 95 mol %. When the amount of the structural unit (c11) is at least as large as the lower limit of the above-mentioned range, in the formation of a resist pattern, the hydrophobicity during immersion exposure is enhanced. On the other hand, by when the amount is no more than the upper limit of the above-mentioned range, a good balance can be achieved with the other structural units.

(Structural Unit (c12))

Specific examples of preferable structural units for the structural unit (c12) include structural units represented by general formula (c12-1) shown below.

[Chemical Formula 60.]

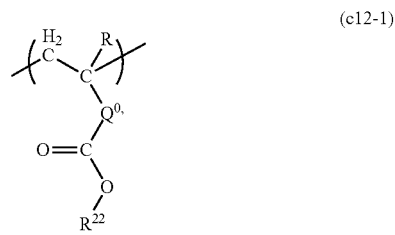

(c12-1)

In formula (c12-1), R represents a hydrogen atom, an alkyl group of 1 to 5 carbon atoms or a halogenated alkyl group of 1 to 5 carbon atoms; $Q^{0'}$ represents a single bond or a divalent linking group; and $R^{22}$ represents an acid dissociable group.

In general formula (c12-1), R is the same as defined above, and is preferably a hydrogen atom or a methyl group.

Examples of the acid dissociable group for $R^{22}$ include the same groups as those described above in the explanation of the acid dissociable group for $R^0$ in the aforementioned formula (c1).

Preferable examples of a structural unit represented by general formula (c12-1) in which $Q^{0'}$ is a single bond include structural units represented by general formulas (c12-1-1) to (c12-1-4) shown below.

In general formula (c12-1), when $Q^{0'}$ represents a divalent linking group, examples of the divalent linking group include the same groups as those described above for $X_{01}$ in general formula (c11-2), and a divalent aromatic hydrocarbon group. Examples of divalent aromatic hydrocarbon groups include aromatic hydrocarbon groups of 6 to 20 carbon atoms such as groups in which two hydrogen atoms have been removed from a benzene ring, a naphthalene ring or an anthracene ring.

In the structural unit (c12), $Q^{0'}$ is preferably a single bond or —C(=O)—O—$R^c$— (in the formula, $R^c$ represents a linear or branched alkylene group of 1 to 10 carbon atoms which may contain an oxygen atom, and the alkylene group may be fluorinated), and more preferably a single bond.

Preferable examples of a structural unit represented by general formula (c12-1) in which $Q^{0'}$ is —C(=O)—O—$R^c$— include structural units represented by general formulae (c12-1-5) to (c12-1-11) shown below.

In the formulae shown below, R is the same as defined above, and is preferably a hydrogen atom or a methyl group.

[Chemical Formula 61.]

(c12-1-1)

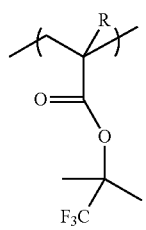

(c12-1-2)

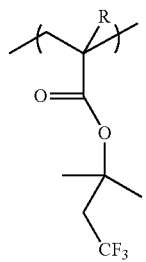

(c12-1-3)

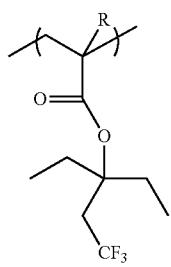

(c12-1-4)

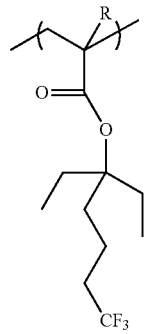

(c12-1-5)

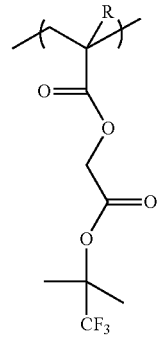

(c12-1-6)

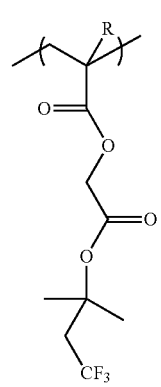

(c12-1-7)

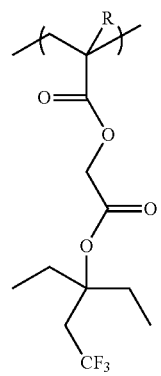

-continued (c12-1-8)
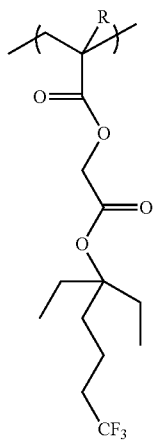

[Chemical Formula 62.]

(c12-1-9)
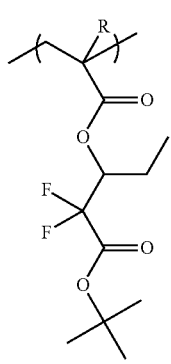

(c12-1-10)
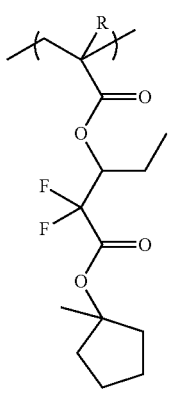

(c12-1-11)
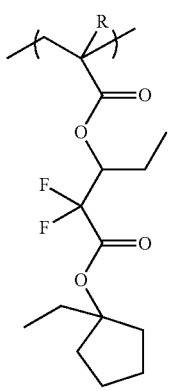

As the structural unit (c12), at least one structural unit selected from the group consisting of structural units represented by general formulae (c12-1-1) to (c12-1-11) is preferable, at least one structural unit selected from the group consisting of structural units represented by general formulae (c12-1-1) to (c12-1-8) is more preferable, and a structural unit represented by any one of general formulae (c12-1-1) to (c12-1-4) is particularly desirable.

In the component (C'), as the structural unit (c12), one type of structural unit may be used alone, or two or more types of structural units may be used in combination.

When the component (C') includes the structural unit (c12), the amount of the structural unit (c12) based on the combined total of all structural units constituting the component (C') is preferably 10 to 95 mol %, more preferably 20 to 90 mol %, and most preferably 30 to 90 mol %. When the amount of the structural unit (c12) is at least as large as the lower limit of the above-mentioned range, in the formation of a resist pattern, the hydrophobicity during immersion exposure is enhanced. Further, the lithographic properties are also improved. On the other hand, when the amount of the structural unit (c12) is no more than the upper limit of the above-mentioned range, a good balance can be achieved with the other structural units.

In the component (C'), as the structural unit (c1), one type of structural unit may be used alone, or two or more types of structural units may be used in combination.

When the component (C') includes the structural unit (c1), the amount of the structural unit (c1) based on the combined total of all structural units constituting the component (C') is preferably 10 to 90 mol %, more preferably 20 to 90 mol %, and most preferably 30 to 90 mol %. When the amount of the structural unit (c1) is at least as large as the lower limit of the above-mentioned range, the characteristic feature of exhibiting hydrophobicity during immersion exposure, but then exhibiting increased hydrophilicity during exposure and post exposure baking (PEB) is improved. Moreover, formation of bridge-type defects in a line and space pattern or formation of "Not Open" defects in which a portion of, or all of, a contact hole pattern is not open can be suppressed. Furthermore, the proportion of hydrocarbon groups within the component (F) increases and the water tracking ability during immersion exposure using a scanning-type immersion exposure apparatus is improved. On the other hand, when the amount of the structural unit (c1) is no more than the upper limit of the above-mentioned range, a good balance can be achieved with the structural unit (c0), and the effects of water repellency are improved.

(Other Structural Units)

In the present invention, the component (C') may include a structural unit (c2) represented by general formula (c2) shown below, as well as the aforementioned structural units (c0) and (c1).

[Chemical Formula 63.]

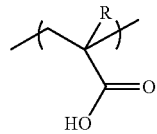

(c2)

In the formulas, R is the same as defined above.

When the component (C') includes the structural unit (c2), the amount of the structural unit (c2) based on the combined total of all structural units constituting the component (C') is preferably 1 to 30 mol %, more preferably 1 to 20 mol %, and most preferably 3 to 20 mol %.

The component (C') may include, in addition to the aforementioned structural units (c0), (c1) and (c2), a structural unit other than the structural units (c0), (c1) and (c2) (hereafter, frequently referred to as "structural unit (c3)"), as long as the effects of the present invention are not impaired.

There are no particular limitations on the structural unit (c3), provided the structural unit is derived from a compound that is copolymerizable with the compounds from which the structural units (c0), (c1) and (c2) are derived. Examples of such structural units include structural units which have been proposed for the base resin of a conventional chemically amplified resist. Specific examples include the aforementioned structural units (a1) to (a4) which do not fall under the category of the aforementioned structural units (c0), (c1) and (c2). The aforementioned structural unit (a1) is preferable, and a structural unit represented by the aforementioned formula (a1-1-02) is more preferable.

In the component (C'), as the structural unit (c3), one type of structural unit may be used alone, or two or more types of structural units may be used in combination.

When the component (C') includes the structural unit (c3), the amount of the structural unit (c3) based on the combined total of all structural units constituting the component (C') is preferably 1 to 40 mol %, more preferably 5 to 35 mol %, and most preferably 10 to 30 mol %.

In the present invention, the component (C') is a copolymer including the structural units (c0) and (c1).

Examples of such copolymers include a copolymer consisting of the structural units (c0) and (c1); a copolymer consisting of the structural units (c0), (c1) and (c3); a copolymer consisting of the structural units (c0), (c1) and (c2); and a copolymer consisting of the structural units (c0), (c1), (c2) and (c3).

In the present invention, as the component (C'), a copolymer that includes a combination of structural units represented by any one of general formulas (C'-1) to (C'-5) shown below is particularly desirable. In the formulae, R, A, $R^4$ to $R^6$, $X^-$, $R^{51}$, $R^{52}$, a1, $R^{21}$, $Q^{0\prime}$, $R^{22}$, $R^{f1}$, $R^{f2}$, n, $M^{m+}$, m, $R^{12}$ and h are the same as defined above, and the plurality of R may be the same or different from each other.

[Chemical Formula 64.]

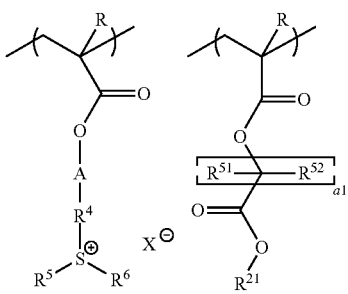
(C'-1)

[Chemical Formula 65.]

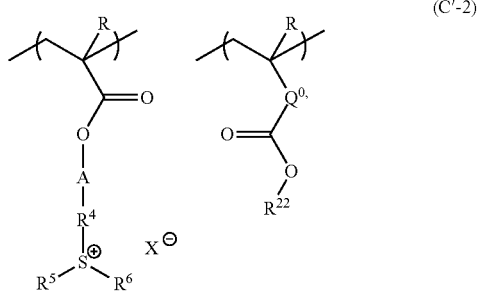
(C'-2)

[Chemical Formula 66.]

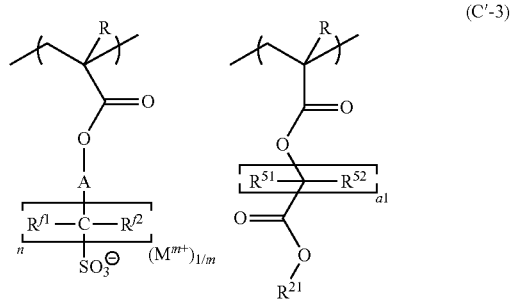
(C'-3)

[Chemical Formula 67.]

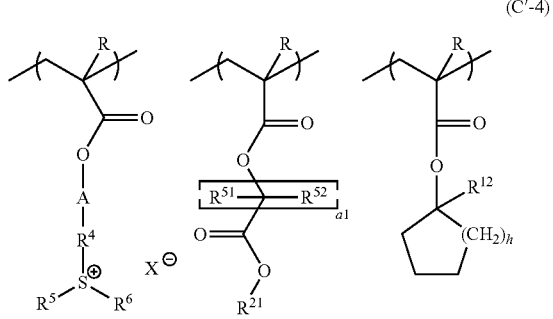
(C'-4)

[Chemical Formula 68.]

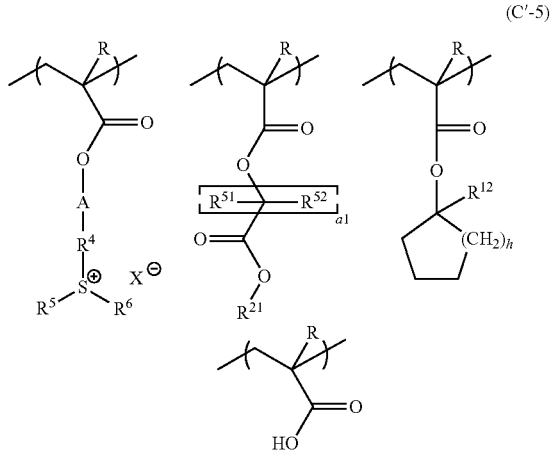
(C'-5)

The weight average molecular weight (Mw) (the polystyrene equivalent value determined by gel permeation chromatography) of the component (C') is not particularly limited, but is preferably 2,000 to 50,000, more preferably 3,000 to 40,000, and most preferably 4,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is preferably 1.0 to 5.0, more preferably 1.0 to 4.0, and most preferably 1.2 to 3.0. Here, Mn is the number average molecular weight.

The thus explained component (C') can also be preferably used as an additive for a resist composition for immersion exposure.

In the resist composition of the present invention, as the component (C'), one type may be used, or two or more types of compounds may be used in combination.

In the resist composition of the present invention, the amount of the component (C') relative to 100 parts by weight of the component (A) is preferably 0.1 to 50 parts by weight, more preferably 0.1 to 40 parts by weight, still more preferably 0.5 to 30 parts by weight, and most preferably 0.5 to 15 parts by weight.

When the amount of the component (C') is at least as large as the lower limit of the above-mentioned range, the hydrophobicity of a resist film formed using the resist composition is enhanced, and a resist film exhibiting a suitable hydrophobicity for immersion exposure can be formed. Further, the hydrophilicity of the resist film is enhanced when the resist film comes in contact with an alkali developing solution. On the other hand, when the amount of the component (C') is no more than the upper limit of the above-mentioned range, the lithography properties are improved.

The component (C') can be obtained, for example, by a conventional radical polymerization or the like of the monomers corresponding with each of the structural units, using a radical polymerization initiator such as azobisisobutyronitrile (AIBN).

As the monomers for deriving the corresponding structural units, commercially available monomers may be used, or the monomers may be synthesized by a conventional method.

The structure of the compound obtained in the manner described above can be confirmed by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis and X-ray diffraction analysis.

<Optional Component—Component (D)>

The positive resist composition of the present invention may further contain a nitrogen-containing organic compound (D) (hereafter referred to as the component (D)) as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used, although an aliphatic amine, and particularly a secondary aliphatic amine or tertiary aliphatic amine is preferable. The term "aliphatic cyclic group" refers to a monocyclic group or polycyclic group that has no aromaticity. An aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, tri-n-octanolamine, stearyldiethanolamine and laurildiethanolamine. Among these, trialkylamines and/or alkylalcoholamines are preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of aromatic amines include aniline, pyridine, 4-dimethylaminopyridine, pyrrole, indole, pyrazole, imidazole and derivatives thereof, as well as diphenylamine, triphenylamine and tribenzylamine.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine and tris[2-{2-(2-hydroxyethoxy)ethoxy}ethyl]amine.

These compounds can be used either alone, or in combinations of two or more different compounds.

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

<Optional Component—Component (E)>

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, miscible additives other than those described above can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

<Optional Component—Component (S)>

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone;

ketones such as acetone, methyl ethyl ketone, cyclohexanone, methyl-n-pentyl ketone, methyl isopentyl ketone, and 2-heptanone;

polyhydric alcohols, such as ethylene glycol, diethylene glycol, propylene glycol and dipropylene glycol;

compounds having an ether bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable);

cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate;

and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME), ethyl lactate (EL) and cyclohexanone are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Alternatively, when cyclohexanone is mixed as the polar solvent, the PGMEA:cyclohexanone weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 2 to 15% by weight.

The resist composition of the present invention exhibits an excellent pattern shape. The reason for this has not been elucidated yet, but is presumed as follows. The component (C') within the resist composition of the present invention includes a structural unit (c1) having a fluorine atom. When the component (C') is mixed together with the base component (A) and the acid-generator component (B) and dissolved to form a resist film on a substrate, the component (C') is distributed close to the surface of the resist film. The component (C') distributed close to the surface of the resist film generates acid from the structural unit (c0) upon exposure, and the acid concentration on the resist film surface becomes high. As a result, the deprotection ratio on the resist film surface is improved, so that deterioration of the resist pattern shape (T-Top shape and the like) caused by insufficient deprotection on the film surface can be suppressed.

By the positive resist composition of the present invention, a resist film can be formed on a support such as a substrate with excellent adhesion. Further, the positive resist composition exhibits excellent lithography properties with respect to sensitivity, depth of focus (DOF), exposure margin (EL), and the like. Further, a resist pattern can be formed with excellent mask reproducibility (e.g., excellent mask error factor (MEF)), and the shape of the resist pattern (e.g., circularity of the holes of a hole pattern), in-plane uniformity of the pattern dimensions (CDU), line width roughness (LWR) and the like are improved. EL is the range of the exposure dose in which a resist pattern can be formed with a size within a predetermined range of variation from a target size, when exposure is conducted by changing the exposure dose, i.e., the range of the exposure dose in which a resist pattern faithful to the mask pattern can be formed. The larger the exposure margin, the smaller the variation in the pattern size depending on the change in the exposure dose, thereby resulting in favorable improvement in the process margin. DOF is the range of depth of focus in which a resist pattern having a predetermined size within the range corresponding to the target size can be formed when the exposure focus is moved upwardly or downwardly with the same exposure dose, i.e., the range in which a resist pattern faithful to the mask pattern can be obtained. Larger DOF is more preferable. LWR refers to the phenomenon in which the line widths of a line pattern formed using a resist composition becomes heterogeneous, and improvement in this characteristic becomes more important as the pattern becomes finer.

In the present invention, the reasons why the above-mentioned effects can be achieved have not been elucidated yet. However, one of the reasons is presumed that, by virtue of the structural unit (a0-1) having a cyclic group containing —$SO_2$— (which is a polar group) on the terminal of a relatively long side chain, the component (B) can be uniformly distributed, thereby resulting in the improvement in lithography properties.

Further, by the segregation of the acid generator, in addition to improvement in the pattern shape, it is also expected that generation of bridge defects (connection of patterns) in the formation of a line and space pattern can be reduced and generation of non-open defects in the formation of a hole pattern can be reduced.

Furthermore, by virtue of including a structural unit (c1) having a fluorine atom, the resist composition of the present invention exhibits a high hydrophobicity during immersion exposure. Therefore, when the resist composition of the present invention is used for immersion exposure, it exhibits an excellent water tracking ability which is required when immersion exposure is conducted using a scanning-type immersion exposure apparatus Moreover, when the structural unit (c1) is a structural unit (c11) containing a base dissociable group, the hydrophilicity is enhanced after alkali developing. Therefore, when the resist composition of the present invention is used for immersion exposure, it can effectively reduce defects during immersion exposure. More specifically, in liquid immersion lithography, when immersion exposure of a resist film is conducted, the solubility of the exposed portions in an alkali developing solution changes, and the solubility of the exposed portions in an alkali developing solution is enhanced. By conducting alkali developing, the exposed portions are removed, and a resist pattern is formed.

On the surface of the resist film at portions which were not irradiated with radial rays by immersion exposure (unexposed portions), defects (water mark defects, and the like) caused by the influence of the immersion medium such as water are likely to be generated following alkali developing. However, since the hydrophilicity of a resist film formed using the resist composition of the present invention is enhanced during alkali developing, generation of such defects can be reduced.

Further, when the resist composition of the present invention is used for immersion exposure, elution of a substance from the resist film during immersion exposure can be suppressed.

As described above, immersion exposure is a method in which exposure (immersion exposure) is conducted in a state where the region between the lens and the resist layer formed on a wafer (which was conventionally filled with air or an inert gas such as nitrogen) is filled with a solvent (a immersion medium) that has a larger refractive index than the refractive index of air. In immersion exposure, when the resist film comes into contact with the immersion medium, elution of substances within the resist film (component (B) and the like) into the immersion medium occurs. This elution of a substance causes phenomenon such as degeneration of the resist film and change in the refractive index of the immersion medium, thereby adversely affecting the lithography properties.

The amount of the eluted substance is affected by the properties of the resist film surface (e.g., hydrophilicity, hydrophobicity, and the like). Therefore, it is presumed that the amount of eluted substance can be reduced by enhancing the hydrophobicity of the resist film surface.

Since the resist composition of the present invention includes the component (C'), a resist film formed using the resist composition exhibits high hydrophobicity prior to conducting exposure and developing, as compared to a resist composition containing no component (C'). Thus, when the resist composition of the present invention is used for immersion exposure, elution of substance during immersion exposure can be suppressed. Since substance elution can be suppressed, by using the resist composition of the present invention, phenomena such as degeneration of the resist film and change in the refractive index of the immersion medium, which occur during immersion exposure, can be suppressed. Further, as variation in the refractive index of the immersion medium can be suppressed, a resist pattern having an excellent shape can be formed. Furthermore, the level of contamination of the lens within the exposure apparatus can be lowered. Therefore, there is no need for protection against these disadvantages, and hence, the present invention can contribute to simplifying the process and the exposure apparatus.

In addition, a resist film formed using the resist composition of the present invention hardly swells by water. Therefore, a very fine resist pattern can be formed with a high precision.

Also, the resist composition of the present invention exhibits excellent lithography properties with respect to sensitivity, resolution, etching resistance and the like, and is capable of forming a resist pattern without any practical problems when used as a resist for immersion exposure. For example, by using the resist composition of the present invention, a very fine resist pattern with a size of 100 nm or smaller can be formed.

<<Method of Forming a Resist Pattern>>

The method of forming a resist pattern according to the present invention includes: forming a resist film on a substrate using a resist composition of the present invention; conducting exposure of the resist film; and developing the resist film to form a resist pattern.

The method for forming a resist pattern according to the present invention can be performed, for example, as follows.

More specifically, the method for forming a resist pattern according to the present invention can be performed, for example, as follows. Firstly, a positive resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed with an ArF exposure apparatus, an electron beam exposure apparatus, an EUV exposure apparatus or the like through a mask pattern or directly irradiated with electron beam without a mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing.

In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) can be used.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

EXAMPLES

As follows is a description of examples of the present invention, although the scope of the present invention is by no way limited by these examples.

In the following examples, a unit represented by a chemical formula (I) is referred to as "compound (1)", and the same applies for compounds represented by other formulas.

In the NMR analysis, the internal standard for $^1$H-NMR and $^{13}$C-NMR was tetramethylsilane (TMS). The internal standard for $^{19}$F-NMR was hexafluorobenzene (provided that the peak of hexafluorobenzene was regarded as −160 ppm).

Monomer Synthesis Example 1

Synthesis of Compound (1a)

The compound (1a) used in the polymer synthesis examples described later was synthesized as follows.

300 ml of a THF solution containing 20 g (105.14 mmol) of an alcohol (1a), 30.23 g (157.71 mmol) of ethyldiisopropylaminocarbodiimide (EDCI) hydrochloride and 0.6 g (5 mmol) of dimethylaminopyridine (DMAP) was added to a 500 ml three-necked flask in a nitrogen atmosphere, and 16.67 g (115.66 mmol) of a precursor (1a) was added thereto while cooling with ice (0° C.), followed by stirring at room temperature for 12 hours.

After conducting thin-layer chromatography (TLC) to confirm that the raw materials had dissipated, 50 ml of water was added to stop the reaction. Then, the reaction solvent was concentrated under reduced pressure, and extraction was conducted with ethyl acetate three times. The obtained organic phase was washed with water, saturated sodium hydrogencarbonate and 1N—HClaq in this order. Thereafter, the solvent was distilled off under reduced pressure, and the resulting product was dried, thereby obtaining the compound (1a).

The results of instrumental analysis of the obtained compound (1a) were as follows.

$^1$H-NMR (CDCl$_3$, 400 MHz): δ (ppm)=6.22 (s, 1H, H$^a$), 5.70 (s, 1H, H$^b$), 4.71-4.85 (m, 2H, H$^{c,d}$), 4.67 (s, 2H, H$^k$), 3.40-3.60 (m, 2H, H$^{e,f}$), 2.58-2.70 (m, 1H, H$^g$), 2.11-2.21 (m, 2H, H$^h$), 2.00 (s, 3H, H$^i$), 1.76-2.09 (m, 2H$^j$).

[Chemical Formula 69.]

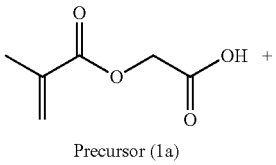

Precursor (1a)

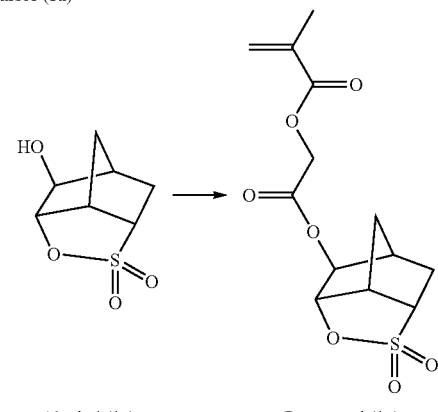

Alcohol (1a)　　　Compound (1a)

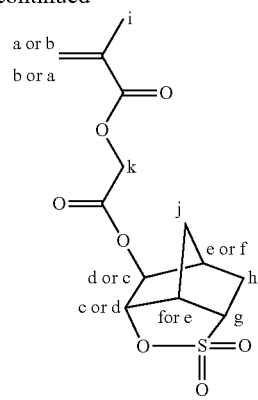

Polymer Synthesis Example 1

Synthesis of Polymeric Compound 1A

In a separable flask equipped with a thermometer, a reflux tube and a nitrogen feeding pipe, 35.00 g (110.76 mmol) of the compound (1a), 25.58 g (109.30 mmol) of a compound (2a) and 5.39 g (22.83 mmol) of a compound (3a) were dissolved in 83.95 g of methyl ethyl ketone (MEK) to obtain a solution. Then, 24.29 mmol of dimethyl 2,2'-azobis(isobutyrate) (V-601) was added and dissolved in the obtained solution. The resultant was dropwise added to 45.98 g of MEK heated to 78° C. in a nitrogen atmosphere over 6 hours. Thereafter, the reaction solution was heated for 1 hour while stirring, and then cooled to room temperature. The obtained reaction polymer solution was dropwise added to an excess amount of a methanol/water mixed solvent, and an operation to deposit a polymer was conducted. Thereafter, the precipitated white powder was separated by filtration, followed by washing with a methanol/water mixed solvent and drying, thereby obtaining 58 g of a polymeric compound 1A as an objective compound.

With respect to the polymeric compound 1A, the weight average molecular weight (Mw) and the dispersity (Mw/Mn) were determined by the polystyrene equivalent value as measured by gel permeation chromatography (GPC). As a result, it was found that the weight average molecular weight was 6,700, and the dispersity was 2.25. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m/n=50/40/10.

[Chemical Formula 70.]

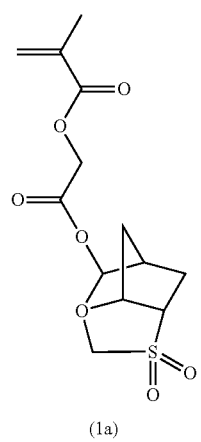

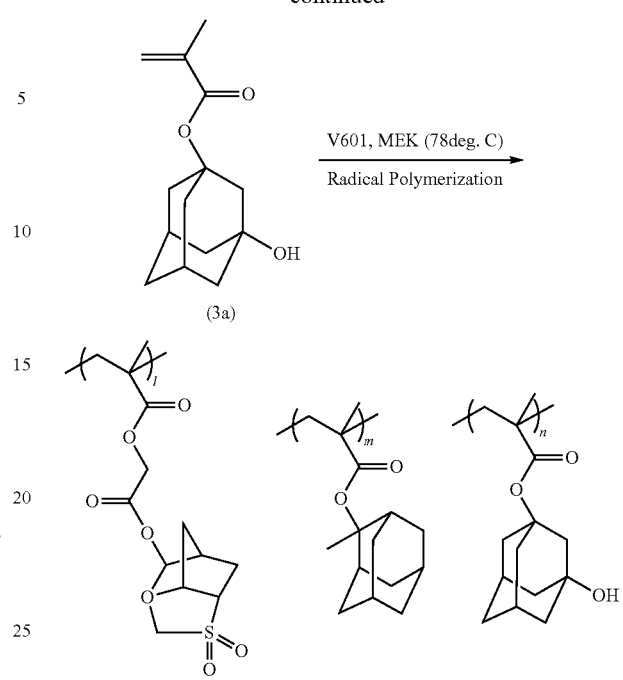

Polymeric compound 1A

Polymer Synthesis Example 2

Synthesis of Polymeric Compound 2A)

Polymeric compound 2A was synthesized in the same manner as in Polymer Synthesis Example 1, except that the compound (4a) shown below was used instead of the compound (1a) in an equimolar amount.

With respect to the polymeric compound 2A, the weight average molecular weight (Mw) and the dispersity (Mw/Mn) were determined by the polystyrene equivalent value as measured by gel permeation chromatography (GPC). As a result, it was found that the weight average molecular weight was 7,200, and the dispersity was 1.65. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m/n=50/40/10.

[Chemical Formula 71.]

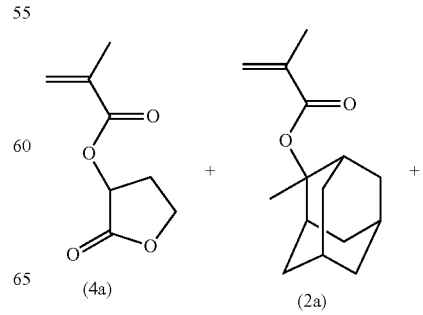

-continued

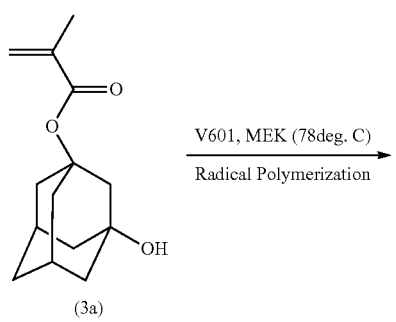

Polymer Synthesis Example 3

Synthesis of Polymeric Compound 1C)

In a three-necked flask equipped with a thermometer, a reflux tube and a nitrogen feeding pipe, 9.00 g (39.82 mmol) of a compound (1c) and 1.72 g (2.54 mmol) of a compound (2c) were dissolved in 25.00 g of methyl ethyl ketone (MEK) to obtain a solution. Then, 5.08 mmol of dimethyl 2,2'-azobis (isobutyrate) (V-601) was added and dissolved in the obtained solution.

The resulting reaction solution was heated at 80° C. while stirring for 6 hours, and then cooled to room temperature.

The obtained polymer reaction solution was washed with n-heptane, methanol, acetonitrile and MEK, followed by drying, thereby obtaining 5.7 g of a polymeric compound 1C as an objective compound.

With respect to the polymeric compound 1C, the weight average molecular weight (Mw) and the dispersity (Mw/Mn) were determined by the polystyrene equivalent value as measured by gel permeation chromatography (GPC). As a result, it was found that the weight average molecular weight was 17,200, and the dispersity was 1.69. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m=93.9/6.1.

[Chemical Formula 72.]

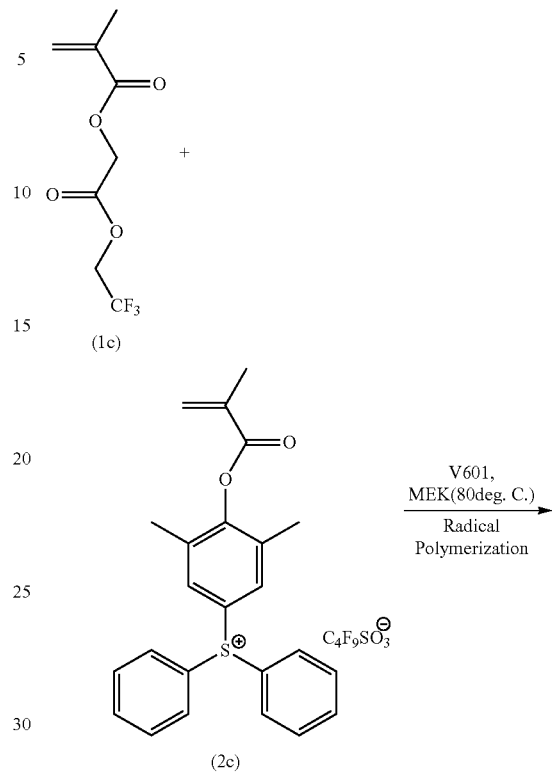

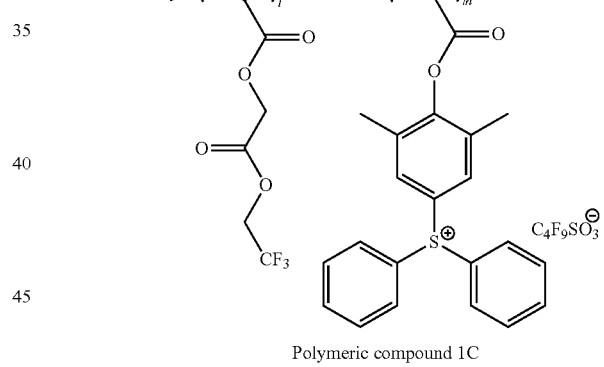

Polymer Synthesis Examples 4 to 13

Synthesis of Polymeric Compounds 2C to 11C

Polymeric compounds 2C to 11C were synthesized in the same manner as in Polymer Synthesis Example 3 (synthesis of polymeric compound 1C), except that the following monomers (1c) to (6c) which derived the structural units constituting each polymeric compound were used in predetermined molar ratio.

With respect to each polymeric compound, the weight average molecular weight and the dispersity (Mw/Mn) determined by the polystyrene equivalent value as measured by gel permeation chromatography (GPC) are shown in Table 1.

[Chemical Formula 73.]
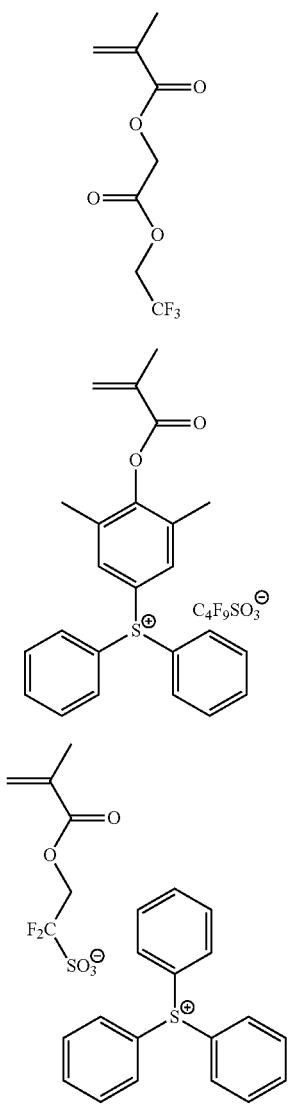
(1c)
(2c)
(3c)
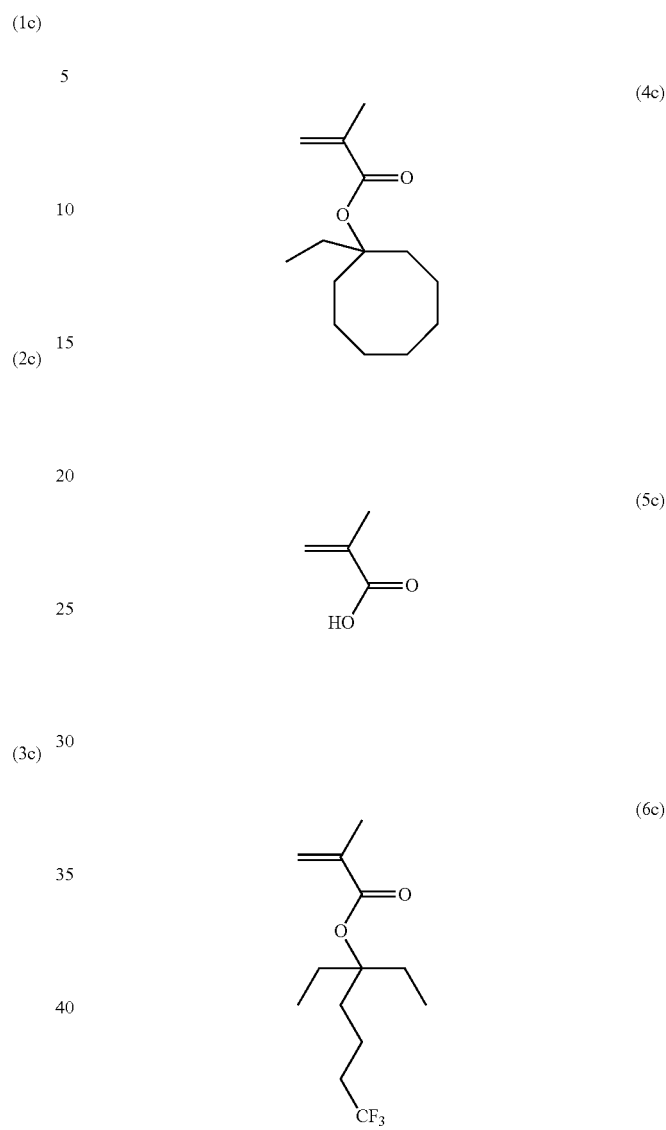
(4c)
(5c)
(6c)
TABLE 1
|  | (1c) | (2c) | (3c) | (4c) | (5c) | (6c) | Mw | Mw/Mn |
|---|---|---|---|---|---|---|---|---|
| Polymeric compound 2C | 89.9 | 10.1 | — | — | — | — | 16500 | 1.67 |
| Polymeric compound 3C | 79.5 | 20.5 | — | — | — | — | 16000 | 1.59 |
| Polymeric compound 4C | 89.4 | 10.6 | — | — | — | — | 15700 | 1.62 |
| Polymeric compound 5C | 74.7 | 9.2 | — | 16.1 | — | — | 25400 | 1.69 |
| Polymeric compound 6C | 63.3 | 13.5 | — | 15.4 | 7.8 | — | 15300 | 1.71 |
| Polymeric compound 7C | — | 10.2 | — | — | — | 89.8 | 16400 | 1.64 |
| Polymeric compound 8C | 90.1 | — | 9.9 | — | — | — | 14900 | 1.59 |
| Polymeric compound 9C | 100 | — | — | — | — | — | 32000 | 2.70 |
| Polymeric compound 10C | 78.3 | — | — | 21.7 | — | — | 25900 | 1.50 |
| Polymeric compound 11C | 77.0 | — | — | 17.8 | 5.2 | — | 13500 | 1.69 |

Examples 1 to 8, Comparative Examples 1 to 5

The components shown in Table 2 were mixed together and dissolved to obtain positive resist compositions.

TABLE 2

| | Component (A) | Component (B) | | Component (C) | Component (D) | Component (E) | Component (S) | |
|---|---|---|---|---|---|---|---|---|
| Ex. 1 | (A)-1 | (B)-1 | (B)-2 | (C)-1 | (D)-1 | (E)-1 | (S)-1 | (S)-2 |
| | [100] | [11.4] | [2.0] | [3.0] | [0.6] | [0.75] | [10] | [2400] |
| Ex. 2 | (A)-1 | (B)-1 | (B)-2 | (C)-2 | (D)-1 | (E)-1 | (S)-1 | (S)-2 |
| | [100] | [11.4] | [2.0] | [3.0] | [0.6] | [0.75] | [10] | [2400] |
| Ex. 3 | (A)-1 | (B)-1 | (B)-2 | (C)-3 | (D)-1 | (E)-1 | (S)-1 | (S)-2 |
| | [100] | [11.4] | [2.0] | [3.0] | [0.6] | [0.75] | [10] | [2400] |
| Ex. 4 | (A)-1 | (B)-1 | (B)-2 | (C)-4 | (D)-1 | (E)-1 | (S)-1 | (S)-2 |
| | [100] | [11.4] | [2.0] | [3.0] | [0.6] | [0.75] | [10] | [2400] |
| Ex. 5 | (A)-1 | (B)-1 | (B)-2 | (C)-5 | (D)-1 | (E)-1 | (S)-1 | (S)-2 |
| | [100] | [11.4] | [2.0] | [3.0] | [0.6] | [0.75] | [10] | [2400] |
| Ex. 6 | (A)-1 | (B)-1 | (B)-2 | (C)-6 | (D)-1 | (E)-1 | (S)-1 | (S)-2 |
| | [100] | [11.4] | [2.0] | [3.0] | [0.6] | [0.75] | [10] | [2400] |
| Ex. 7 | (A)-1 | (B)-1 | (B)-2 | (C)-7 | (D)-1 | (E)-1 | (S)-1 | (S)-2 |
| | [100] | [11.4] | [2.0] | [3.0] | [0.6] | [0.75] | [10] | [2400] |
| Ex. 8 | (A)-1 | (B)-1 | (B)-2 | (C)-8 | (D)-1 | (E)-1 | (S)-1 | (S)-2 |
| | [100] | [11.4] | [2.0] | [3.0] | [0.6] | [0.75] | [10] | [2400] |
| Comp. Ex. 1 | (A)-1 | (B)-1 | (B)-2 | (C)-9 | (D)-1 | (E)-1 | (S)-1 | (S)-2 |
| | [100] | [11.4] | [2.0] | [3.0] | [0.6] | [0.75] | [10] | [2400] |
| Comp. Ex. 2 | (A)-1 | (B)-1 | (B)-2 | (C)-10 | (D)-1 | (E)-1 | (S)-1 | (S)-2 |
| | [100] | [11.4] | [2.0] | [3.0] | [0.6] | [0.75] | [10] | [2400] |
| Comp. Ex. 3 | (A)-1 | (B)-1 | (B)-2 | (C)-11 | (D)-1 | (E)-1 | (S)-1 | (S)-2 |
| | [100] | [11.4] | [2.0] | [3.0] | [0.6] | [0.75] | [10] | [2400] |
| Comp. Ex. 4 | (A)-1 | (B)-1 | (B)-2 | — | (D)-1 | (E)-1 | (S)-1 | (S)-2 |
| | [100] | [11.4] | [2.0] | | [0.6] | [0.75] | [10] | [2400] |
| Comp. Ex. 5 | (A)-2 | (B)-1 | (B)-2 | (C)-2 | (D)-1 | (E)-1 | (S)-1 | (S)-2 |
| | [100] | [11.4] | [2.0] | [3.0] | [0.6] | [0.75] | [10] | [2400] |

In Table 2, the values in brackets [ ] indicate the amount (in terms of parts by weight) of the component added. Further, the reference characters indicate the following. (B)-1 was synthesized in accordance with the method described in Japanese Unexamined Patent Application, First Publication No. 2009-91350.

(A)-1: the aforementioned polymeric compound 1A
(A)-2: the aforementioned polymeric compound 2A
(B)-1: a compound represented by chemical formula (B)-1 shown below
(B)-2: triphenylsulfonium d-camphor-10-sulfonate
(C)-1 to (C)-11: the aforementioned polymeric compounds 1C to 11C
(D)-1: tri-n-pentylamine
(E)-1: salicylic acid
(S)-1: γ-butyrolactone
(S)-2: a mixed solvent of PGMEA/PGME=6/4 (weight ratio)

[Chemical Formula 74.]

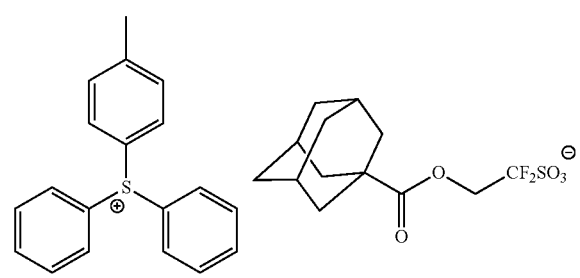

(B)-1

An organic anti-reflection film composition (product name: ARC29, manufactured by Brewer Science Ltd.) was applied to an 8-inch silicon wafer using a spinner, and the composition was then baked at 205° C. for 60 seconds, thereby forming an organic anti-reflection film having a film thickness of 82 nm. Then, each of the positive resist compositions obtained in Examples 1 to 8 and Comparative Examples 1 to 5 was applied to the anti-reflection film using a spinner, and was then prebaked (PAB) on a hotplate at 110° C. for 60 seconds and dried, thereby forming a resist film having a film thickness of 120 nm.

Subsequently, the resist film was selectively irradiated with an ArF excimer laser (193 nm) through a mask pattern, using an ArF exposure apparatus NSR-S302 (manufactured by Nikon Corporation, NA (numerical aperture)=0.60, ⅔ annular illumination).

Thereafter, a post exposure bake (PEB) treatment was conducted at 110° C. for 60 seconds, followed by alkali development for 30 seconds at 23° C. in a 2.38% by weight aqueous solution of TMAH. Then, the resist was washed for 30 seconds with pure water, followed by drying by shaking.

As a result, in each of the examples, a 1:1 line and space pattern (L/S pattern) having a line width of 160 nm and a pitch of 320 nm was formed on the resist film. The optimal exposure dose Eop (mJ/cm$^2$) was determined. The results are shown in Table 3.

[Evaluation of Line Width Roughness (LWR)]

With respect to each of the L/S patterns formed with the above Eop, the space width at 5 points in the lengthwise direction of the space were measured using a measuring scanning electron microscope (SEM) (product name: S-9220, manufactured by Hitachi, Ltd.; acceleration voltage: 800V), and from the results, the value of 3 times the standard deviation s (i.e., 3s) was calculated as a yardstick of LWR. The smaller this 3s value is, the lower the level of roughness of the line width, indicating that an L/S pattern with a uniform width was obtained. The results are shown in Table 3.

[Evaluation of Pattern Shape]

With respect to each of the 1:1 L/S patterns formed with the above Eop, the cross-sectional shape was observed using a scanning electron microscope (SEM), and the cross-sectional shape was evaluated with the following criteria. The results are shown in Table 3.

A: Excellent rectangularity

B: Rectangularity maintained

C: T-top shaped, low rectangularity

D: Tapered so that rectangularity was not maintained, and thickness loss was observed

TABLE 3

|  | Eop (mJ/cm$^2$) | LWR | Shape |
| --- | --- | --- | --- |
| Ex. 1 | 18 | 9.3 | B |
| Ex. 2 | 18 | 9.0 | A |
| Ex. 3 | 18 | 9.8 | A |
| Ex. 4 | 18 | 9.7 | A |
| Ex. 5 | 18 | 9.3 | A |
| Ex. 6 | 18 | 9.0 | B |
| Ex. 7 | 17 | 9.3 | B |
| Ex. 8 | 19 | 8.9 | A |
| Comp. Ex. 1 | 19 | 10.2 | C |
| Comp. Ex. 2 | 19 | 10.0 | C |
| Comp. Ex. 3 | 19 | 10.9 | C |
| Comp. Ex. 4 | 19 | 10.8 | C |
| Comp. Ex. 5 | 19 | 10.6 | D |

From the results shown above, it was confirmed that the resist compositions of Examples 1 to 8 according to the present invention exhibited excellent lithography properties such as LWR and the rectangularity of the pattern shape was high, as compared to the resist compositions of Comparative Examples 1 to 5.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

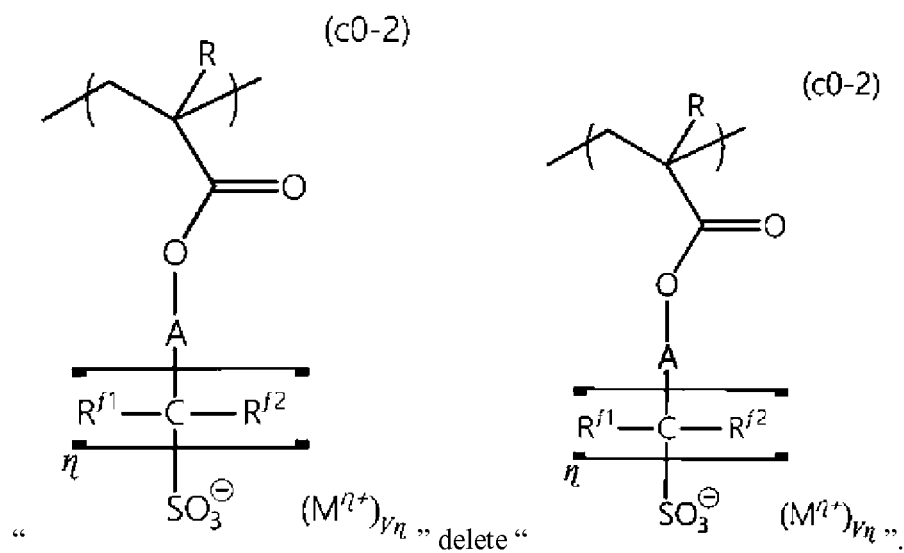
Col. 144, lines 29-36 (claim 5), after
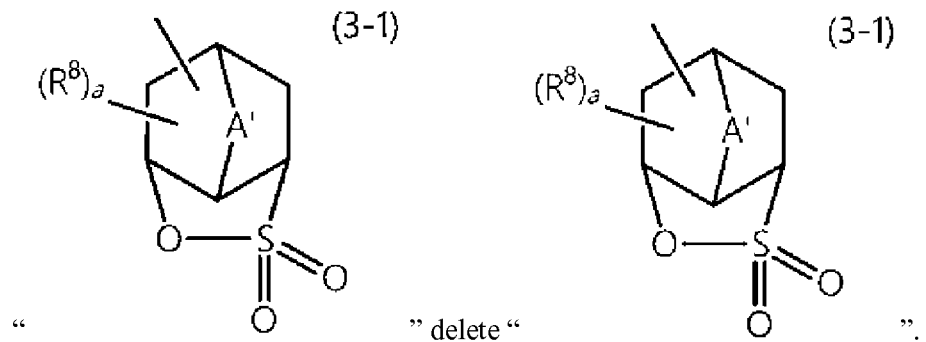

What is claimed is:

1. A positive resist composition comprising:
a base component (A) which exhibits increased solubility in an alkali developing solution under action of acid,
an acid-generator component (B) which generates acid upon exposure, and
a fluorine-containing polymeric compound (C') which generates acid upon exposure,
the base component (A) comprising a structural unit (a0-1) represented by general formula (a0-1) shown below and a structural unit (a1) derived from an acrylate ester containing an acid dissociable, dissolution inhibiting group, and
the fluorine-containing polymeric compound (C') comprising a structural unit (c0) which generates acid upon exposure and a structural unit (c1 including at least one structural unit selected from the group consisting of structural units represented by general (c11-1-1) to (c11-1-4), (c11-2-1) to (c11-2-4) and (c12-1-2) to (c12-1-8) shown below:

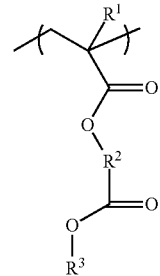

(a0-1)

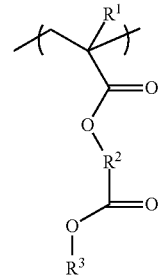

(a0-1)

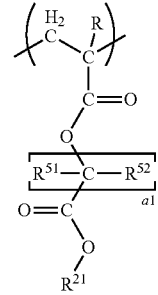

(c11-1-1)

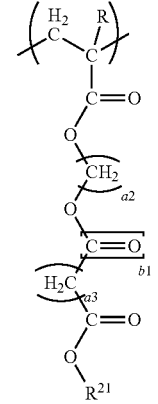

(c11-1-2)

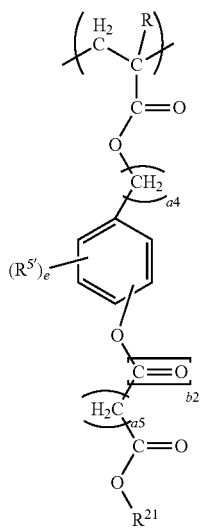
(c11-1-3)
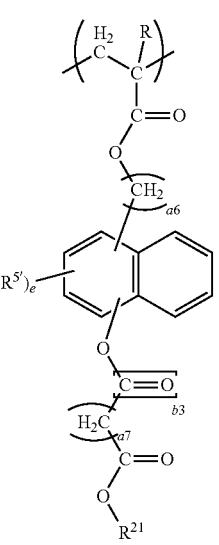
(c11-1-4)
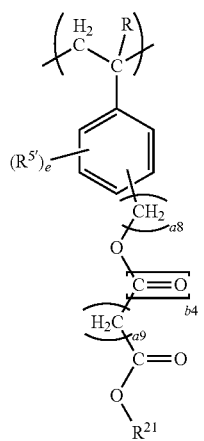
(c11-2-1)
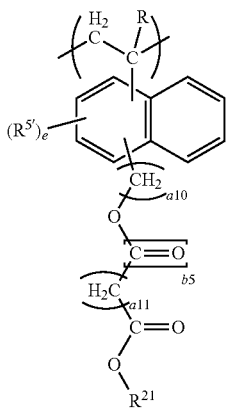
(c11-2-2)
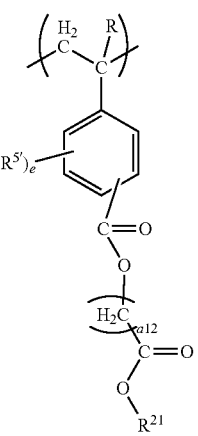
(c11-2-3)
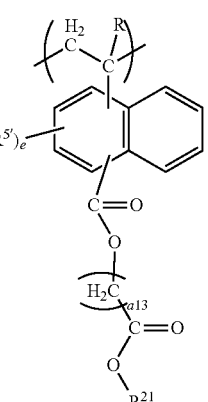
(c11-2-4)
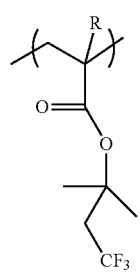
(c12-1-2)

(c12-1-3) 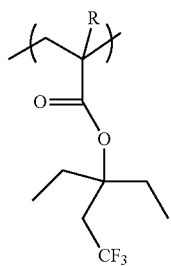

(c12-1-4) 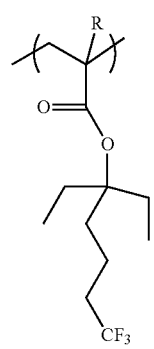

(c12-1-5) 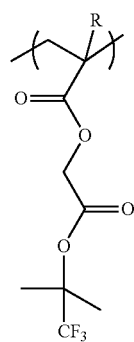

(c12-1-6) 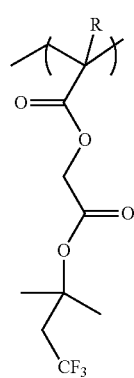

(12-1-7) 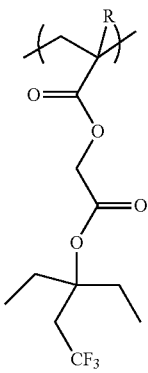

(c12-1-8) 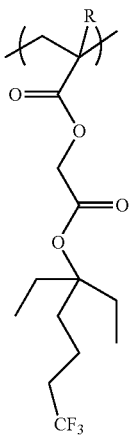

wherein each of $R^1$ and R independently represents a hydrogen atom, an alkyl group of 1 to 5 carbon atoms or a halogenated alkyl group of 1 to 5 carbon atoms; $R^2$ represents a divalent linking group; $R^3$ represents a cyclic group containing —$SO_2$— within the ring skeleton thereof; each of $R^{51}$ and $R^{52}$ independently represents a hydrogen atom, a halogen atom, an alkyl group of 1 to 5 carbon atoms or a halogenated alkyl groups of 1 to 5 carbon atoms, wherein the plurality of $R^{51}$ or $R^{52}$ may be the same or different from each other; each of a1, a2, a5, a7, a9 and a11 to a13 independently represents an integer of 1 to 5; a3 represents an integer of 1 to 3; each of a4, a6, a8 and a10 independently represents 0 or an integer of 1 to 5; each of b1 to b5 independently represents 0 or 1; $R^{5\prime}$ represents a substituent; e represents an integer of 0 to 2; and each $R^{21}$ independently represents a base dissociable group having a fluorine atom.

2. The positive resist composition according to claim 1, wherein the structural unit (c0) has a group represented by general formula (c0-1-0) or (c0-2-0) shown below:

(c0-1-0) 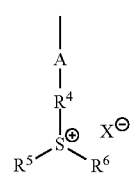

-continued

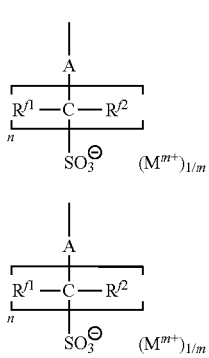
(c0-2-0)

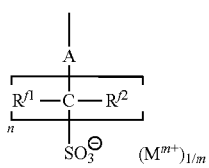
(c0-2-0)

wherein A represents a single bond or a divalent linking group; R⁴ represents an arylene group which may have a substituent; each of R⁵ and R⁶ independently represents an organic group, wherein R⁵ and R⁶ may be mutually bonded to form a ring with the sulfur atom; X⁻ represents a counteranion; each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group; n represents an integer of 1 to 8; $M^{m+}$ represents a countercation; and m represents an integer of 1 to 3.

3. The positive resist composition according to claim 2, wherein the structural unit (c0) is represented by general formula (c0-1) or (c0-2) shown below:

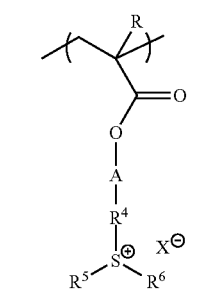
(c0-1)

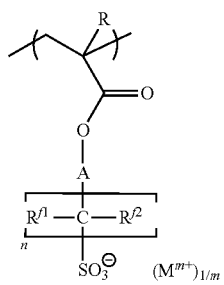
(c0-2)

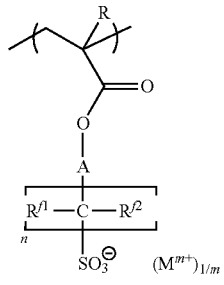
(c0-2)

wherein R represents a hydrogen atom, an alkyl group of 1 to 5 carbon atoms or a halogenated alkyl group of 1 to 5 carbon atoms; A represents a single bond or a divalent linking group; R⁴ represents an arylene group which may have a substituent; each of R⁵ and R⁶ independently represents an organic group, wherein R⁵ and R⁶ may be mutually bonded to form a ring with the sulfur atom; X⁻ represents a counteranion; each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group; n represents an integer of 1 to 8; $M^{m+}$ represents a countercation; and m represents an integer of 1 to 3.

4. The positive resist composition according to claim 1, wherein R³ represents a cyclic group containing —O—SO₂— within the ring skeleton thereof.

5. The positive resist composition according to claim 4, wherein R³ is represented by general formula (3-1) shown below:

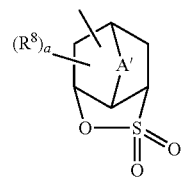
(3-1)

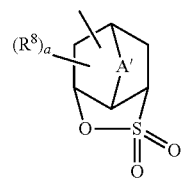
(3-1)

wherein A' represents an oxygen atom, a sulfur atom or an alkylene group of 1 to 5 carbon atoms which may contain an oxygen atom or a sulfur atom; a represents an integer of 0 to 2; and R⁸ represents an alkyl group, an alkoxy group, a halogenated alkyl group, a hydroxyl group, —COOR'', —OC(=O)R'', a hydroxyalkyl group or a cyano group, wherein R'' represents a hydrogen atom or an alkyl group.

6. The positive resist composition according to claim 1, wherein the resin component (A1) further comprises a structural unit (a2) derived from an acrylate ester containing a lactone-containing cyclic group.

7. The positive resist composition according to claim 1, wherein the resin component (A1) further comprises a structural unit (a3) derived from an acrylate ester containing a polar group-containing aliphatic hydrocarbon group.

8. The positive resist composition according to claim 1, wherein the fluorine-containing polymeric compound (C') further comprises a structural unit derived from an acrylate ester containing an acid dissociable, dissolution inhibiting group.

9. The positive resist composition according to claim 1, which further comprises a nitrogen-containing organic compound (D).

10. A method of forming a resist pattern, comprising: using a positive resist composition of claim 1 to form a resist film on a substrate; conducting exposure of the resist film; and alkali-developing the resist film to form a resist pattern.

* * * * *

UNITED STATES PATENT AND TRADEMARK OFFICE
CERTIFICATE OF CORRECTION

PATENT NO. : 8,980,524 B2
APPLICATION NO. : 12/979067
DATED : March 17, 2015
INVENTOR(S) : Tomoyuki Hirano, Daiju Shiono and Masatoshi Arai It is certified that error appears in the above-identified patent and that said Letters Patent is hereby corrected as shown below:

In the Specification

Col. 7, line 29, "and an" should be --an--.

Col. 23, lines 59-66:

" 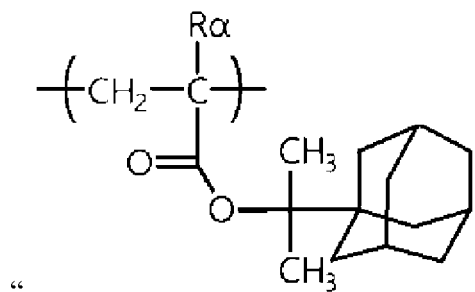 " should be -- 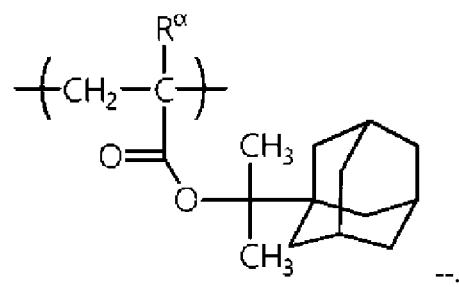 --.

Col. 24, lines 3-11:

" 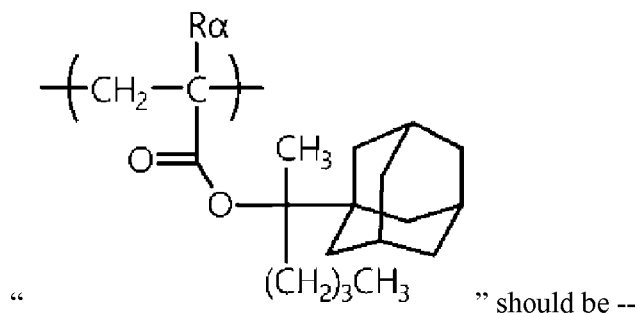 " should be -- 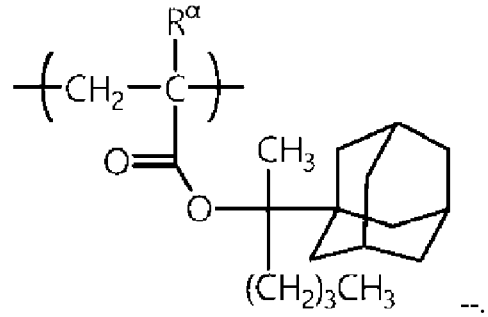 --.

Signed and Sealed this
Seventeenth Day of May, 2016

Michelle K. Lee
*Director of the United States Patent and Trademark Office*

CERTIFICATE OF CORRECTION (continued)
U.S. Pat. No. 8,980,524 B2

Col. 24, lines 13-20:

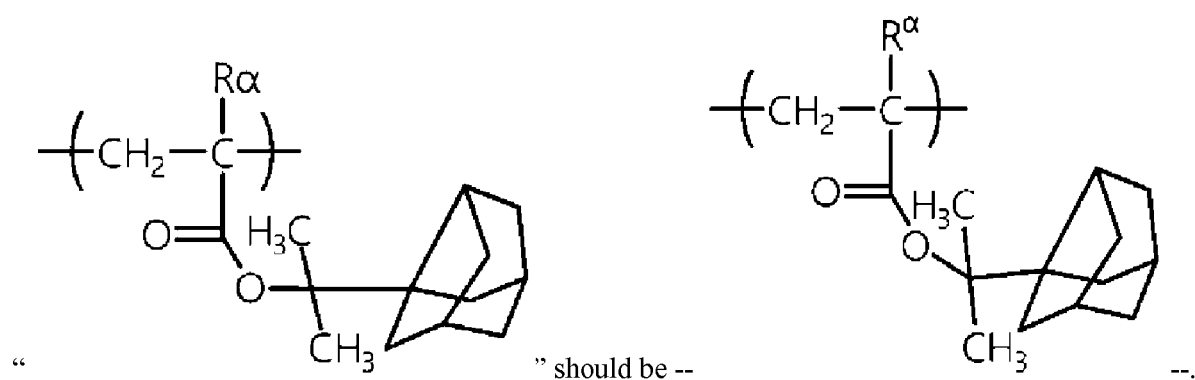

" " should be -- --.

Col. 24, lines 23-32:

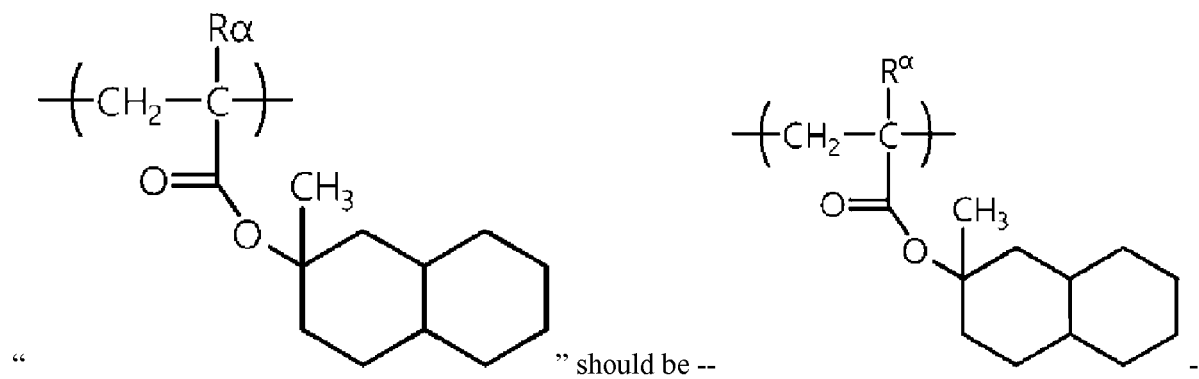

" " should be -- --.

Col. 24, lines 34-42:

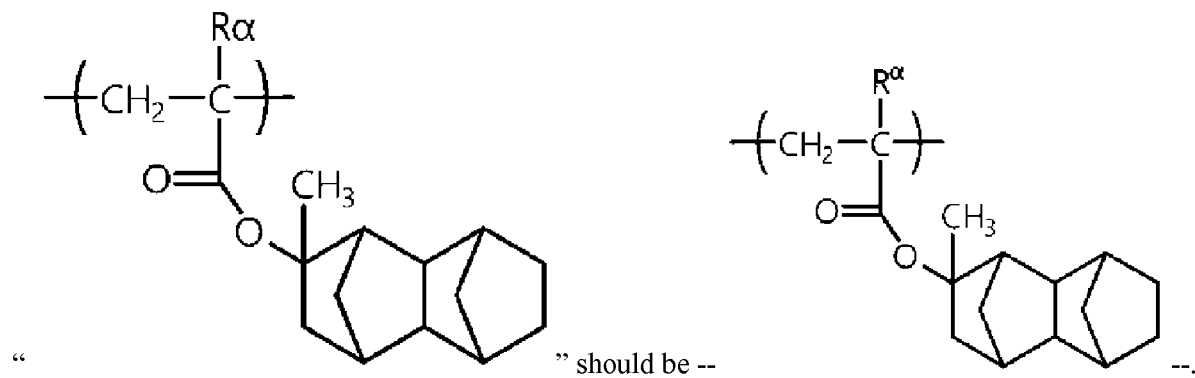

" " should be -- --.

Col. 24, lines 43-53:
"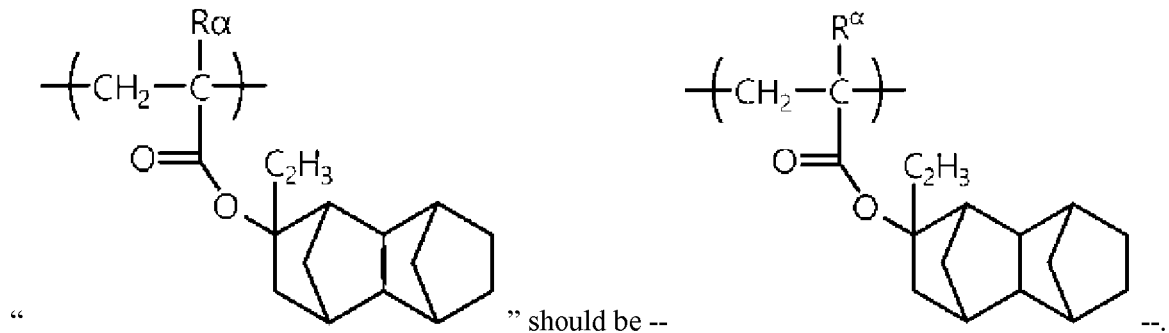 should be --  --.
Col. 24, lines 57-66:
"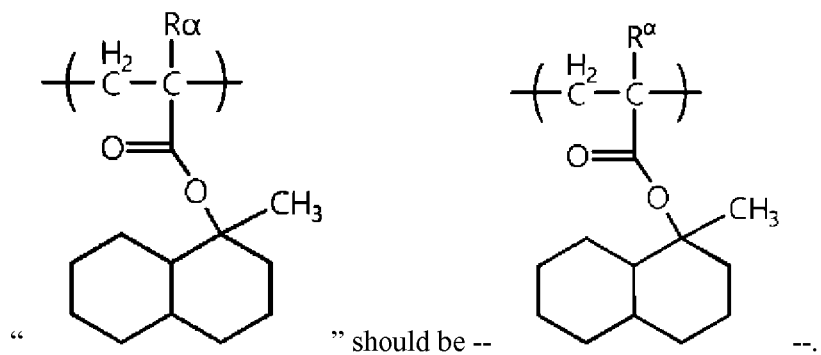 should be --  --.
Col. 25, lines 4-16:
"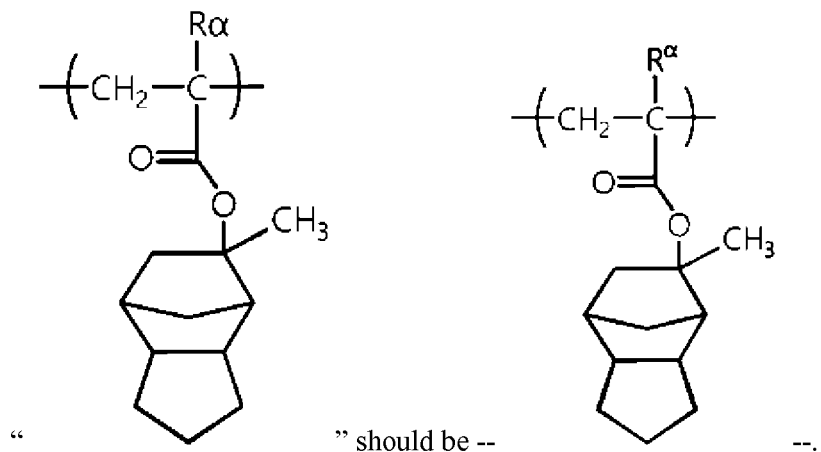 should be --  --.
Col. 52, line 43, "β-propiolatone," should be --β-propiolactone,--.
Col. 54, line 4, "group" should be --group.--.
Col. 71, line 39, "(a-4-1)" should be --(a4-1)--.
Col. 71, line 40, "(a-4-5)" should be --(a4-5)--.
Col. 74, line 30, "dicyclohexylcarboxylmide" should be --dicyclohexylcarboxyimide--.

Col. 83, lines 31-35:
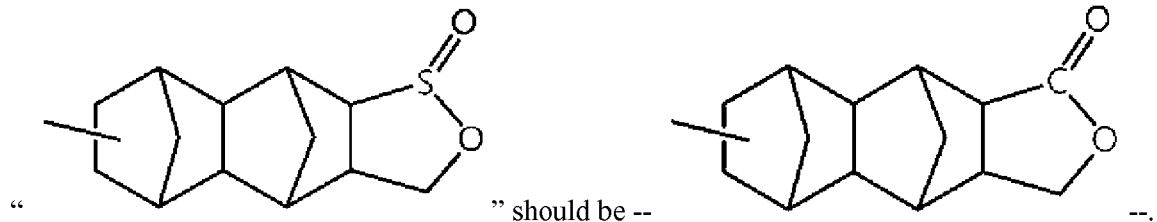
Col. 85, lines 37-38, "diphenyl)iodonium" should be --diphenyliodonium--.
Col. 110, lines 7-30:
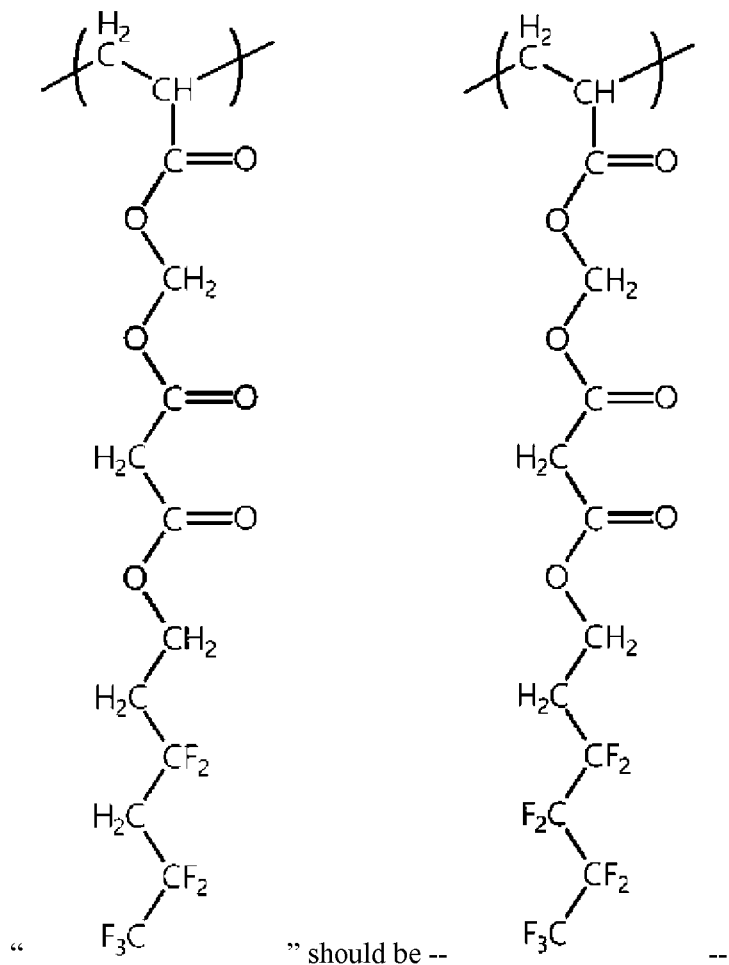
Col. 122, line 15, "laurildiethanolamine." should be --lauryldiethanolamine.--.
Col. 125, line 28, "apparatus" should be --apparatus.--.
Col. 127, line 34, "at" should be --as--.
Col. 128, line 39, "$H^{e,f}$)," should be --$H^{e,f}$),--.

CERTIFICATE OF CORRECTION (continued)
U.S. Pat. No. 8,980,524 B2

Col. 128, line 39, "H$^8$)," should be --H$^g$),--.

Col. 130, line 34, "2A)" should be --2A--.

Col. 131, line 38, "1C)" should be --1C--.

In the Claims

Col. 137, line 63 (claim 1), "(c1" should be --(c1)--.

Col. 137, line 65 (claim 1), "general" should be --general formulae--.

Col. 138, lines 17-28 (claim 1), after

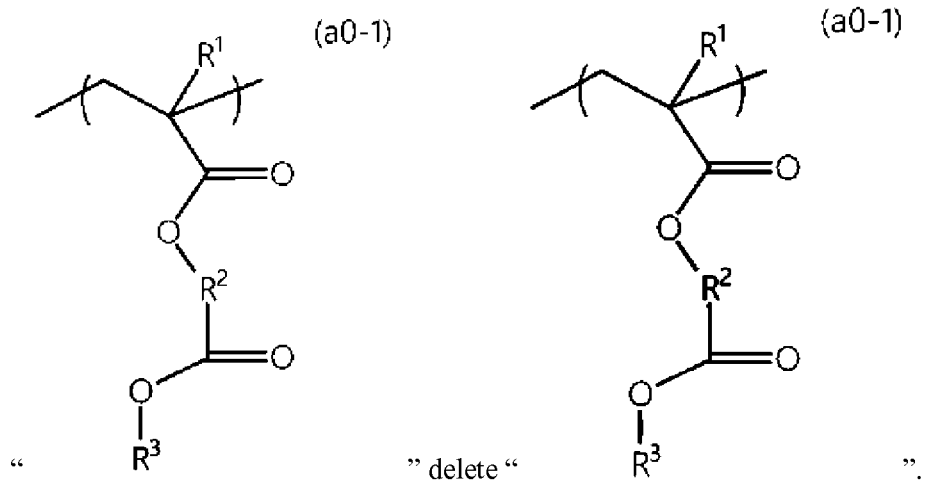

Col. 142, line 44 (claim 1), "groups" should be --group--.

Col. 143, lines 1-6 (claim 2), after

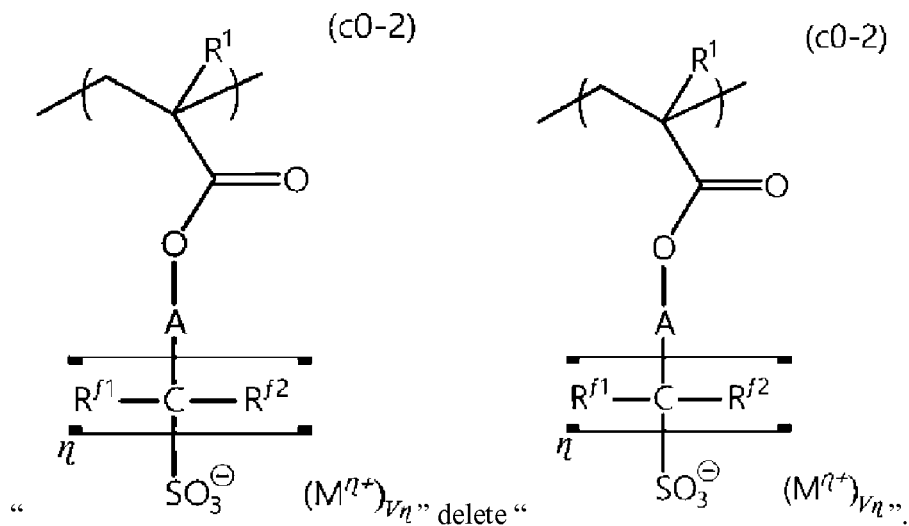

Col. 143, lines 54-65 (claim 3), after